(12) United States Patent
Morimoto et al.

(10) Patent No.: US 6,606,788 B1
(45) Date of Patent: Aug. 19, 2003

(54) COMPONENT RECOGNIZING METHOD AND APPARATUS

(75) Inventors: Masamichi Morimoto, Kofu (JP); Eiichi Hachiya, Kofu (JP); Atsushi Tanabe, Nakakoma-gun (JP); Akira Noudo, Nakakoma-gun (JP); Kimiaki Sano, Nakakoma-gun (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/623,085
(22) PCT Filed: Feb. 25, 1999
(86) PCT No.: PCT/JP99/00874
§ 371 (c)(1), (2), (4) Date: Aug. 28, 2000
(87) PCT Pub. No.: WO99/44408
PCT Pub. Date: Sep. 2, 1999

(30) Foreign Application Priority Data

Feb. 27, 1998 (JP) .............................. 10-047849
Feb. 27, 1998 (JP) .............................. 10-048414
Mar. 2, 1998 (JP) .............................. 10-049840

(51) Int. Cl.$^7$ ................................ H05K 3/30
(52) U.S. Cl. ................ 29/832; 29/827; 29/823; 29/893; 29/834
(58) Field of Search ................... 29/832, 833, 593, 29/834, 743, 739, 740, 742, 827

(56) References Cited

U.S. PATENT DOCUMENTS

| | | | |
|---|---|---|---|
| 4,346,293 A | 8/1982 | Fetzer | 250/222 |
| 5,427,642 A | * 6/1995 | Akiguchi et al. | 156/273.3 |
| 5,628,110 A | 5/1997 | Sakaguchi et al. | 29/840 |
| 5,817,957 A | * 10/1998 | Teruhiko et al. | 29/829 |
| 6,178,626 B1 | * 1/2001 | Hada et al. | 29/717 |
| 6,195,165 B1 | * 2/2001 | Sayegh | 356/400 |
| 6,374,484 B1 | * 4/2002 | Yoshida et al. | 29/740 |

FOREIGN PATENT DOCUMENTS

| | | |
|---|---|---|
| EP | 0 417 736 | 3/1991 |
| EP | 0417736 B1 | 3/1991 |
| EP | 0417736 A2 | 3/1991 |
| EP | 0488292 A2 | 6/1992 |
| WO | 97/40657 | 10/1997 |
| WO | 99/00661 | 1/1999 |

\* cited by examiner

Primary Examiner—Joseph J. Hail, III
Assistant Examiner—Alvin J. Grant
(74) Attorney, Agent, or Firm—Wenderoth, Lind & Ponack, L.L.P.

(57) ABSTRACT

A component recognizing method, and an apparatus for executing the method, for applying light to leads on a mounting surface of an electronic component and executing positional detection of the leads by a height detecting section, comprising a 3-D sensor, on the basis of light reflected from the leads. The method includes limiting a region to be measured by the height detection section so that light reflected from objects behind or near the leads is excluded from the region and processing light reflected from the region, thereby removing the reflected light from objects behind or near the lead.

39 Claims, 46 Drawing Sheets

LIGHT REFRECTING PORTION

LIGHT REFRECTING PORTION

120a

120

120a

COMPONENT RECOGNIZING METHOD AND APPARATUS

TECHNICAL FIELD

The present invention relates to a component recognizing method and apparatus for executing positional detection or quality check (good or no good) of connection portions such as leads and electrodes existing on the mounting surface of electronic components to be mounted during component mounting for automatically mounting the electronic component on a printed board or a liquid crystal or plasma display panel board. The present invention additionally relates to an electronic component mounting method for mounting the electronic component on a board on the basis of positional information of the connection portions such as the leads and electrodes existing on the mounting surface of the electronic component detected by the above component recognizing method. The present invention further relates to an electronic component mounting apparatus for mounting the electronic component on the board on the basis of the positional information of the connection portions such as the leads and electrodes existing on the mounting surface of the electronic component detected by the above component recognizing apparatus.

BACKGROUND ART

Conventionally, with regard to the component recognizing method of this type, there have been known various structures. For example, there has been considered one that applies a visible light to an electronic component, receives light reflected from the object by means of a CCD camera and executes the positional detection of the connection portions such as the leads and electrodes existing on the mounting surface of the electronic component.

However, the above-mentioned structure has had the following issue. If a projection or the like exists near the leads and electrodes existing on the mounting surface of the electronic component and the visible light is reflected off the projection, then the light reflected off the projection or the like enters the CCD camera in addition to the light reflected on the leads, electrodes and the like. The projection or the like becomes noise for the connection portions, such as the leads and electrodes, to be recognized, for which the projection might be erroneously recognized as a lead or an electrode.

Accordingly, it is an object of the present invention to solve the above-mentioned issue and provide a component recognizing method and apparatus capable of correctly obtaining the positional information of the connection portions of an electronic component without recognizing a projection or the like located near the connection portions such as leads and electrodes existing on the mounting surface of the electronic component as well as an electronic component mounting method and apparatus capable of correctly mounting the electronic component on the basis of positional information of the connection portions obtained correctly.

FIG. 41 is a schematic perspective view of a prior art electronic component mounting apparatus.

In FIG. 41 are shown a main body 1 of an electronic component mounting apparatus, electronic components (occasionally abbreviated to "components" hereinafter) 2 to be mounted by the present mounting apparatus, a tray 4a on which the components 2 are placed, a tray supply section 4 that serves as a component supply section for automatically supplying the components 2 placed on the tray 4a, a head section 7 (nozzle 7a) for sucking one of the electronic components 2 in a mounting stage, a robot on the X-axis side (abbreviated to an X-axis robot hereinafter) that moves the head section 7 in the X-axis direction and constitutes part of an X-Y robot, robots 6a and 6b on the Y-axis side (abbreviated to Y-axis robots hereinafter) that move the head section 7 in the Y-axis direction and constitute part of the X-Y robot with the X-axis robot 5, a CCD camera 3A, and a height sensor 8A. The reference numeral 9 denotes a printed board to be mounted with the components 2.

FIG. 25 shows an example of the electronic component 2 to be mounted by the above-mentioned electronic component mounting apparatus. This electronic component 2 has a plurality of leads 2a on the left-hand and right-hand sides of a component body 2b, and the lead tips 2c of the leads 2a are mounted on the board 9.

In the prior art electronic component mounting apparatus, the CCD camera 3A is used for two-dimensional positional detection of the electronic component 2 that is the object, and the height sensor 8A is used for inspecting the floating of the leads of the electronic component 2.

As shown in FIG. 42, this height sensor 8A is to measure the height of the object at one specified point. The height sensor 8A shown in FIG. 42 is provided with a laser light source 8a, a focusing lens 8c for focusing the reflected light (scattered light) of the laser beam that has been emitted from this laser light source 8a and impinges on the electronic component 2 that is the object and a semiconductor position sensitive detector (abbreviated to PSD hereinafter) 8d that serves as a position detecting device on which the reflected light of the laser beam impinging on the lead tip 2c of the electronic component 2 is focused through the focusing lens 8c. The PSD 8d generates an electric signal correlated with the position of the focused light.

The prior art component recognizing method will be described next on the basis of the flowchart shown in FIG. 43 sequentially from Step S71 to Step S79.

Step S71: The electronic component 2 is sucked by the nozzle 7a.

Step S72: The luminance image of the electronic component 2 is captured in the position of the CCD camera 3A.

Step S73: The position of the electronic component 2 is detected by processing this luminance image.

Step S74: The program flow jumps to Step S78 when no inspection is executed on the floating of the leads 2a of the electronic component 2.

Step S75: The electronic component 2 is moved so that the tips 2c of the leads 2a of the electronic component 2 each consistently come into the measurement position of the height sensor 8A, and then, height data of the lead tips 2c are measured. In the case of the electronic component 2 shown in FIG. 25, the two lines $P_1$ and $P_2$ shown in FIG. 25 are the height measurement lines of the lead tips 2c, and these measurement lines $P_1$ and $P_2$ are determined by the positional detection executed by the CCD camera 3A. First, the height measurement of the lead tips 2c of one side is executed along the first line $P_1$ by moving the nozzle 7a in the X-axis direction, and after rotating the nozzle 7a by 180°, the height measurement of the lead tips 2c of the other side is executed along the second line $P_2$ by moving the nozzle 7a in the X-axis direction. In the case where the electronic component 2 is a QFP component, the heights of the lead tips 2c of the four sides are taken in by segmentally executing a linear movement four times. In this case, the electronic component 2 are rotated by 90 degrees three times around the nozzle 7a for suction use.

Step S76: Positions of three lead tips 2c that are brought into contact with a theoretical imaginary surface when the electronic component 2 is mounted on the theoretical imaginary surface are calculated from three-dimensional positions (X, Y, Z) of all the lead tips 2c, and the imaginary surface is expressed by an expression. Then, distances of the three-dimensional positions (X, Y, Z) of all the lead tips 2c from the imaginary surface, i.e., the lead floating amounts are calculated.

Step S77: It is decided whether each of these lead floating amounts is exceeding a predetermined reference value. When the lead floating amount is exceeding the predetermined reference value, the program flow proceeds to Step S79. When all of the lead floating amounts are not exceeding the predetermined reference value, the program flow proceeds to Step S78.

Step S78: In the case of an electronic component that is not required to be inspected for the lead floating amount or determined as the normal component through the lead floating amount inspection, the electronic component is mounted in the specified position on the board 9, and then, the processing ends.

Step S79: An electronic component 2, the lead floating amount of which is exceeding the predetermined reference value, is disposed of as an abnormal component, and then the processing ends.

However, the above-mentioned prior art method has had the issue that the lead floating inspection cannot be executed by the height sensor 8A until the luminance image input is executed by the CCD camera 3A for the positional detection of the electronic component 2 and the measurement lines $P_1$ and $P_2$ are determined, every time the lead floating inspection is executed, resulting in much time required for the mounting of the electronic component 2.

Furthermore, the conventional height sensor 8A is to measure the height of the electronic component 2 on the specified line, and this has lead to the issue that the range of inspection is very small, lacking reliability.

Additionally, conventionally, in order to inspect the dropout or the like of a plurality of hemispherical bump (hemispherically projected) electrodes 120a arranged in a matrix form at the bottom portion of an electronic component 120 to be mounted on a printed board as shown in FIG. 40, there has been used, for example, an inspection method by means of a CCD camera.

This prior art inspection method, as shown in FIG. 44, has required to horizontally throw a flood of illumination to the hemispherical bump electrodes 120a of the electronic component 120 by means of a CCD camera 100. The reason is as follows. Even though there is a dropout hemispherical bump electrode 120a, then it is highly possible that the electrode or solder constituting part of the hemispherical bump electrode may exist underneath the dropout hemispherical bump electrode 120a. Therefore, if light is applied perpendicular to the hemispherical bump electrodes 120a from the front surface side of the CCD camera 100, then the electrode or solder reflects light even when there is a dropout hemispherical bump electrode 120a, leading to a difficulty in checking whether there is a dropout hemispherical bump electrode 120a.

As shown in FIG. 45A, by applying light in the horizontal detection to the projecting bump electrode 120a, the actually existing hemispherical bump electrode 120a can be recognized as shown in FIG. 45B. FIG. 46A and FIG. 46B show an example in which light is applied to the hemispherical bump electrode 120a, while FIG. 47A and FIG. 47B show an example in which light is applied to a roughly hemispherical bump electrode 120a having a roughly flat portion in its bottom portion.

However, according to this illumination method, no light reflection can be theoretically obtained from the lowermost portion of the hemispherical bump electrode 120a, and this leads to a difficulty in recognizing the lowermost portion of the hemispherical bump electrode 120a, that is, the most important portion to be connected by solder to the printed board. Depending on the state of discoloration due to the oxidation of the surface of the hemispherical bump electrode 120a or depending on the state of dent in the surface of the hemispherical bump electrode 120a, the quantity of light reflected on the hemispherical bump electrode 120a varies. Therefore, the shape of the hemispherical bump electrode 120a has been allowed to be recognized only qualitatively. That is, it has been only allowed to make a relative evaluation by expressing the state of luster of individual hemispherical bump electrode 120a by an evaluation value such as the sum total of luminance values belonging to the hemispherical bump electrode 120a, examining the distribution of the evaluation value of the hemispherical bump electrode 120a, and making a decision on the occurrence of dropout of the hemispherical bump electrode 120a. For this reason, the conventional method has been used for checking the presence or absence of the hemispherical bump electrodes 120a at the bottom portion of the electronic component 120.

There has been a further issue that in the case where the height of the hemispherical bump electrode 120a is low, the portion that reflects light becomes small even though light is applied in the horizontal direction. Consequently, no sufficient quantity of light for the detection of the hemispherical bump electrode 120a can be obtained, and this has reduced the reliability in checking whether the hemispherical bump electrode 120a is present or absent.

In recent years, there has been generalized a component package of BGA (Ball Grid Array) as shown in FIG. 40 due to the large-scale integration of ICs. In the case of the BGA component, whose connection surface on a printed board becomes invisible once the component is mounted on the printed board, the inspection of the hemispherical bump electrodes 120a immediately before the mounting has a great importance. Under the present circumstances in which the IC packages are compacted and the importance of the function of inspecting the hemispherical bump electrodes 120a is increased, the importance of "quantitatively detecting the amount of solder of the individual hemispherical bump electrode 120a" or "quantitatively evaluating the shape of the individual hemispherical bump electrode 120a" is increased. However, neither of the aforementioned prior art methods has been able to make only the qualitative evaluation.

DISCLOSURE OF INVENTION

The present invention is made in view of the aforementioned conventional circumstances.

It is an object of the present invention to solve the aforementioned issues and provide a component recognizing method and component mounting method capable of rationally selecting and executing two-dimensional or three-dimensional positional detection of an electronic component at high speed and with high reliability.

Also, the present invention has the object of providing a component recognizing method and component inspecting method capable of totally measuring a plurality of bump electrodes arranged on a bottom portion of an electronic component, correctly detecting the volume or shape of each individual bump electrode, quantitatively evaluating the amount or shape of solder constituting the bump electrode, executing inspection of the bump electrodes, or the connection portions immediately before mounting the electronic component on a printed board, and improving the reliability of electronic component assembling.

In accomplishing these and other aspects, according to a first aspect of the present invention, there is provided a component recognizing method for applying light to connection portions that are leads or electrodes and exist on a mounting surface of an electronic component and executing positional detection of the connection portions by a height detecting section on the basis of a reflection light from the connection portions. The method according to the first aspect of the present invention comprises limiting a height measurement region of the height detecting section so that a noise object that exists behind or near the connection portion and reflects the light is excluded from the height measurement region of the reflection light to be detected by the height detecting section, and thereby removing the noise object.

According to a second aspect of the present invention, there is provided a component recognizing method according to the first aspect, wherein the height detecting section detects the positions of the connection portions by means of a semiconductor position sensitive device that serves as a height detection sensor.

According to a third aspect of the present invention, there is provided a component recognizing method according to the first or second aspect, wherein the noise removal is executed by presetting the height measurement region capable of detecting height positions of the connection portions about a height measurement reference plane within a height measurable region and executing height detection of the connection portions only within the height measurement region.

According to a fourth aspect of the present invention, there is provided a component recognizing method according to any one of the first through third aspects, wherein the noise removal is executed by presetting the height measurement region capable of detecting height positions of the connection portions about a height measurement reference plane within a height measurable region as a height translation table, handling height data that belongs to height data of the connection portion and is located outside the height measurement region as invalid height data according to the height translation table, handling height data located within the height measurement region as valid height data according to the height translation table, and executing height detection of the connection portions on the basis of the valid height data.

According to a fifth aspect of the present invention, there is provided a component recognizing method according to any one of the first through fourth aspects, and further comprising determining a processing area according to a size of the electronic component on the basis of an image of the electronic component detected only within the height measurement region, roughly detecting a center and an inclination of the electronic component by sampling inside a window of the determined processing area in the image of the electronic component to obtain a rough position of the electronic component, detecting positions of all of the connection portions in the image of the electronic component on the basis of the size of the component and the rough position of the electronic component, and detecting a correct position of the electronic component in the image of the electronic component from the positions of all the connection portions.

According to a sixth aspect of the present invention, there is provided an electronic component mounting method for mounting the electronic component on a is board on the basis of positional information of the connection portions of the electronic component detected by the component recognizing method according to any one of the first through fifth aspects.

According to a seventh aspect of the present invention, there is provided an electronic component mounting method according to the sixth aspect, further comprising holding the electronic component by a component holding member of a head section, deciding whether adjustment of the height measurement region is required and then, adjusting the height measurement region when the adjustment of the height measurement region is needed, adjusting a height of the component holding member on the basis of the height measurement region, capturing the height data of the component, detecting the position of the electronic component by the height detecting section, and mounting the electronic component in a specified position of the board by means of the component holding member by driving the head section on the basis of the height position information recognized by the height detecting section.

According to an eighth aspect of the present invention, there is provided a component recognizing apparatus comprising an illumination unit for applying light to a connection portions that are leads or electrodes and exist on a mounting surface of an electronic component, a height detecting section for executing positional detection of the connection portions on the basis of light that is applied from the illumination unit and reflected on the connection portions, and a noise removing section (304) for limiting a measurement region of the height detecting section so that a noise object that exists behind or near the connection portion and reflects the light is excluded from the measurement region of the reflection light detected by the height detecting section, thereby removing the noise object.

According to a ninth aspect of the present invention, there is provided a component recognizing apparatus according to the eighth aspect, wherein the height detecting section detects the positions of the connection portions by means of a semiconductor position sensitive device that serves as a height detection sensor.

According to a tenth aspect of the present invention, there is provided a component recognizing apparatus according to the eighth or ninth aspect, wherein the noise removing section presets a height measurement region capable of detecting a height positions of the connection portions about a height measurement reference plane within a height measurable region and executes height detection of the connection portions only within the height measurement region.

According to an eleventh aspect of the present invention, there is provided a component recognizing apparatus according to any one of the eighth through tenth aspects, wherein the noise removing section presets the height measurement region capable of detecting the height positions of the connection portions about the height measurement reference plane within the height measurable region as a height translation table, handles height data that belongs to the height data of the connection portion and is located outside the height measurement region as invalid height data according to the height translation table, handles the height data located within the height measurement region as valid height data according to the height translation table, and executes height detection of the connection portions on the basis of the valid height data.

According to a twelfth aspect of the present invention, there is provided a component recognizing apparatus according to any one of the eighth through eleventh aspects, further comprising a processing area determining means for determining a processing area on the basis of a size of the electronic component in an image of the electronic component detected only within the height measurement region, a center and inclination detecting means for roughly detecting a center and an inclination of the electronic component by sampling inside a window of the determined processing area in the image of the electronic component to obtain a rough portion of the electronic component, a connection portion position detecting means for detecting the positions of all of the connection portions in the image of the electronic component on the basis of the size of the component and the rough position of the electronic component, and a connection portion center and inclination detecting means for detecting the correct position of the electronic component in the image of the electronic component from the positions of all the connection portions.

According to a thirteenth aspect of the present invention, there is provided an electronic component mounting apparatus for mounting the electronic component on a board on the basis of positional information of the connection portions of the electronic component detected by the component recognizing apparatus according to any one of the eighth through twelfth aspects.

According to a fourteenth aspect of the present invention, there is provided an electronic component mounting apparatus according to the thirteenth aspect, further comprising a head section for holding the electronic component by a component holding member and adjusting a height of the component holding member on the basis of the height measurement region, and a control section for mounting the electronic component in a specified position of the board by means of the component holding member by driving the head section on the basis of the height position information recognized by the height detecting section.

According to a fifteenth aspect of the present invention, there is provided a component recognizing method employing a luminance image capturing means for obtaining is luminance image data of a surface of an electronic component viewed from a specified direction and a height image capturing means for obtaining height image data of a surface of the electronic component viewed from a specified direction, for executing positional detection of the electronic component by independently selectively using two-dimensional positional detection by the luminance image capturing means and three-dimensional positional detection by the height image capturing means.

According to a sixteenth aspect of the present invention, there is provided a component recognizing method according to the fifteenth aspect, wherein the luminance image capturing means and the height image capturing means are independently selectively used according to a shape feature of the electronic component.

According to a seventeenth aspect of the present invention, there is provided a component recognizing method according to the fifteenth aspect, wherein the luminance image capturing means and the height image capturing means are independently selectively used according to an inspection item to be executed on the electronic component.

According to an eighteenth aspect of the present invention, there is provided a component recognizing method according to any one of the fifteenth through seventeenth aspects, wherein the luminance image data obtained from the luminance image capturing means and the height image data obtained from the height image capturing means are processed by an identical image processing means by setting a height coordinate system of the height image data so that a direction directed from the electronic component toward the height image capturing means becomes positive.

According to a nineteenth aspect of the present invention, there is provided a component recognizing method according to any one of the fifteenth through eighteenth aspects, wherein the electronic component is constructed so that a plurality of leads are projecting from sides of a body of the component and tips of the leads are to be mounted on a board.

According to a twentieth aspect of the present invention, there is provided a component mounting method for transporting an electronic component from a component supply section onto a board and mounting the electronic component on the board. The method according to the twentieth aspect of the present invention comprises selecting either one of a luminance image capturing means for obtaining luminance image data of a surface of the electronic component viewed from a specified direction and a height image capturing means for obtaining height image data of a surface of the electronic component viewed from a specified direction in a transport path of the electronic component, executing positional detection of the electronic component by the selected one of the luminance image capturing means and the height image capturing means in transporting the electronic component from the component supply section onto the board, and mounting the electronic component on the board on the basis of information obtained through the positional detection.

According to a twenty first aspect of the present invention, there is provided a component mounting method according to the twentieth aspect, wherein the positional detection of the electronic component is executed by selecting either the luminance image capturing means or the height image capturing means according to a shape feature of the electronic component.

According to a twenty second aspect of the present invention, there is provided a component mounting according to the twentieth aspect, wherein the positional detection of the electronic component is executed by selecting either the luminance image capturing means or the height image capturing means according to an inspection item to be executed on the electronic component.

According to a twenty third aspect of the present invention, there is provided a component recognizing method comprising capturing a height image of a bottom portion of an electronic component having a plurality of bump electrodes in a bottom portion of the component as two-dimensional height image data by means of a height detection sensor while obtaining the height image data of the bump electrodes on surfaces parallel to a reference surface (for example, a bottom surface of the component) and imaginarily located in a direction perpendicular to the reference surface, extracting individual bump electrodes from the height image data, and detecting volumes of the extracted individual bump electrodes.

According to a twenty fourth aspect of the present invention, there is provided a component recognizing method according to the twenty third aspect, wherein the detection of the volumes of the bump electrodes of the electronic component is executed within an interval from when the electronic component is sucked from a component supply section by a nozzle of an electronic component mounting apparatus to when the electronic component is mounted on a board.

According to a twenty fifth aspect of the present invention, there is provided a component recognizing method according to the twenty third or twenty fourth aspect, wherein the height detection sensor captures the two-dimensional height image data by moving the electronic component in a direction perpendicular to a scanning direction of a laser beam or moving the height detection sensor in the direction perpendicular to the scanning direction of the laser beam while linearly scanning the laser beam on a straight line.

According to a twenty sixth aspect of the present invention, there is provided a component inspecting method for evaluating the electronic component as abnormal when the volume of any bump electrode detected by the component recognizing method according to any one of the twenty third through twenty fifth aspects does not fall within a predetermined range of reference.

According to a twenty seventh aspect of the present invention, there is provided a component mounting method for mounting on a board an electronic component that is not evaluated as abnormal by the component inspecting method according to the twenty sixth aspect.

According to a twenty eighth aspect of the present invention, there is provided a component recognizing method comprising capturing a height image of a bottom portion of an electronic component having a plurality of bump electrodes in a bottom portion of the component as two-dimensional height image data by means of a height detection sensor while obtaining the height image data of the bump electrodes on surfaces parallel to a reference surface and imaginarily located in a direction perpendicular to the reference surface, extracting individual bump electrodes from the height image data, and detecting shapes of the extracted individual bump electrodes.

According to a twenty ninth aspect of the present invention, there is provided a component recognizing method according to the twenty eighth aspect, wherein the detection of the shapes of the bump electrodes of the electronic component is executed within an interval from when the electronic component is sucked from a component supply section by a nozzle of an electronic component mounting apparatus from a component supply section to when the electronic component is mounted on a board.

According to a thirtieth aspect of the present invention, there is provided a component recognizing method according to the twenty eighth or twenty ninth aspect, wherein the height detection sensor captures the two-dimensional height image data by moving the electronic component in a direction perpendicular to a scanning direction of a laser beam or moving the height detection sensor in the direction perpendicular to the scanning direction of the laser beam while linearly scanning the laser beam on a straight line.

According to a thirty first aspect of the present invention, there is provided a component inspecting method for evaluating the electronic component as abnormal when the shape of any bump electrode detected by the component recognizing method according to any one of the twenty eighth through thirtieth aspects falls outside a predetermined shape of reference.

According to a thirty second aspect of the present invention, there is provided a component mounting method for mounting on a board an electronic component that is not evaluated as abnormal by the component inspecting method according to the thirty first aspect.

According to a thirty third aspect of the present invention, there is provided a component recognizing method for applying light to connection portions that are leads or electrodes and exist on a mounting surface of an electronic component and executing positional detection of the connection portions by a height detecting section on the basis of a reflection light from the connection portions. The method according to the thirty third aspect of the present invention comprises limiting a height measurement region of the height detecting section so that a noise object that exists behind or near the connection portion and reflects the light is excluded from the height measurement region of the reflection light to be detected by the height detecting section, and thereby removing the noise object, wherein in executing the positional detection, the positional detection of the electronic component is executed independently selectively using two-dimensional positional detection by a luminance image capturing means and three-dimensional positional detection by a height image capturing means, the luminance image capturing means obtaining luminance image data of a surface of an electronic component viewed from a specified direction and the height image capturing means obtaining height image data of a surface of the electronic component viewed from a specified direction, and a height image of a bottom portion of the electronic component having a plurality of bump electrodes in a bottom portion of the component is captured as two-dimensional height image data by means of a height detection sensor, individual bump electrodes are extracted from the height image data, and volumes or shapes of the extracted individual bump electrodes are detected.

BRIEF DESCRIPTION OF DRAWINGS

These and other aspects and features of the present invention will become clear from the following description taken in conjunction with the preferred embodiments thereof with reference to the accompanying drawings, wherein

FIG. 30A is an explanatory view showing the input and output state of a laser beam to and from the hemispherical bump electrode concerning the height sensor, and FIG. 30B is an explanatory view showing the image of the hemispherical bump electrode obtained from the output signal;

FIG. 38A is its flowchart, and FIG. 38B is an explanatory view of volume detection of the hemispherical bump electrode of the electronic component by means of the height detection sensor;

FIG. 39A is its flowchart, and FIG. 39B is an explanatory view of shape evaluation of the hemispherical bump electrode of the electronic component by means of the height detection sensor;

BEST MODE FOR CARRYING OUT THE INVENTION

Figure 1:
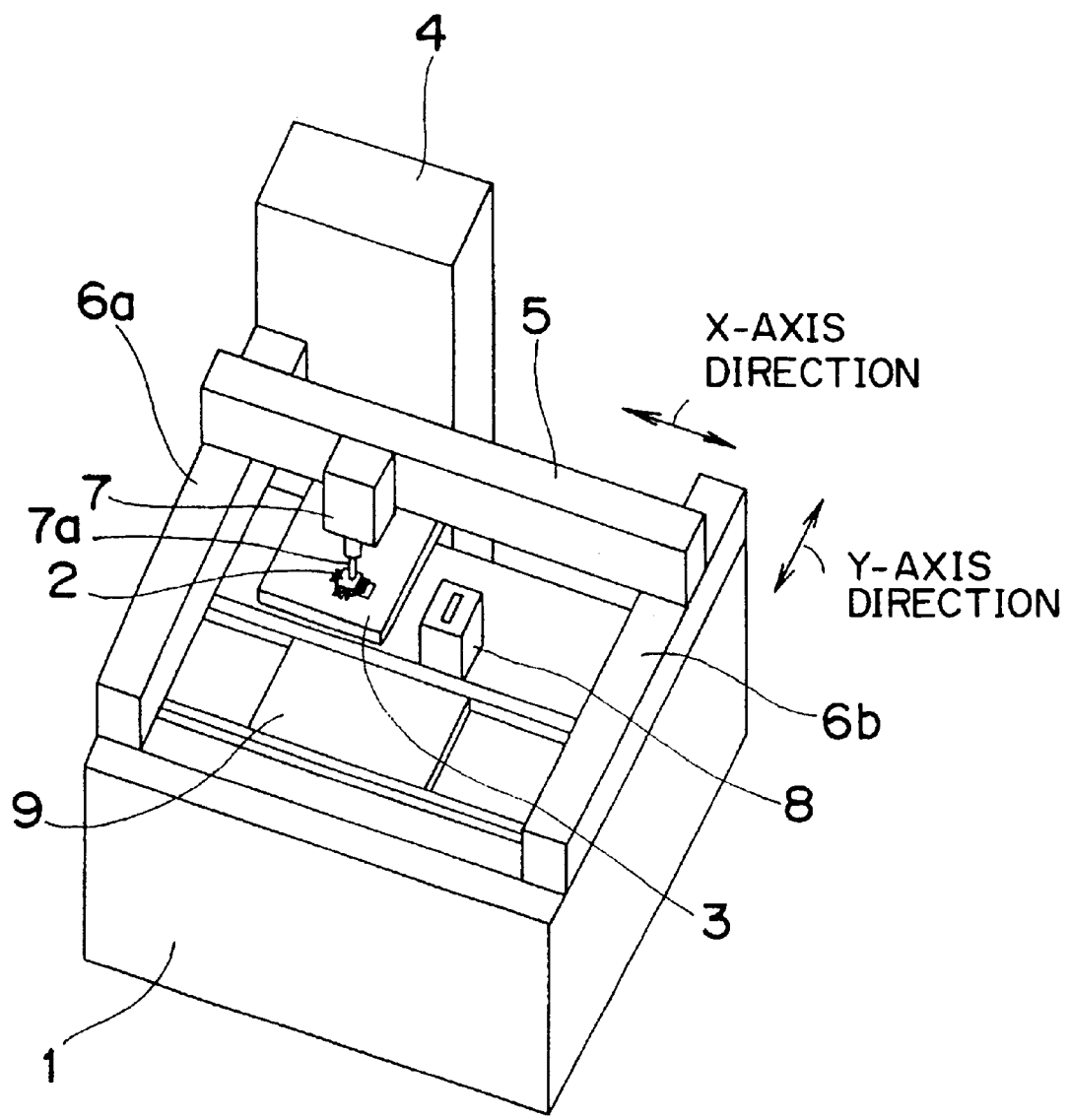
FIG. 1 is an external view of an electronic component mounting apparatus capable of implementing an electronic component recognizing method according to a first embodiment of the present invention.

Before the description of the present invention proceeds, it is to be noted that like parts are designated by like reference numerals throughout the accompanying drawings.

Embodiments of the present invention will be described in detail below with reference to the drawings.

A component recognizing method according to a first embodiment of the present invention limits a height measurement region capable of being detected by a height detection sensor so that only the connection portions are detected and other noise objects are not detected in order to correctly obtain the positional information of the connection portions such as the leads or electrodes existing on the mounting surface of the electronic component. That is, according to the first embodiment, when the desired measurement region for height detection of the connection portions is previously known, height data outside the measurement region is translated into a specified value that is not recognized as correct height data by means of a height translation table in a height data inputting stage.

Specifically, for example, this method is applied to the case where an object that becomes a noise is included in a height measurement region expressed by eight bits. It is preferable to previously calculate a height position relation and limit the height measurement region.

Figure 14:
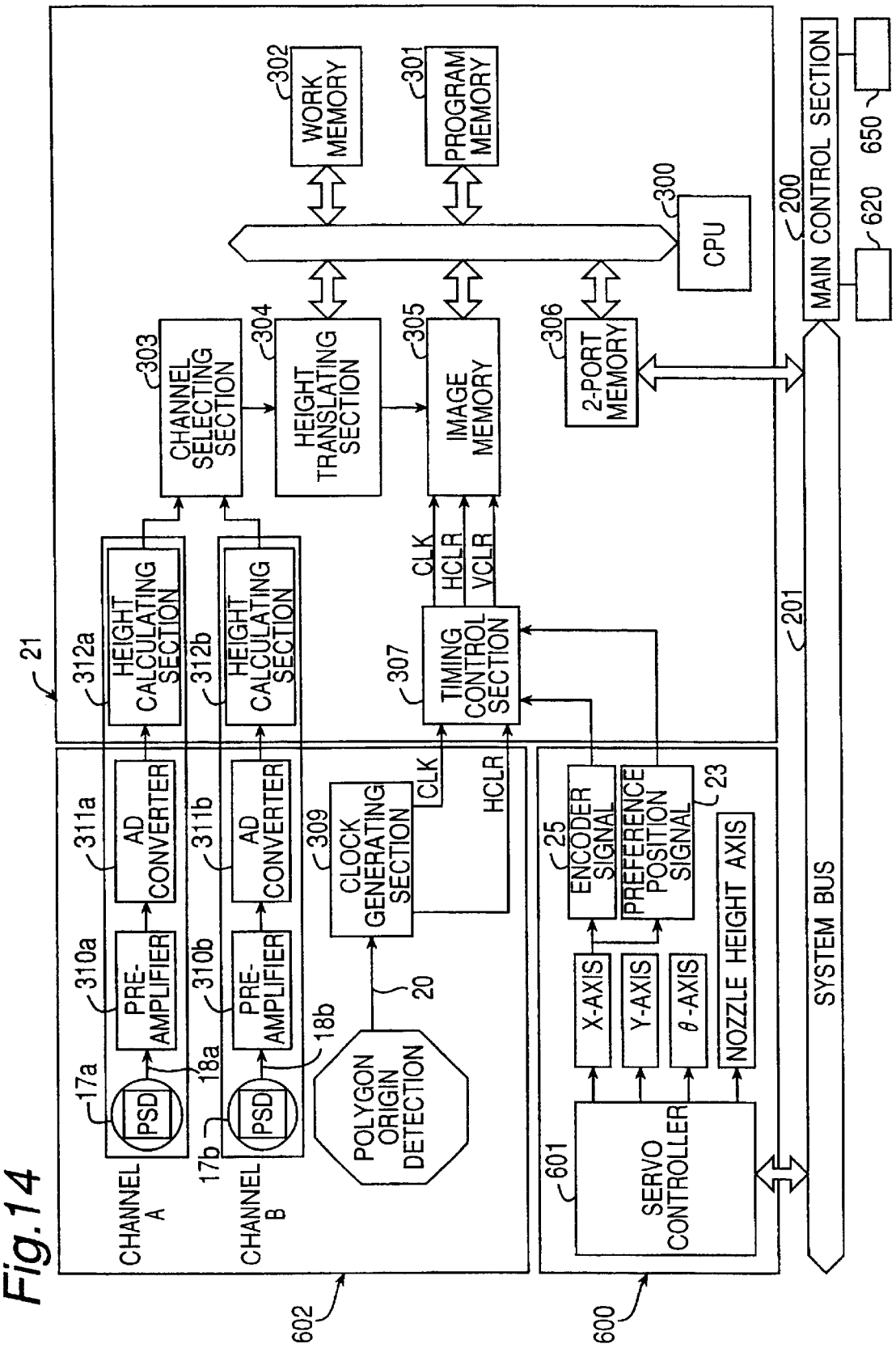
FIG. 14 is a block diagram of a component recognizing apparatus for implementing the component recognizing method of the first embodiment.

FIG. 1 is a schematic view of the whole body of an electronic component mounting apparatus provided with a component recognizing apparatus capable of implementing the component recognizing method of the first embodiment of the present invention, showing a state in which a head section 7 that has sucked an electronic component 2 as an example of the object by a nozzle 7a, which corresponds to one example of a component holding member, obtains height data of the electronic component 2 while moving with constant velocity in an X-axis direction above a height detection sensor 8 of a height detecting section 602 for detecting the heights of the connection portions such as leads 2a or electrodes extracting on the mounting surface of the electronic component 2. That is, in FIGS. 1 and 14 are shown a mounting apparatus main body 1 of the electronic component mounting apparatus, an electronic component (abbreviated to a component hereinafter) 2 to be mounted by the present apparatus, a tray 3 on which the components 2 are placed, a tray supply section 4 that serves as a component supply section for automatically supplying one of the components 2 placed on the tray 3, the head section 7 that sucks the component 2 by the nozzle 7a in the mounting stage and thereafter vertically moves a nozzle elevation shaft for supporting the nozzle 7a by means of a servomotor 7m for vertically moving the nozzle elevation shaft, thereby mounting the sucked component 2 on a printed board, a robot on the X-axis side (abbreviated to an X-axis robot hereinafter) that moves the head section 7 in the X-axis direction and constitutes part of an X-Y robot 600, robots 6a and 6b on the Y-axis side (abbreviated to Y-axis robots hereinafter) that move the head section 7 in the Y-axis direction and constitute part of the X-Y robot 600 with the X-axis robot 5, and a three-dimensional (abbreviated to 3D hereinafter) sensor 8 that serves as an example of the height detection sensor of the height detecting section 602 of FIG. 14 and captures the height image of the component 2. The reference numeral 9 denotes the printed board to be mounted with the component 2.

When one of the components 2 placed on the tray 3 is sucked by the head section 7 and moved along the X-axis robot 5 above the 3D sensor 8, the 3D (height) image of the component 2 is captured by the 3D sensor 8. The (height) image obtained by the 3D sensor 8 is subjected to software processing to inspect the heights (positions) of the leads or the like of the component 2, and the component 2 is mounted in a specified position on the printed board 9 according to positioning information.

Next, the construction and operation of the 3D sensor 8, based on the principle of operation of triangulation, will be described in detail below.

Figure 2:
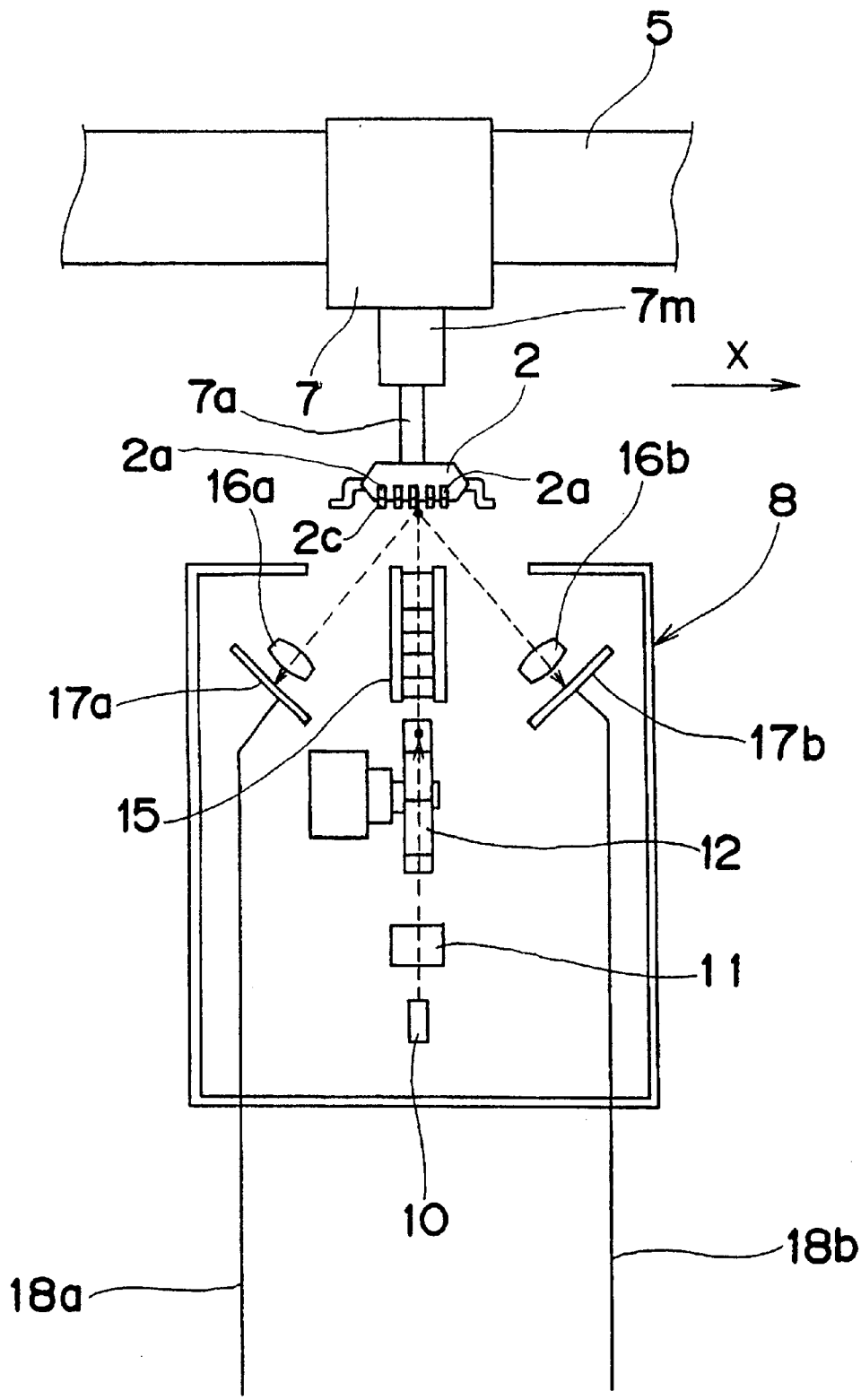
FIG. 2 is a side view of a height detection sensor to be used for the electronic component recognizing method of the first embodiment, viewed in an Y-axis direction.
Figure 3:
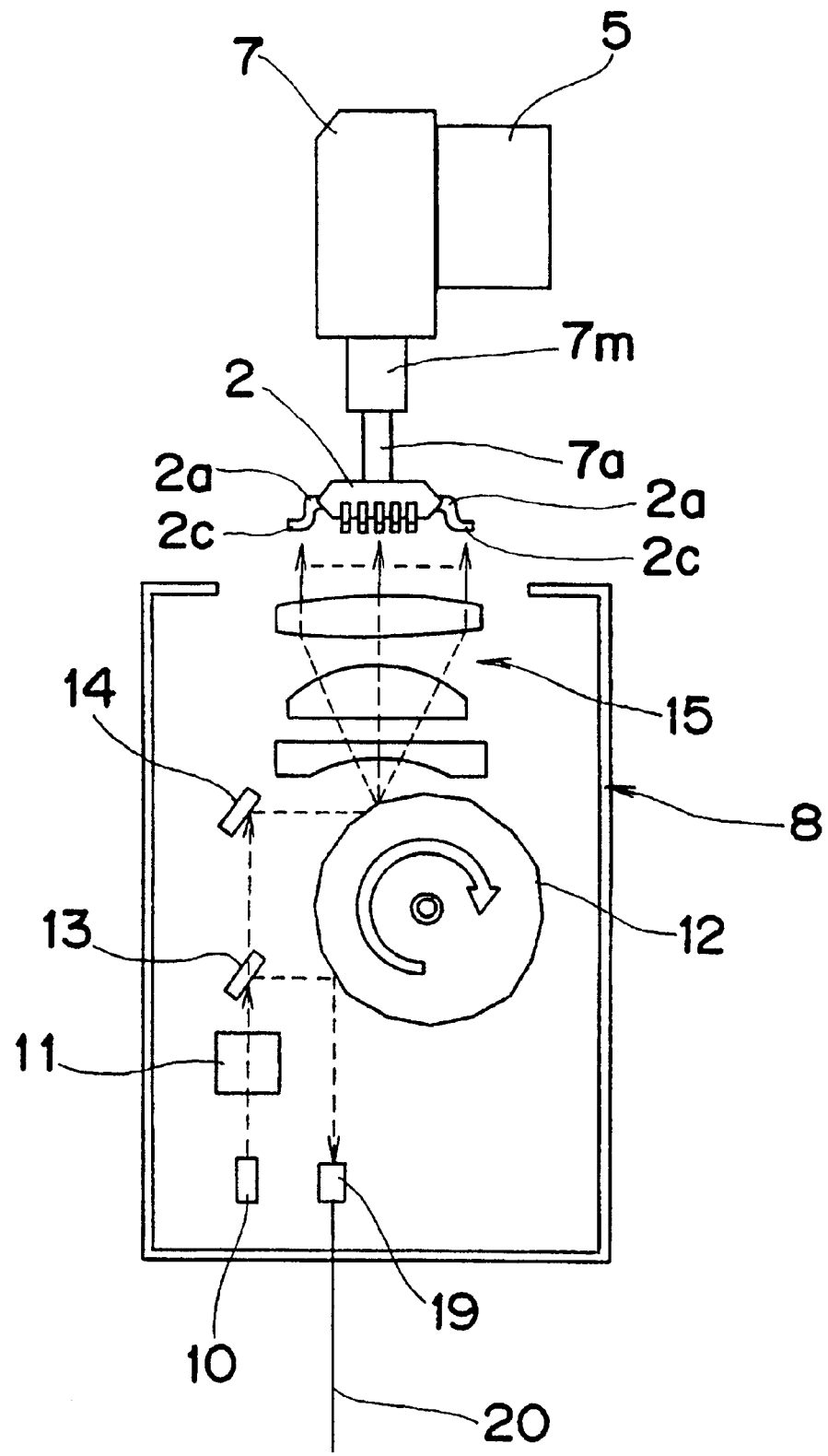
FIG. 3 is a side view of the height detection sensor of FIG. 2, viewed in an X-axis direction.

FIG. 2 is a schematic view (sectional view) of the 3D sensor 8 viewed in the Y-axis direction, showing an arrangement in which two systems of semiconductor Position Sensitive Detectors (abbreviated to PSDs hereinafter) 17a and 17b that serve as a detection device of the 3D sensor 8 are provided. FIG. 3 is a schematic view (sectional view) of the 3D sensor 8 viewed in the X-axis direction, showing a state in which a laser beam enters a light-receiving device 19 every time the reflecting surface of a polygon mirror 12 for reflecting the laser beam changes, consequently generating a polygon surface origin signal 20. In FIG. 2 and FIG. 3 are shown the X-axis robot 5, the head section 7, the sucked component 2, a semiconductor laser 10 for generating the laser beam, a light collecting and shaping lens 11 for collecting and shaping this laser beam, the polygon mirror 12 for scanning the laser beam impinging on this mirror surface by mechanical rotation, a half mirror 13 for partially transmitting and partially reflecting the laser beam, and a mirror 14 for reflecting light.

There are further shown an Fθ lens 15 that changes the optical path so that the laser beam mechanically swung by the polygon mirror 12 is applied perpendicularly to the component 2 that is the subject, focusing lenses 16a and 16b that focus the reflection light (scattered light) of the laser beam impinging on the component 2, and PSDs 17a and 17b that serve as a position detecting device on which the reflection lights of the laser beams impinging on the component 2 are focused via the focusing lenses 16a and 16b and each have a function for generating an electric signal correlated with the position of the focused light. The reference numerals 18a and 18b denote output signals of the PSDs 17a and 17b.

In this case, the laser beam emitted from the semiconductor laser 10 has its beam shape collected and shaped by the light collecting and shaping lens 11. Thereafter, the laser beam is transmitted through the half mirror 13 and then reflected on the mirror 14 to impinge on the polygon mirror 12. The polygon mirror 12 is rotating with constant velocity, so that the laser beam impinging on the mirror surface is swung. Further, the laser beam whose optical path is changed by the Fθ lens is applied perpendicularly to the component 2, and this light reflected by the component 2 is focused on the PSDs 17a and 17b via the focusing lenses 16a and 16b. The PSDs 17a and 17b generate the output signals 18a and 18b capable of measuring the height of the laser reflecting surface of the component 2.

In this case, the laser beam is reflected on the polygon mirror 12 and thereafter applied to the component 2 that is the object. The laser beam is applied consistently perpendicularly to the component 2 that is the object by the Fθ lens 15 constructed of three elements existing between the polygon mirror 12 and the component 2.

The reference numeral 19 denotes a light-receiving device (photosensor) for sensing the input of light thereto, while the reference numeral 20 denotes a signal for informing the outside of the input of light into the photosensor 19. This signal changes when each mirror surface of the polygon mirror 12 comes into a specified angle, which is the so-called origin signal (surface origin) of each surface of the polygon mirror 12. Further, in the case of a polygon mirror 12 having, for example, 18 sides, a signal is to be outputted 18 times per rotation every time the mirror surfaces rotate at regular intervals of angle (at angles of 20 degrees in the case of 18 sides). This is called the rotation amount signal of the polygon mirror 12.

The 3D sensor 8 of the first embodiment has two systems of PSD circuits. This arrangement is provided principally for compensating for no return of the reflection light to the PSD in terms of angle, which possibly occurs in the case where the laser beam is applied to the component when one system is employed. It is sometimes more effective to provide three or more systems, technically having the same meaning, and accordingly, description will be provided on the basis of the two systems.

Figure 5:
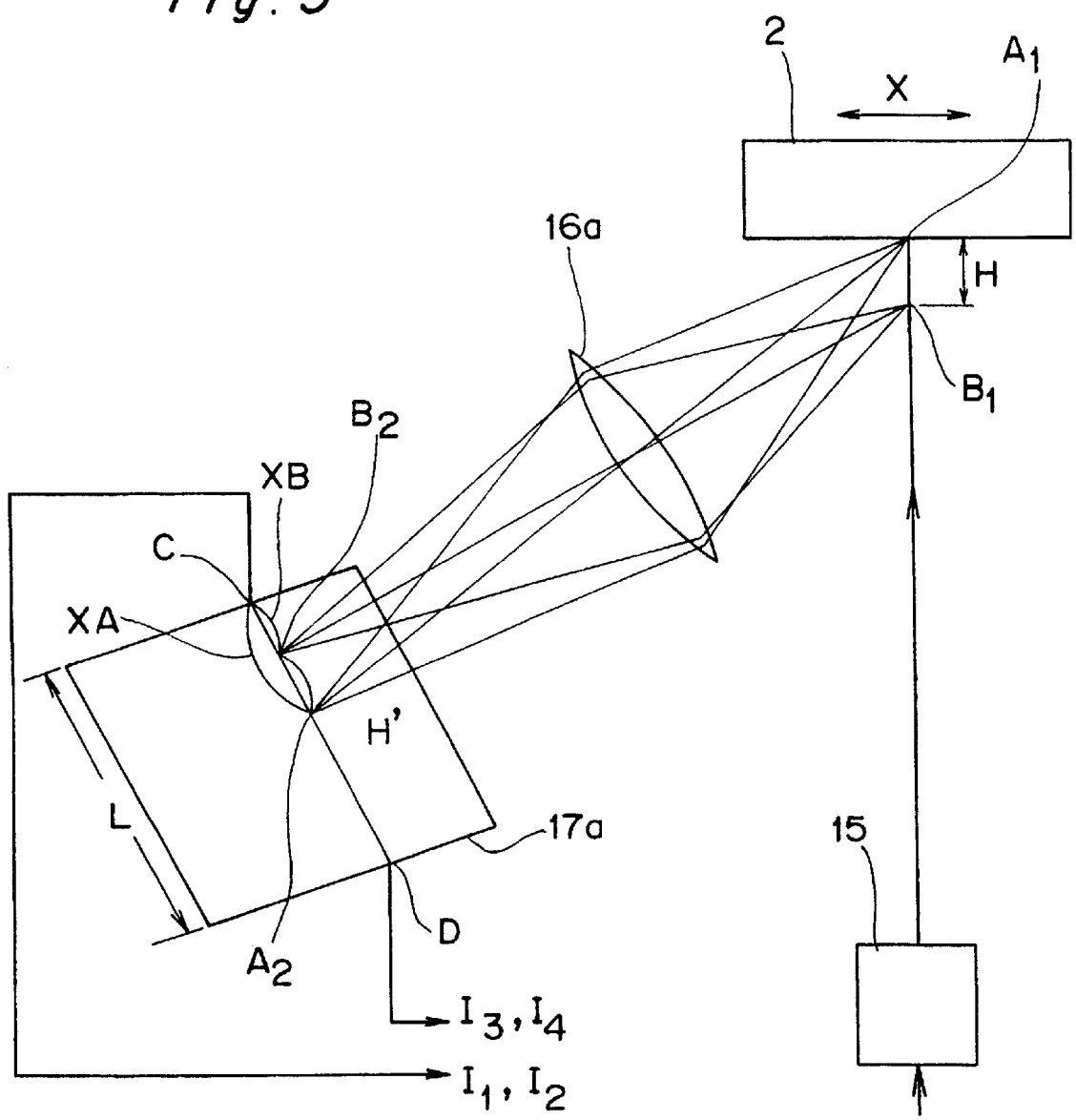
FIG. 5 is an explanatory view showing an example of the height measuring method of the first embodiment.

Reference will herein be made to an example of a method for measuring the height of the component 2 that is the object to be measured by the aforementioned semiconductor position sensitive devices (PSDs) 17a and 17b, as represented by the semiconductor position sensitive device 17a, with reference to FIG. 5.

In FIG. 5, the laser beam that is scanned from the Fθ lens 15 in the direction (Y-axis direction) perpendicular to the sheet plane where the figure is drawn and applied to the bottom surface of the component 2 is irregularly reflected on the bottom surface of the component 2. In this case, assuming that the projected point is a point $A_1$ at a height O on the bottom surface of the component 2 and a point $B_1$ at a height H from the bottom surface, then the irregularly reflected laser beams are collected by the focusing lens 16a and each focused on a point $A_2$ and a point $B_2$ on the semiconductor position sensitive device 17a. Consequently, an electromotive force is generated at the point $A_2$ and the point $B_2$, so that currents $I_1$ and $I_2$ are taken out of a point C and currents $I_3$ and $I_4$ are taken out of a point D. The currents $I_1$ and $I_3$ depend on resistance components proportional to a distance $X_A$ between the point $A_2$ and the point C and a distance between the point $A_2$ and the point D, while the currents $I_2$ and $I_4$ depend on resistance components proportional to a distance $X_B$ between the point $B_2$ and the point C and a distance between the point $B_2$ and the point D. Therefore, assuming that the length of the semiconductor position sensitive device 17a is L, then $X_A$ and $X_B$ in FIG. 5 are determined according to the following expression.

$$X_A = LI_3/(I_1+I_3)$$

$$X_B = LI_4/(I_2+I_4)$$

Therefore, a distance H' between the point $A_2$ and the point $B_2$ on the semiconductor position sensitive device 17a in FIG. 5 is determined by the following expression.

$$H' = X_A - X_B$$

Based on the thus-obtained height H' on the PSD, the aforementioned height H is determined.

A mechanism for capturing a 3D image in the electronic component recognizing apparatus of the first embodiment will be described next with reference to FIG. 4.

Figure 4:
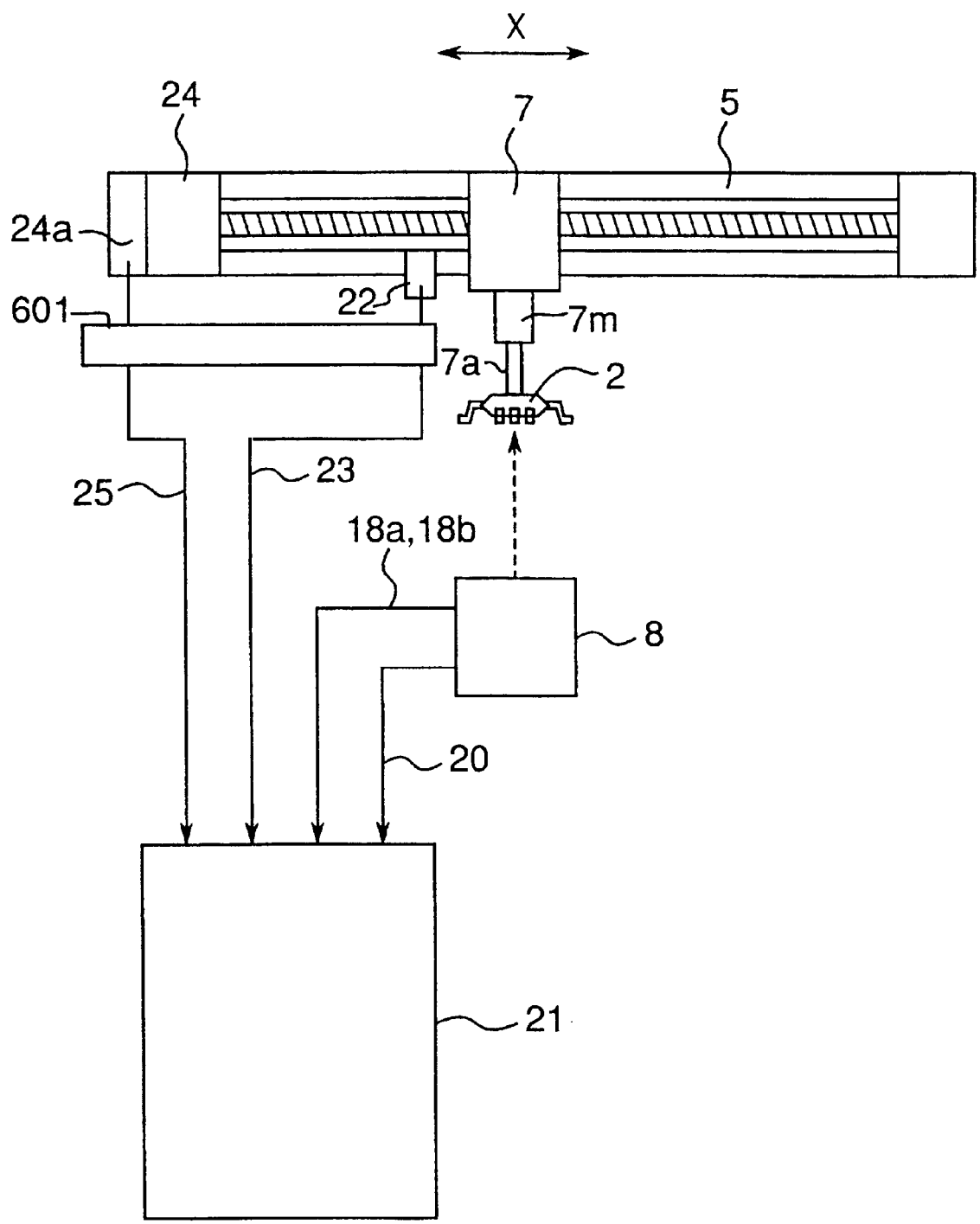
FIG. 4 is an explanatory view of an output signal from a 3D sensor in the first embodiment.

FIG. 4 is an explanatory view of the output signals from the 3D sensor 8 of the electronic component recognizing apparatus of the first embodiment. In FIG. 4 are shown the component 2, the X-axis robot 5, the head section 7, the 3D sensor 8, the PSD outputs 18a and 18b, the polygon surface origin signal (rotation amount signal) 20, an image processing control section 21, a reference position sensor 22 for informing the image processing control section 21 of the reference position for capturing the 3D image on the X-axis robot 5, a reference position signal 23 for informing the image processing control section 21 of the passing of the head section 7 at the side of this reference position sensor 22, a servomotor 24 for moving the X-axis robot 5, an encoder 24a of the servomotor 24, a servo controller 601 for controlling the servomotor 24, and an encoder signal 25 outputted from the encoder 24a. In FIG. 14, the reference numeral 200 denotes the main control section of the electronic component recognizing apparatus.

Each of the Y-axis robots 6a and 6b basically has a construction, similar to that of the X-axis robot 5, wherein a servomotor for driving the Y-axis robots is driven to move the X-axis robot 5 instead of the head section 7, and the operation of this servomotor is controlled by the servo controller 601. As is well known, when turning the nozzle 7a of the head section 7 in a θ-direction around its center axis, the operation of a θ-direction rotation use servomotor is also controlled by the servo controller 601. As is well known, when vertically moving a nozzle elevation shaft for supporting the nozzle 7a for the purpose of adjusting the height of the nozzle 7a of the head section 7, the operation of a vertical movement use servomotor 7m is also controlled by the servo controller 601.

When the component 2 picked up from the tray 3 is moved on the X-axis robot 5, the encoder 24a is always giving an encoder signal (a signal of AB-phase, Z-phase or equivalent to this) 25 to the image processing control section 21. Due to the fact that the reference position signal 23 is given to the image processing control section 21 when the component 2 passes at the side of the reference position sensor 22, the relative position of the component 2 relative to the reference position on the X-axis robot 5 can be calculated by the image processing control section 21 with both the signals.

On the other hand, the amount of rotation of the polygon mirror 12 located inside the 3D sensor 8 is consistently given as the polygon surface origin signal (rotation amount signal) 20 to the image processing control section 21 while this is rotating, and the amount of rotation of the polygon mirror 12 after the passing of the mirror 12 through the reference position can be calculated from the polygon surface origin signal 20 and the reference position signal 23.

In this case, the amount of rotation of the polygon mirror 12 increases in proportion to its velocity, and the same thing can be said for the amount of movement of the X-axis robot 5. On the other hand, in the 3D sensor 8 of the first embodiment, it is presupposed that the polygon mirror 12 rotates and the X-axis robot 5 linearly moves when capturing the 3D image, each with constant velocity. If these conditions are disordered, then the resolution (pixel size) per pixel in the horizontal and vertical directions of the 3D image to be captured is to vary according to the fluctuation in velocity. This is an error factor in terms of measurement accuracy. Therefore, in the electronic component recognizing apparatus of the first embodiment, the 3D image is captured into an image memory (see FIGS. 14 and 21) located inside the image processing control section 21 by the 3D sensor 8 having the aforementioned construction. Further, in order to watch and control the consistency of the operation of the polygon mirror 12 that is rotating basically with constant velocity with the operation of the head section 7 driven by a motor such as the servomotor 24, the polygon surface origin signal (rotation amount signal) of the polygon mirror 12 and the encoder signal 25 of the motor are used.

Figure 6:
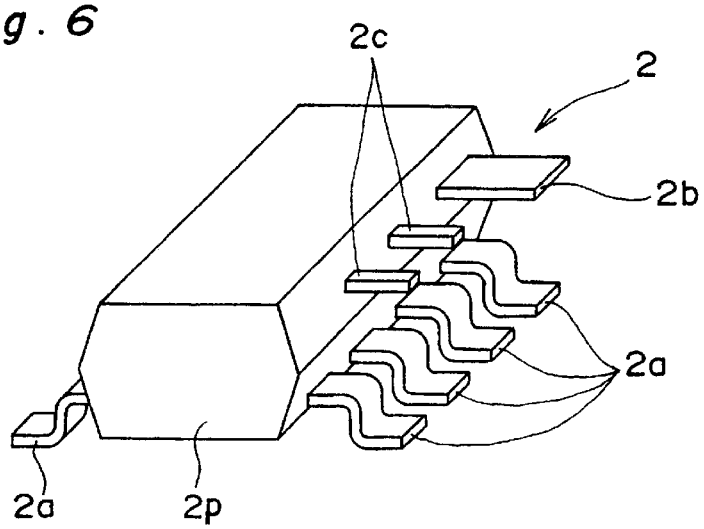
FIG. 6 is a perspective view of an electronic component, for which positional detection executed by a three-dimensional sensor according to the electronic component recognizing method of the first embodiment is effective.

FIG. 6 is a perspective view of an electronic component, for which the positional detection executed by the three-dimensional sensor 8 according to the electronic component recognizing method of the first embodiment is effective. This electronic component 2 has four leads 2a provided on the left-hand side and four leads 2a provided on the right-hand side, which are projecting sideways from its body 2p as bent downward. In terms of a plan view, there are sideways projecting projections 2c between the first and second leads 2a and between the second and third leads 2a on this side among the four leads 2a located on the right-hand side, and a large projection 2b is sideways projecting above the hindmost lead 2a in a vertically overlapping manner. This kind of electronic component 2 can be considered as a special component that is very scarcely mounted in the general electronic component assembling processes. However, if such an electronic component 2 must be mounted, then there is arising concern about how fast the mounting can be achieved. For example, with regard to a board for use in a product having a short life of about three to six months, as represented by a portable telephone or a personal computer, it is generally not permitted to consume time more than one week in coping with the special component, for example, by newly forming an image processing program and using the same. Accordingly, it is currently required to correctly detect the position of the leads 2a of even the component 2 shown in FIG. 6.

Figure 7:
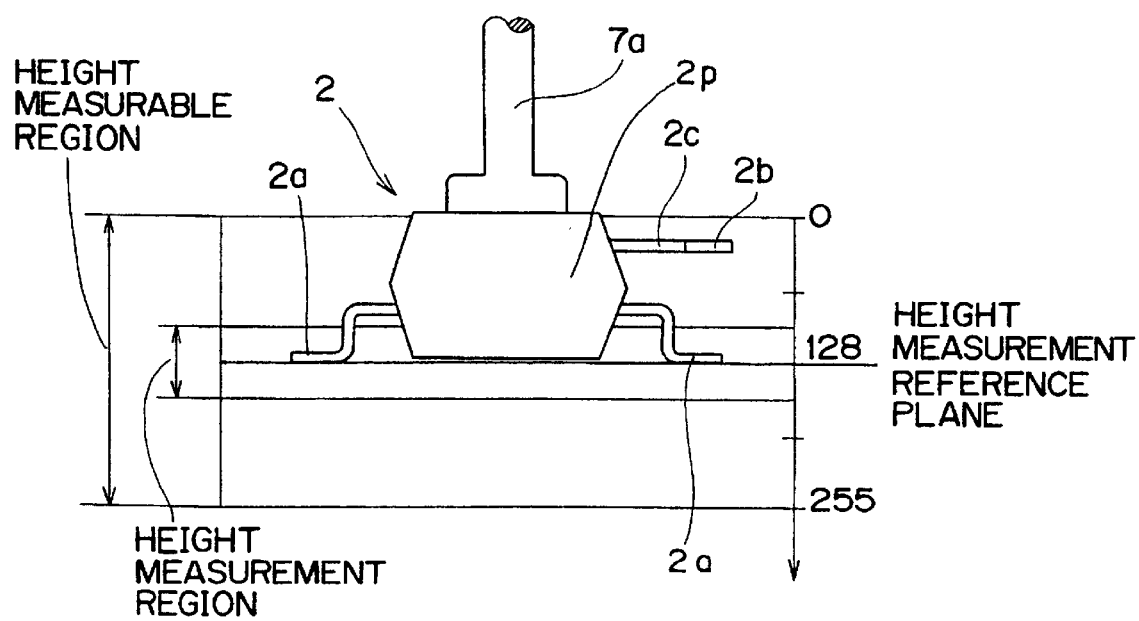
FIG. 7 is a view for explaining a relation between the positions of the leads of the electronic component of FIG. 6 and the positions of projections that become noises and a height measurement region according to the electronic component recognizing method of the first embodiment.

FIG. 7 is a view for explaining a relation between the positions of the leads 2a and the positions of the projections 2b and 2c that generate noise during detection of the electronic component 2 shown in FIG. 6 and the height measurement region according to the electronic component recognizing method of the first embodiment. This first embodiment uses the 8-bit image processing, and therefore, 256 numeric values ranging from 0 up to 255 can be handled as height data. According to the first embodiment, the reference plane of height measurement, where the beam diameter of the laser beam is minimized, is assumed to be the position of the numeric value of 128, for the sake of convenience. With this numeric value of 128 used as the reference, the height coordinate axis is taken in the vertical direction from the component 2 toward the 3D sensor 8. Then there are given the numeric values of up to 255 ranging from the numeric value of 0 that represents the uppermost end via the numeric value of 128 that represents the reference plane of height measurement to the numeric value of 255 that represents the lowermost end, thereby expressing the height measurable region by the positions of 256 numeric values ranging from 0 to 255, with the height measurement center position represented by 128. The values of 0 and 255 are used as height data for expressing an error that "height data is not correctly obtained" or the like. It is to be noted that the height measurable region and its center position of the 3D sensor are physically determined depending on the optical system design of the 3D sensor. In general, when recognizing an electronic component, the positioning in the direction of height is performed so that the mounting surface of the electronic component comes into the height measurement center position of the 3D sensor and the height image of the electronic component is captured. In the present embodiment, if the resolution in the direction of height is set to 10 $\mu$m, then the height measurable region becomes about ±1.2 mm. Therefore, if a noise lead of the electronic component exists outside this region, then there is no need for adjusting the range of the height measurement region. On the other hand, the range of the height measurement region is required to be adjusted when a noise object enters this range of about ±1.2 mm and has a height different from that of the connection portion, as described later.

Figure 9:
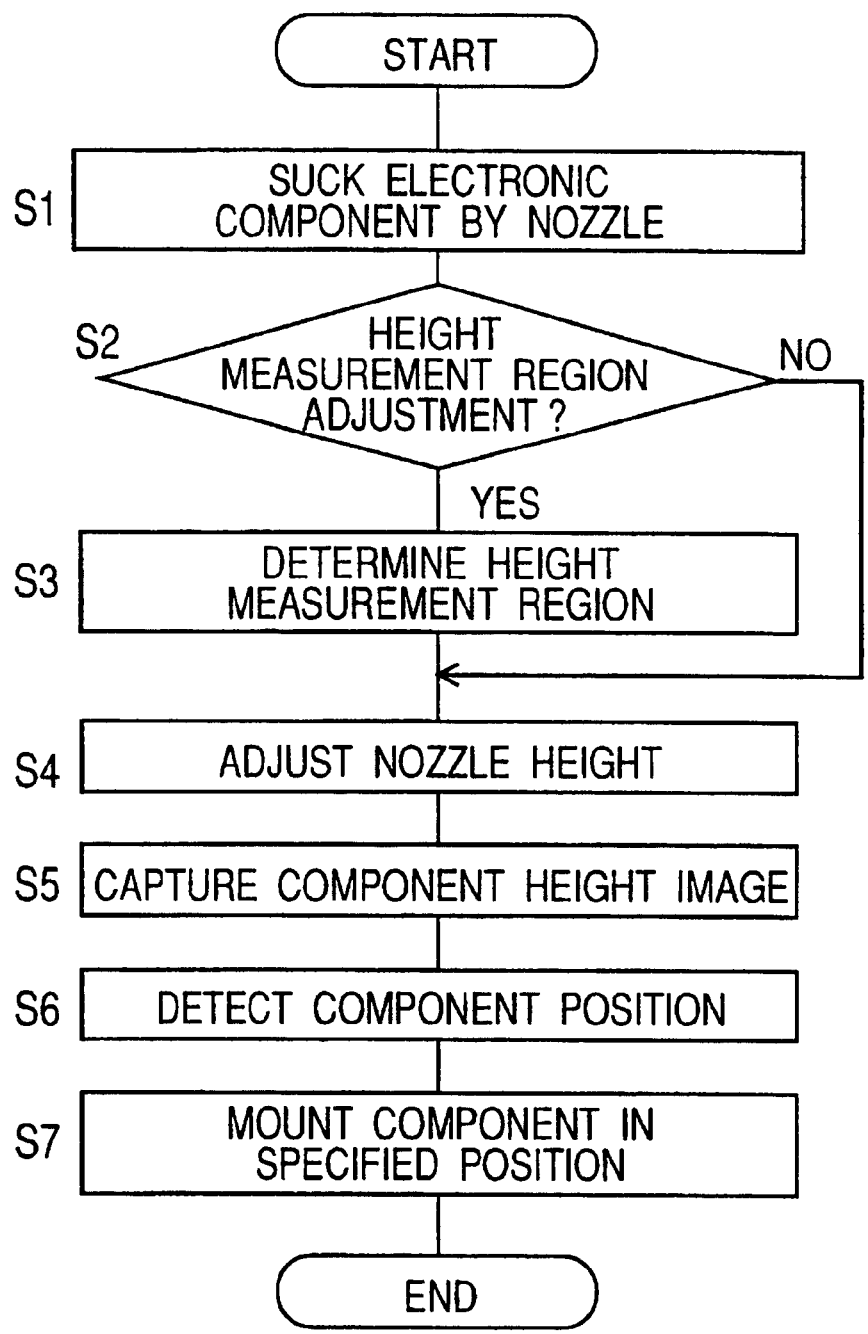
FIG. 9 is a flow chart showing a procedure for mounting an electronic component by using the electronic component recognizing method of the first embodiment.

FIG. 9 is a flowchart showing a procedure for mounting an electronic component by means of the electronic component recognizing method of the first embodiment.

First, in Step S1, the component 2 is sucked to the nozzle 7a of the head section 7 from the tray 3 under the control of the main control section 200.

Next, in Step S2, the operator decides whether the height measurement region requires adjustment by visually checking the shape of the component and so on. If the height measurement region that is desired to be subjected to height detection has been previously known and the adjustment of the height measurement region is required, then the program flow proceeds to Step S3. If the adjustment of the height measurement region is not required, then the program flow proceeds to Step S4. In Step S3, the adjustment of the height measurement region is executed only when the height measurement region that is desired to be subjected to height detection has been previously known. The adjustment of the height measurement region is executed by narrowing the height measurement region so that the projections 2b and 2c are excluded from the height measurement region in, for example, the case where the operator decides at Step S2 that the projections 2b and 2c fall within the height measurement region of the leads 2a by visually checking the distance between the leads 2a of the electronic component 2 and the projections 2b and 2c that possibly become noise objects.

Next, in Step S4, the servo controller 601 is controlled by the main control section 200 on the basis of the height measurement region, thereby adjusting the height of the nozzle 7a. It is proper that how high the nozzle 7a is to be adjusted should be decided by the operator according to the shape of the electronic component 2 and then, the operator may preparatorily incorporate the decision into the component shape information in the mounting information that is necessary for the mounting program (refer to the description of FIG. 14 with regard to the component shape information) which component shape information has been stored in a component shape information storage section 620 of the main control section 200. In the case of the normal component 2, it is preferable to execute the height measurement by driving the servomotor 7m for vertically adjusting the nozzle elevation shaft under the control of the servo controller 601 via the main control section 200 so that zero adjustment amount is achieved or the height measurement reference plane of the height measurement region coincides with the mounting surface of the component 2 to thereby vertically adjust the nozzle elevation shaft that supports the nozzle 7a for the adjustment of the height of the lower end of the nozzle 7a, consequently positioning the component mounting surface in the height measurement reference plane of the height measurement region. In general, the component that requires the height adjustment is considered to be only the special component as shown in FIG. 6.

Next, in Step S5, under the control of the main control section 200, the height data of the component 2 is taken into an image memory 305 as shown in FIG. 14 from the component shape information of the mounting information necessary for the mounting program. This image memory 305 stores the 8-bit height data, and by separately designating the address on the X-axis side and the address on the Y-axis side, height data of the specified position can be read from the image memory 305.

Next, in Step S6, the position of the component 2 is detected by the 3D sensor 8. The detail is shown in Step S6A through Step S6E of FIG. 10 as follows.

Next, in Step S7, the component 2 is mounted in the specified position of the printed board 9 on the basis of the height position information recognized by the 3D sensor 8 under the control of the main control section 200.

Figure 10:
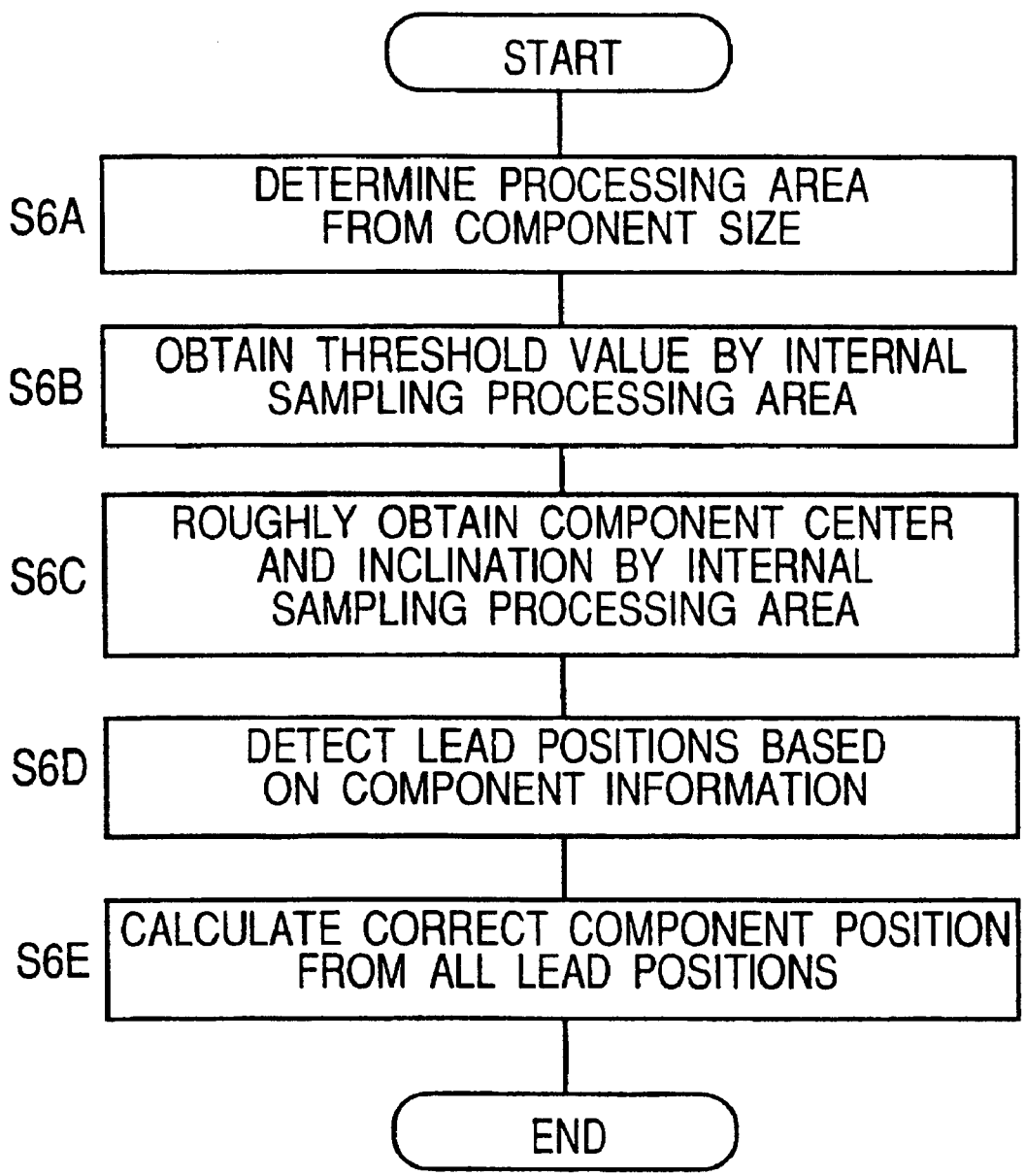
FIG. 10 is a flow chart showing in detail a procedure for detecting the position of the component from height data in Step S6 of FIG. 9.

FIG. 10 shows in detail the position detecting procedure of the component 2 from the height data in Step S6 of FIG. 9.

Figure 11A:
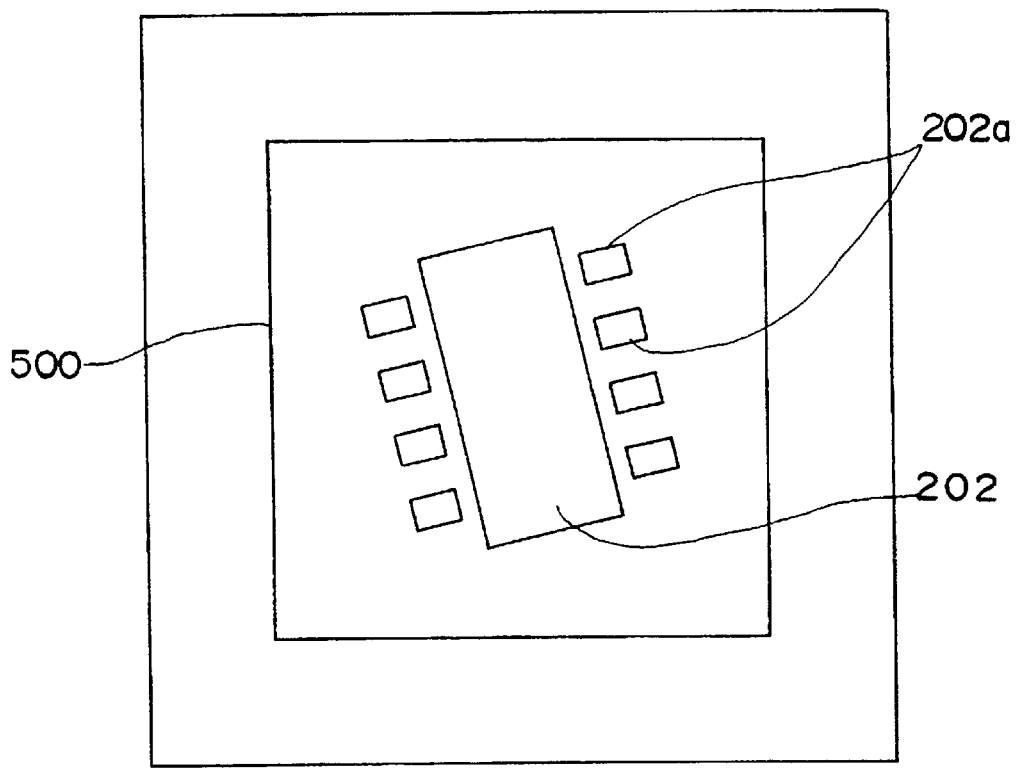
FIGS. 11A and 11B are a schematic explanatory view showing a window of a processing area determined by the component size in the position detecting procedure of FIG. 10 and a schematic explanatory view showing the obtainment of the rough center and inclination of the component by sampling the inside of the processing area, respectively.

First, in Step S6A, a processing area is determined from the size of the component 2 stored in the component shape information. For example, the sizes in the X-axis and Y-axis directions of the processing area are set two times as large as the size of the component 2 on the screen. FIG. 11A shows a rectangular window 500 taken as an example of the processing area determined from the size of the component 2. FIG. 11A shows the fact that images 202a of the leads 2a of the component 2 fall within the window 500 with a sufficient margin by setting the size of the rectangular window 500 that is the processing area to be roughly two times as large as the size of the image 202 of the component 2.

Figure 13:
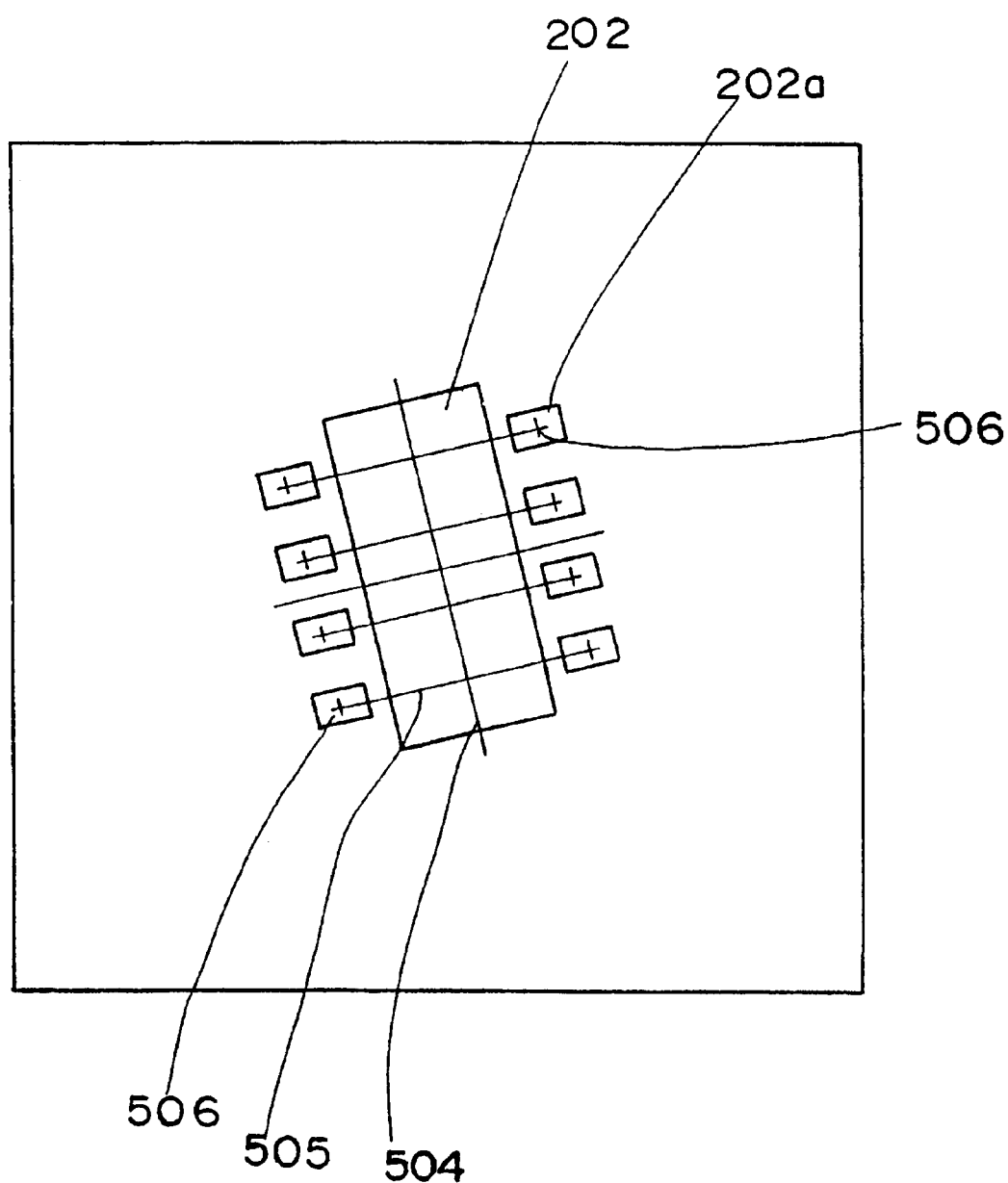
FIG. 13 is a schematic explanatory view showing an example of calculation results of the correct center and inclination of the component in the position detecting procedure of FIG. 10.
Figure 17:
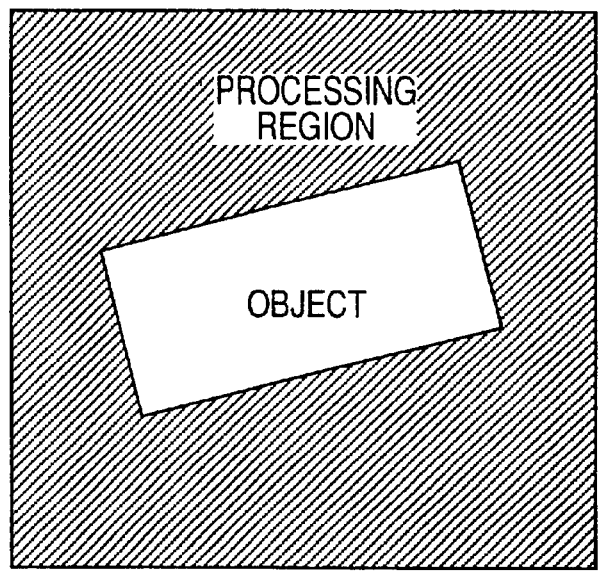
FIG. 17 is a view showing a processing area to be an object of formation of a luminance histogram.
Figure 18:
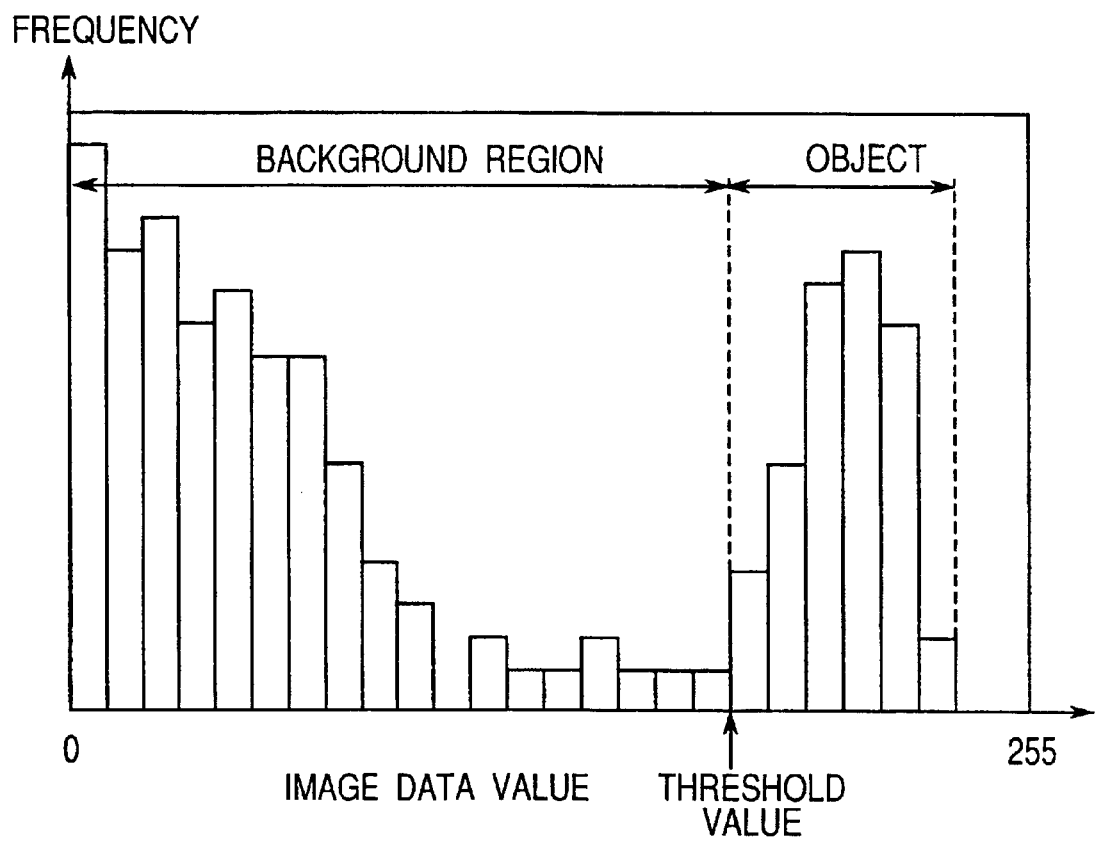
FIG. 18 is a graph of the luminance histogram of the processing area of FIG. 17.

Next, in Step S6B, the processing area as shown in FIG. 17 is internally sampled to form a luminance histogram as shown in FIG. 13 on the basis of the luminance representing the height data in each position. Thereafter, a threshold value is calculated and set by the histogram method in order to separate the height data of the connection portion that is the object to be subjected to height detection, or, for example, the leads 2a and the height data of the noise object from each other in this luminance histogram. In this case, a ratio between the area of the bar graph portion on the left-hand side of the threshold value of the histogram and the area of the bar graph portion on the right-hand side of the threshold value of the histogram becomes equal to a ratio between the area of the background region of the processing area and the area of the object in FIG. 17. Therefore, the calculation of the threshold value by the histogram method is executed as follows. First, a region including the object is determined inside the image memory. Next, image data is read through sampling at regular intervals each in the X-axis direction and the Y-axis direction, and the histogram of the image data is formed. An incidence of the image data having a relatively high value as of the connection portion of the object is equal to a ratio of the area (S%=100*B/A) of the connection portion (this area is herein assumed to be an area B) to a predetermined sampling region (this area is herein assumed to be an area A). Therefore, if the frequencies are successively added together from the right-hand end of the luminance histogram and the added value reaches S% of the area of the histogram, then the added region represents the image data corresponding to the leads. Therefore, the value of the image data representing S% is assumed to be the threshold value.

Figure 11B:
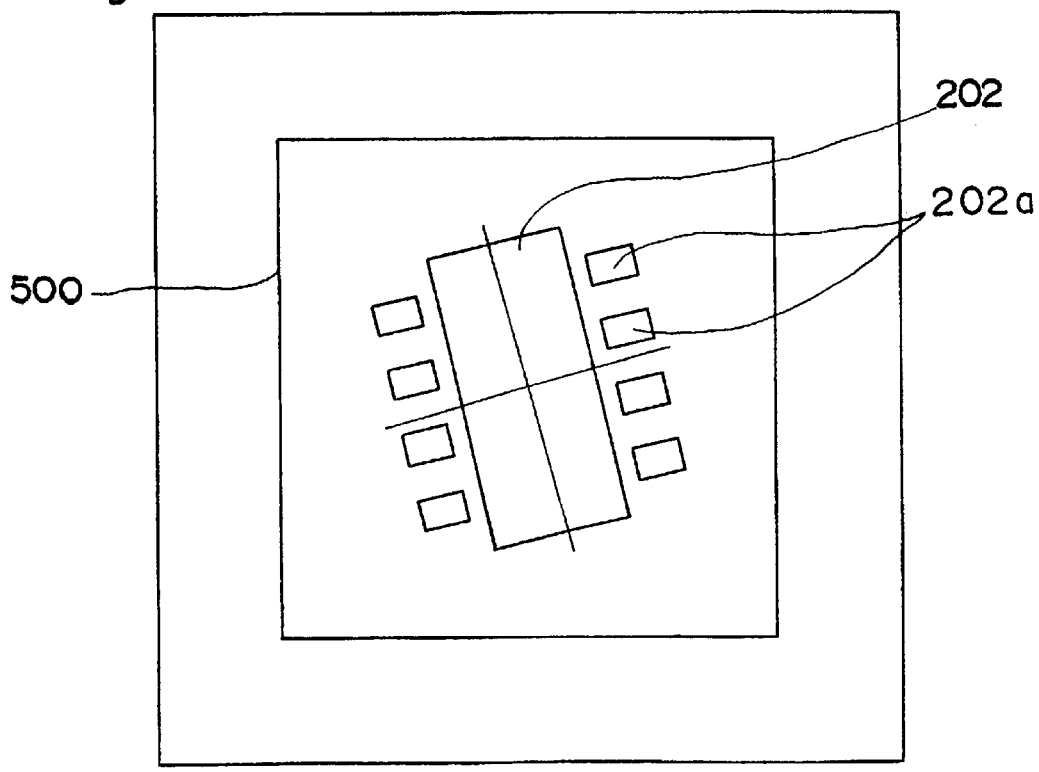

Next, in Step S6C, the window 500 of the processing area is internally sampled to roughly detect the center and the inclination (an angle of inclination relative to the horizontal axis of the X-axis and the vertical axis of the Y-axis of the window inside the processing area) of the component 2 on the basis of the valid height data detected inside the height measurement region using the above threshold value. For example, according to the following expressions (Expression 1) and (Expression 2) for calculation, the center and the inclination of the component 2 can be obtained. FIG. 11B is a view showing an operation for obtaining the rough center and inclination of the component 2 by internally sampling the processing area 500. As an example of the sampling, it is executed to sample the height data every other pixel in the X-axis direction until the obtainment of the height data of the last pixel in the X-axis direction, proceed to the second pixel by skipping one pixel in the Y-axis direction, sample the height data every other pixel in the X-axis direction until the obtainment of the height data of the last pixel in the X-axis direction, similarly to the aforementioned manner, for the whole area inside the window 500.

In this case, first, in order to roughly obtain the center of the component 2, the window 500 is internally sampled to read height data H (x, y) from the image memory 305. As described above, the 8-bit height data is stored in the image memory 305, and by separately designating the X and Y addresses, the height data in the specified position can be read from the image memory 305. Then, according to the following (Expression 1), the center position (Xc, Yc) is calculated.

$$X_c = \frac{\sum_y \sum_x \rho(x, y) \times x}{\sum_y \sum_x \rho(x, y)} \qquad \text{Expression 1}$$

$$Y_c = \frac{\sum_y \sum_x \rho(x, y) \times y}{\sum_y \sum_x \rho(x, y)}$$

It is assumed that $\rho(x, y)=1$ when $H(x, y)>THL$. It is also assumed that $\rho(x, y)=0$ when $H(x, y)<THL$. In this case, THL represents the threshold value to be set in a threshold value calculating means 408 for the purpose of separating the connection portions, or, for example, the leads 2a to be subjected to height detection from the noise object in a luminance histogram that has been formed by the threshold value calculating means 408 stored in a program memory 301 of FIG. 15 on the basis of the luminance representing the height data in each position. The threshold value is set to a value slightly lower than an estimated height of the leads 2a that seems to be the object to be recognized by internally sampling the window 500 that is the processing area. Otherwise, a fixed value may be set. For example, according to the first embodiment, the numeric value of 128 of the reference plane of height measurement corresponds to the mounting surface of the component 2, and therefore, the threshold value THL is set to a numeric value of 80 (in a position 0.48 mm above the mounting surface).

The inclination $\theta_1$ is detected according to the following (Expression 2).

$$\theta_1 = \left(\frac{1}{2}\right)\tan^{-1}\left(\frac{S_1}{S_2}\right)$$

$$S_1 = 2 \times (N \times S_{xy} - S_x \times S_y)$$

$$S_2 = (N \times S_{xx} - S_x^2) - (N \times S_{yy} - S_y^2)$$

$$N = \sum_y \sum_x \rho(x, y)$$

$$S_x = \sum_y \sum_x \rho(x, y) \times x$$

$$S_y = \sum_y \sum_x \rho(x, y) \times y$$

$$S_{xx} = \sum_y \sum_x \rho(x, y) \times x^2$$

$$S_{yy} = \sum_y \sum_x \rho(x, y) \times y^2$$

$$S_{xy} = \sum_y \sum_x \rho(x, y) \times xy$$

Expression 2

It is assumed that $\rho(x, y)=1$ when $H(x, y)>THL$. It is also assumed that $\rho(x, y)=0$ when $H(x, y)<THL$.

Figure 12A:
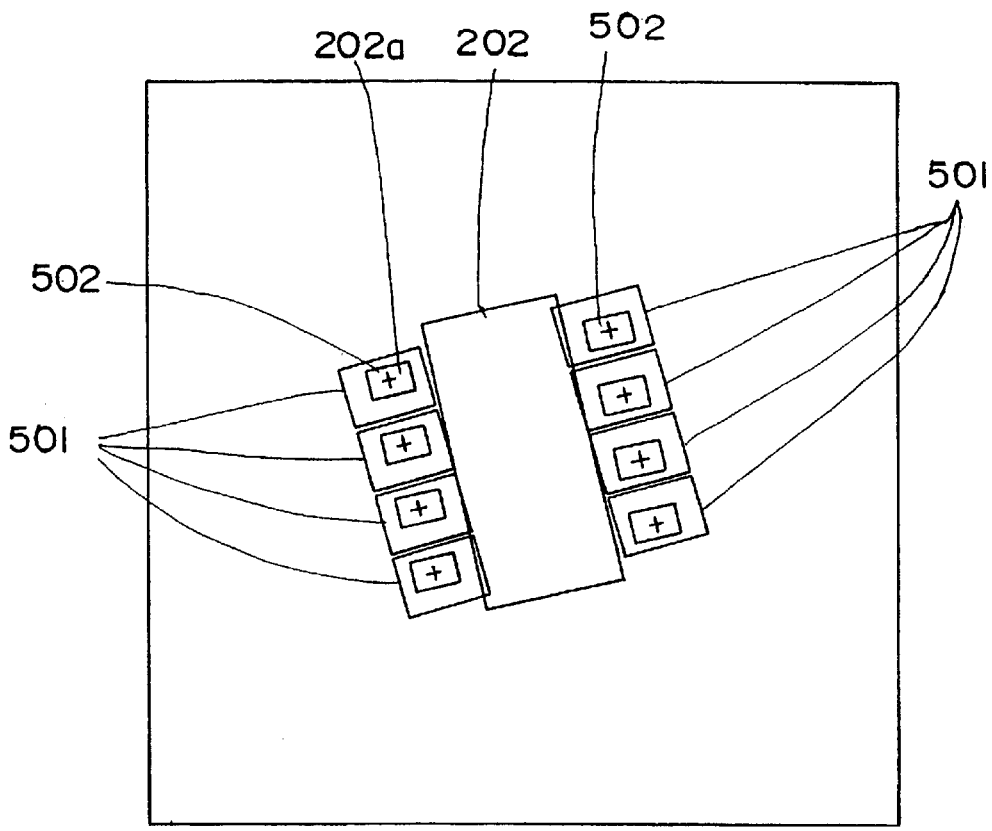
FIGS. 12A and 12B are a schematic explanatory view showing a state in which the centers of the leads are detected by estimating the positions where individual leads exist, setting small windows including the leads, sampling the inside of the windows, by means of the rough center and inclination of the component, and component shape information transmitted from a main control section in the position detecting procedure of FIG. 10, and a schematic explanatory view showing a state in which the correct center and inclination of the component are calculated from the positions of all the leads, respectively.

Next, in Step S6D, the positions of the leads 2a are detected on the basis of the component shape information and the rough position of the component 2. That is, as shown in FIG. 12A, the position in which each lead 2a exists is estimated by using the rough center and inclination of the component 2 obtained in Step S6C and the width and depth of the body 2p in the component shape information transmitted from the main control section 200, and a small window 501 including each lead 2a is set. This small window 501 is set, for example, approximately two times as large as the size of the image 202a of the lead 2a. This small window 501 is internally sampled, thereby detecting the center position 502 of each lead 2a. As an example of the sampling, it is executed to sample the height data every other pixel in the X-axis direction until the obtainment of the height data of the last pixel in the X-axis direction, proceed to the second pixel by skipping one pixel in the Y-axis direction, sample the height data every other pixel in the X-axis direction until the obtainment of the height data of the last pixel in the X-axis direction, similarly to the aforementioned manner, for the whole area inside the small window 501. For the component shape information, there have been preparatorily stored the information of the size of the body 2p of the component 2 (body height, body width, and body depth), the number of the leads, lead length, lead width, lead pitch, and so on, necessary for calculating the position in which each individual lead 2a exists.

Figure 12B:
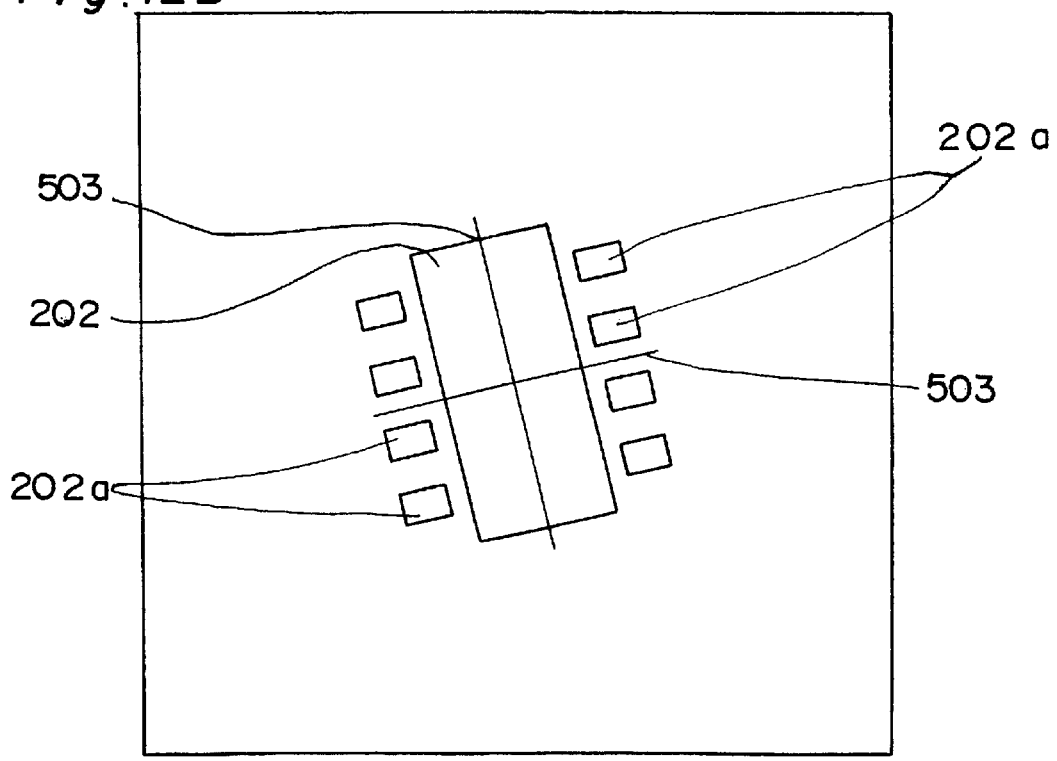

Next, in Step S6E, the correct position of the component 2 is obtained from all the lead positions (the coordinates of the lead center positions). FIG. 12B is a view for explaining the state in which the correct center and inclination of the component 2 are calculated from all the lead positions. For example, the center position is obtained by the arithmetic mean of all the lead positions, while the inclination can be expressed by a cross-shaped lines 503 obtained by calculating the respective middle points between the lead center positions of the leads 2a that are located opposite from each other across the body 2p and approximating four middle points. FIG. 13 shows an example of the results of calculation of the thus-obtained correct center and inclination of the component 2. In FIG. 13, the straight line 504 represents the inclination of the component 2, and intersection points 506 of four straight lines 505 perpendicular to the straight line 504 and the center lines of the images 202a of the four leads 2a located on the left-hand side and the four leads 2a located on the right-hand side become the center position coordinates of the leads 2a.

Figure 8A:
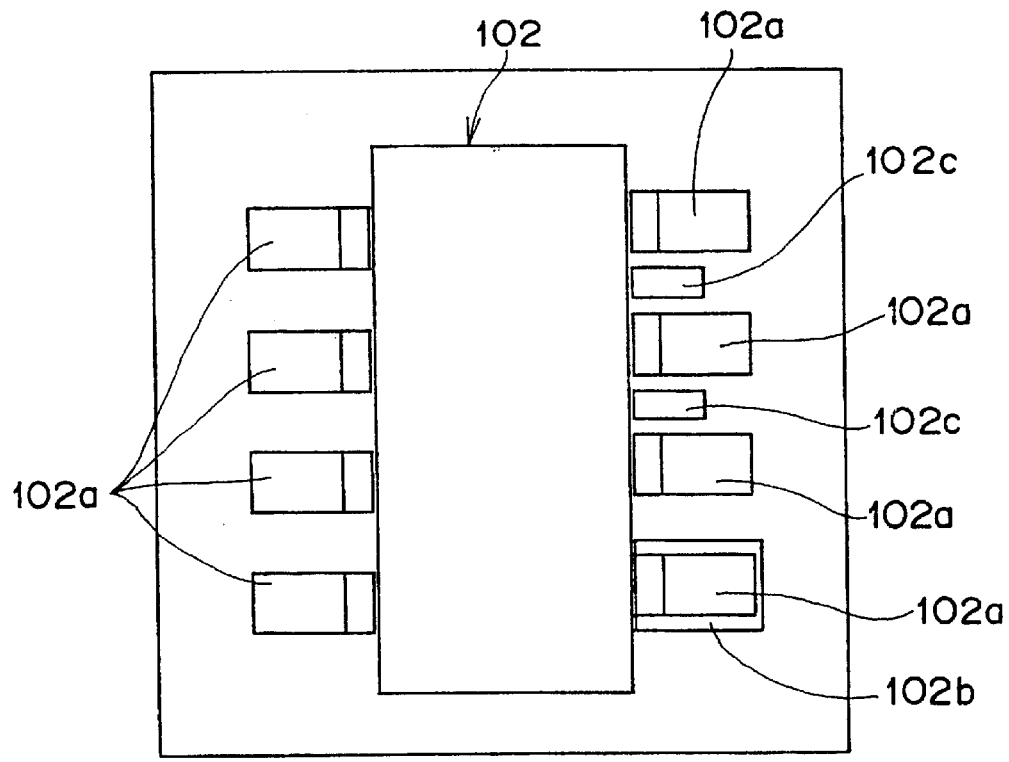
FIGS. 8A and 8B are a schematic explanatory view of an image of the electronic component of FIG. 6 captured by a CCD camera according to the prior art technique and a schematic explanatory view of an image of the electronic component of FIG. 6 captured according to the electronic component recognizing method of the first embodiment, respectively.

In this case, in order to compare the first embodiment with the prior art, an image 102 obtained by capturing the electronic component 2 of FIG. 6 by the prior art CCD camera is schematically shown in FIG. 8A. Since noises 102c corresponding to the projections 2c are existing between the images 102a of two leads 2a, it is required to execute a "noise lead removing process" for removing the noises 102c so as to prevent the influence of the noises 102c when detecting the images 102a of the leads 2a. The image 102a of the lead 2a located at the hindmost end is completely included in the noise 102b corresponding to the projection 2b, and therefore, it is required to execute a "low-contrast lead detecting process" (image emphasis process) in order to execute the positional detection of the lead 2a located at the hindmost end. Depending on the capabilities of the "noise lead removing process" and the "low-contrast lead detecting process", there is anticipated a state of recognized position displacement and non-recognition, leading to the issue that the reliability reduces. It is to be herein noted that the noises 102c and the noise 102b are supposed to be the objects of brightness approximately equal to that of the images 102a of the leads 2a.

Figure 8B:
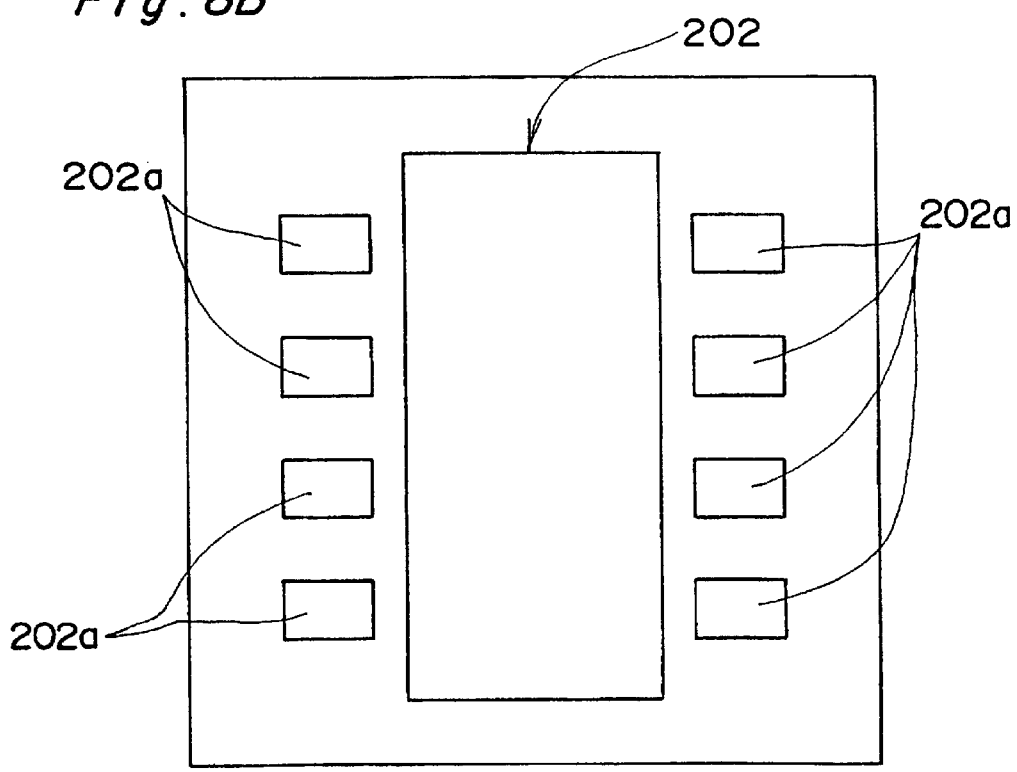

In contrast to this, according to the first embodiment, it is executed to preset the height measurement region capable of detecting the height positions of the leads 2a about the numeric value of 128, that is, the reference plane of height measurement in the height measurable region, and the height measurement is executed only within the range of this height measurement region. Therefore, only the heights of the leads 2a located inside the height measurement region can be detected, while the heights of the projections 2b and 2c located outside the height measurement region are not detected. Therefore, as shown in FIG. 8B, the image 202 of the electronic component 2 having only the images 202a of the leads 2a can be captured. That is, the noises 102c and the noise 102b that have been disadvantageously detected by the prior art are located outside the height measurement region of the 3D sensor 8 according to the component recognizing method of the first embodiment. Therefore, the 3D sensor 8 detects neither the noises 102c nor the noise 102b. That is, this embodiment needs neither the "noise lead removing process" nor the "low-contrast lead detecting process", which have been needed for the prior art. Therefore, in comparison with the prior art method, the first embodiment has not only the effect of reducing the image processing time but also the effect of remarkably improving the reliability of recognition.

Therefore, according to the component recognizing method of the first embodiment, the height measurement region capable of detecting the height positions of the leads 2a about the height measurement reference plane within the height measurable region is preset and then, the height detection is executed only within the range of this height measurement region. With this arrangement, only the heights of the leads 2a located inside the height measurement region can be detected, while the heights of the projections 2b and 2c located outside the height measurement region are not detected. Therefore, even though the projections 2b and 2c that become the noises exist near the leads 2a, electrodes and so on existing on the mounting surface of the electronic component 2, correct recognition can be achieved without erroneously recognizing the projections 2b and 2c and the like as the leads 2a, the electrode or the like. Consequently, the positional information of the connection portions such as the leads 2a and electrodes existing on the mounting surface of the electronic component 2 can be correctly obtained. Therefore, by executing the mounting of the electronic component 2 on the basis of the positional information of the connection portions obtained correctly, the electronic component 2 can be mounted more correctly.

FIG. 14 is a detailed block diagram of a component recognizing apparatus for implementing the component recognizing method of the first embodiment.

In FIG. 14, the main control section 200 controls the operation of the whole electronic component mounting apparatus shown in FIG. 1. For example, the control section controls the position of the head section 7 of the electronic component mounting apparatus via the servo controller 601 and executes the suction, transport, and mounting of the electronic component 2 on the printed board 9. The component shape information {the size of the component body 2p (body height, body width, body depth), the number of the leads, lead length, lead width, lead pitch, and so on} of the electronic component 2 to be mounted is transmitted from the component shape information storage section 620 of the main control section 200 to a work memory 302 of the component recognizing apparatus via a system bus 201 and a 2-port memory 306, and the height image input of the electronic component 2 and the positional detection of the electronic component 2 are executed. The positional detection result of the electronic component 2 is inputted from the image processing control section 21 to the main control section 200 via the 2-port memory 306 and used for position correcting calculation in the X-, Y-, and θ-directions when mounting the electronic component 2 on the printed board 9 by controlling the operation of the whole electronic component mounting apparatus by the main control section 200. Then, on the basis of the results of the position (X, Y, θ) correcting calculation, the main control section 200 rotates the nozzle 7a in the θ-direction so as to correct the rotational position of the electronic component 2, incorporates the correcting calculation results into the mounting position of the electronic component 2 in the X-Y directions so as to move the head section 7 in the X-Y directions and mounts the electronic component 2 in the specified position of the printed board 9.

On the other hand, in the X-axis robot 5 as described above, the head section 7 that is sucking the electronic component 2 is moved on the X-axis 5 by the rotation of the servomotor 24. The height data input of the electronic component 2 is executed by the head section 7 that is sucking the electronic component 2 and moving with constant velocity above the 3D sensor 8 from the left-hand side toward the right-hand side of the reference position sensor 22. When the head section 7 passes at the side of the reference position sensor 22, the reference position signal 23 is outputted to inform the image processing control section 21 of the output. In the X-Y robot 600 including this X-axis robot 5, the servo controller 601 executes the positional control of the X-axis, Y-axis, θ-axis, and nozzle elevation axis. In particular, a motor encoder signal of the X-axis, which carries the information of the position of the head section 7 on the X-axis and a reference position signal from the X-axis, which carries the information of the fact that the head section 7 has come into a height measurement start position, are inputted to a timing control section 307 of the image processing control section 21 so as to inform the control section of the information and used for measuring the start timing of taking in the height data into the image memory 305 at the timing control section 307.

As described above, according to the height detection sensor 8 of the height detecting section 602, the light-receiving system for measuring the laser beam reflected on the object includes two systems (a channel A and a channel B) taking a variation in reflection of the laser beam into consideration, thereby ensuring reliability. The light-receiving systems amplify feeble signals detected by the PSDs 17a and 17b by means of preamplifiers 310a and 310b, convert the signals into 12-bit digital data (in order to ensure height calculation accuracy, the conversion into the 12-bit digital data is effected in this case) by means of A-D converters (analog-to-digital converters) 311a and 311b, and input the data into height calculating sections 312a and 312b of the image processing control section 21. The polygon mirror 12 is consistently rotating and inputting a polygon surface origin signal to a clock generating section 309 by means of the mechanism shown in FIG. 5. The clock generating section 309 generates a reference clock (CLK) required for writing the height data into the memory, generates a horizontal synchronization signal (HCLR) required for taking in the height data on the basis of the polygon surface origin signal 20, and inputs the signals into the timing control section 307 of the image processing control section 21.

The PSD signals that are obtained from the 3D sensor 8 of the height detecting section 602 through the preamplifiers 310a and 310b and digitized by the A-D converters 311a and 311b are converted into 8-bit height data by the height calculating sections 312a and 312b. A channel selecting section 303 compares the height data of the two systems (channel A and channel B) with each other in real time, and selects the height data that seems to have the higher certainty in accordance with each timing. For is example, if a division by zero occurs in the height calculating stage of the channel A, the numeric value of 255 representing the abnormality is given to the height data of the channel A. Therefore, in such a case, the value of the channel B is selected. If both the channels exhibit the abnormal values of 255, then the numeric value of 255 is outputted as the height data. If the height data of both the channels have normal values, the arithmetic mean value of the height data of both the channels is outputted. The height data outputted from the channel selecting section 303 is stored into the image memory 305 while translating the height data outside the height measurement region into an invalid value (zero, for example) by a height translating section 304. The storing of the height data into the image memory 305 is controlled by the timing control section 307. The timing control section 307 receives the reference position signal from the X-Y robot 600, thereafter counts the encoder signal 25 as a predetermined head section movement distance, thereafter generates a vertical synchronization signal (VCLR) and inputs the signal as a height data taking-in start signal into the image memory 305. The reason why the predetermined head section movement distance is counted by the encoder signal after the reception of the reference position signal in generating the vertical synchronization signal (VCLR) is that it is generally impossible to correctly mount the reference position sensor 22 in a height data taking-in start position. The height data stored in the image memory 305 is subjected to image processing operation by a CPU 300 that operates according to a program and subjected to positional detection and so on of the electronic component 2 that is the object to be recognized. The program is stored in the program memory 301. The component shape information {the component body size (body height, body width, body depth), the number of leads, lead length, lead width and so on} in the component shape information storage section 620 that is storing the geometrical features of the component 2 is previously transmitted from the main control section 200 via the 2-port memory 306 prior to the height image input. The positional detection of the object to be recognized is executed on the basis of the component shape information as described above. It is to be noted that the work memory 302 is used as the place for storing the intermediate result in executing the positional detection of the object to be recognized. As described above, when the height translation table is used in the height translating section 304 that serves as an example of the noise removing section, the translation velocity is fast and the component recognizing velocity can be improved.

Figure 15:
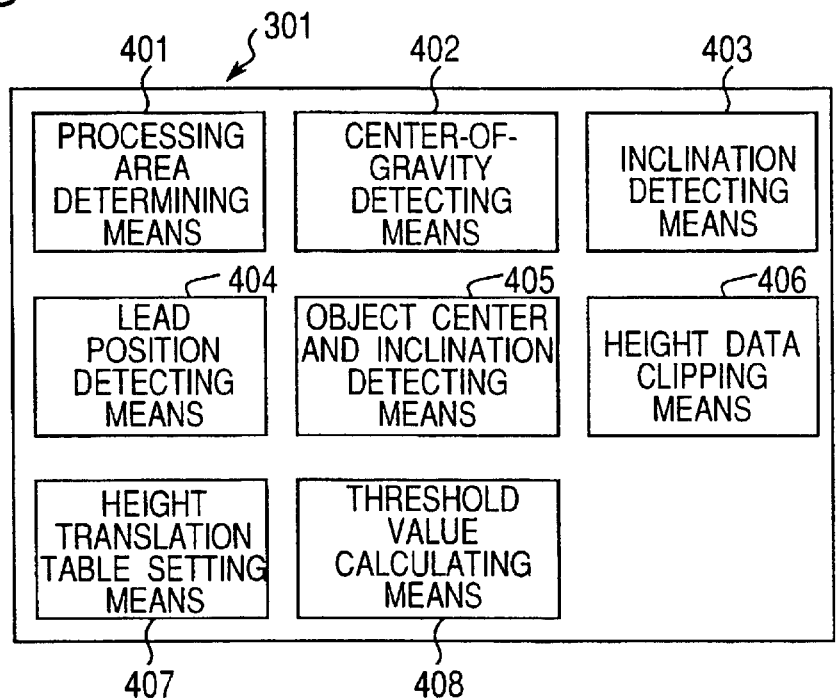
FIG. 15 is a block diagram of functional means of software included in a program memory of the component recognizing apparatus of FIG. 14.

FIG. 15 shows functional means included in the program memory 301 of FIG. 14, comprising a processing area determining means 401, a center-of-gravity detecting means 402, an inclination detecting means 403, a lead position detecting means 404 that functions as one example of a connection portion position detecting means, an object center and inclination detecting means 405 that functions as one example of a connection portion center and inclination detecting means, a height data clipping means 406, a height translation table setting means 407, and a threshold value calculating means 408. These are each constructed of software as examples. The center-of-gravity detecting means 402 and the inclination detecting means 403 serving as one example of center and inclination detecting means.

The processing area determining means 401 executes the operation of Step S6A of FIG. 10 for determining the processing area in the image memory 305 according to the size of the component 2.

The center-of-gravity detecting means 402 executes the center calculation of Step S6C of FIG. 10.

The inclination detecting means 403 executes the inclination calculation of Step S6C of FIG. 10.

The lead position detecting means 404 executes the operation of Step S6D of FIG. 10 for calculating the positions in which the leads 2a exist from the given center and inclination and the component shape information of the object and detecting the center positions of the leads 2a.

The object center and inclination detecting means 405 executes the operation of Step S6E of FIG. 10 for calculating the correct center and inclination of the object from all the lead positions.

The height data clipping means 406 is a means for searching a specified region and calculating a clipping height level. For example, a clipping value is preparatorily obtained by the height data clipping means 406 before detecting the lead 2a inside the small window 501 including the lead 2a shown in FIG. 12A. Then, by removing the noise height by means of this clipping value, the lead position can be correctly detected. In this case, the calculation of the clipping height level is executed for every lead, and therefore, the clipping level has a varied value for each lead. Therefore, the optimum noise height removal in accordance with each lead 2a can be executed.

The height translation table setting means 407 rewrites the height translation table inside the height translating section 304 on the basis of a command from the operator.

The threshold value calculating means 408 forms a luminance histogram on the basis of the luminance representing the height data in each position as described above and thereafter sets a threshold value for separating the connection portions to be subjected to height detection, or, for example, the leads 2a from the noise object in this luminance histogram.

Figure 16:
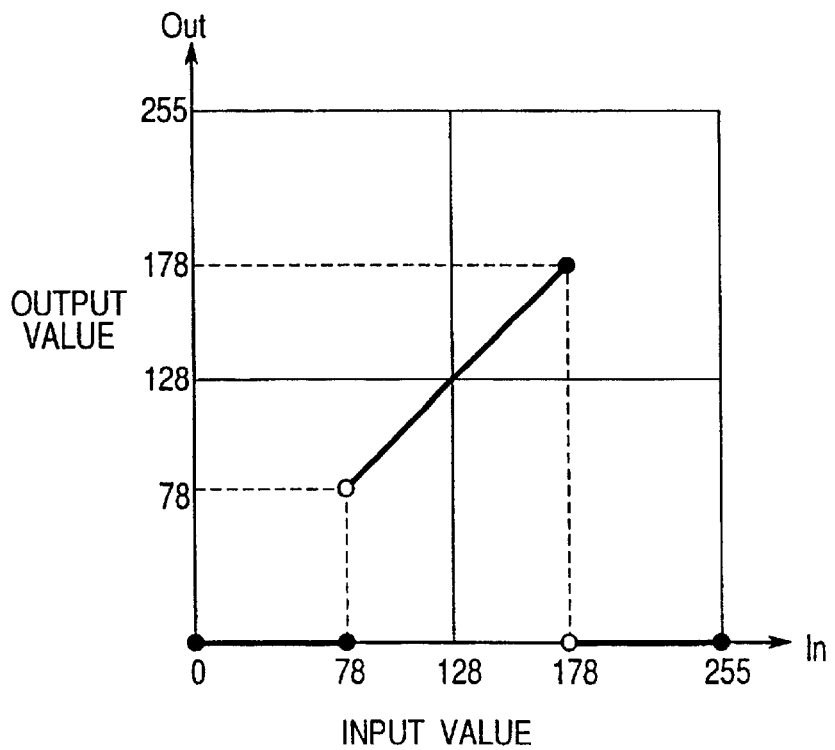
FIG. 16 is a table showing a setting example of a detection range of a height translating section of FIG. 15.

FIG. 16 is a height translation table showing a setting example of the detection range of the height translating section 304 of FIG. 14. In this case, the component shape information stores therein the detection height data relevant to the adjustment of the height detection region. From the viewpoint of the CPU 300 that can rewrite the height translation table on the basis of the information, the height translation table can be regarded as a memory for the CPU 300. The CPU 300 writes the 8-bit data while designating addresses, thereby allowing the height translation table to be set. Therefore, the height translating section 304 can preset the height measurement region capable of detecting the height position of the lead 2a about the height measurement reference plane within the height measurable region. Only the height data that falls within the range of this height measurement region is outputted to the subsequent process, thereby executing the height detection only within the range of the height measurement region. In this case, due to the 8-bit image processing, 256 numeric values ranging from 0 up to 255 can be handled as the height data. According to the first embodiment, the height coordinate axis is taken in the direction from the object toward the 3D sensor with the numeric value of the height measurement reference plane set to 128, for the sake of convenience. Assuming that the resolution in the direction of height is 10 $\mu$m, then the measurable region becomes about ±1.2 mm. FIG. 16 shows the setting of the height translating section 304 that limits the height measurement region to, for example, ±0.5 mm on this condition. That is, in FIG. 16, if a numeric value (digital value) of 78 to 178 is inputted as height data to the height translating section 304, then the value is translated into the same value as the input value, so that the numeric value (digital value) of 78 to 178 is outputted. However, if a numeric value (digital value) that is not smaller than zero and not greater than 78 and a numeric value (digital value) that exceeds 178 and not greater than 255 are inputted as height data to the height translating section 304, then the values are translated so that the value of zero is outputted in each case. Therefore, in executing the adjustment of the height measurement region when the height measurement region that is desired to be subjected to height detection is previously known in Step S3 in FIG. 9, it is proper to change this height translation table. Specifically, for example, when the operator decides that a noise object enters the height measurement region in Step S2 of FIG. 9, it is required to execute an adjustment for narrowing the height measurement region so that the noise object is excluded from the height measurement region in Step S3. For this reason, it is proper that the operator may preparatorily store a command for changing the output value corresponding to the input value of the height translation table inside the height translating section 304 from an operation panel 650 into the component shape information storage section 620 so as to narrow the height measurement region, and the height translation table setting means 407 inside the program memory 301 of FIG. 15 may rewrite the height translation table inside the height translating section 304 on the basis of the above adjustment command inside the component shape information storage section 620 via the main control section 200 and the 2-port memory 306.

Therefore, according to the component recognizing apparatus of the first embodiment, the height measurement region capable of detecting the height positions of the leads 2*a* about the height measurement reference plane within the height measurable region is preset by the height translating section 304, and the height detection is executed only within the range of this height measurement region. With this arrangement, only the heights of the leads 2*a* located within the height measurement region can be detected, while the heights of the projections 2*b* and 2*c* located outside the height measurement region are not detected. Therefore, even though the projections 2*b* and 2*c* that become the noises exist near the leads 2*a*, electrodes and so on existing on the mounting surface of the electronic component 2, the correct recognition can be achieved without erroneously recognizing the projections 2*b* and 2*c* as the leads 2*a*, the electrode or the like. Consequently, the positional information of the connection portions such as the leads 2*a* and electrodes existing on the mounting surface of the electronic component 2 can be correctly obtained. Therefore, by executing the mounting of the electronic component 2 on the basis of the positional information of the connection portions obtained correctly, the electronic component 2 can be mounted more correctly.

The present invention is not limited to the first embodiment and is able to be implemented in a variety of modes. For example, in the first embodiment, the height translating section 304 may be constructed of a circuit of, for example, two types of comparators instead of being implemented by software. In this case, it is acceptable to make one comparator of the two types of comparators invalidate all the height data on the noise object side of the threshold value for separating the noise object from the leads 2*a* and make the other comparator handle all the height data on the lead side below or equal to the threshold value as valid, thereby producing a similar function.

Instead of the first embodiment, according to a second embodiment of the present invention, there is a method for once storing the height data into an image memory, setting the height measurement region through analysis of the height data, and replacing the height data outside the measurement region with a specified value when the measurement region that is desired to be subjected to height detection cannot be predetermined. Specifically, this method is applied, for example, to the case where the first embodiment is not applied because an object that becomes a noise is included in the height measurement region expressed by the 8-bit data and the noise height is not stable. According to a modification of the present invention, instead of the provision of the height translating section 304, the magnification ratio of the lenses 16*a* and 16*b* of the light-receiving system for focusing on the PSDs 17*a* and 17*b* so that no object that becomes a noise enters the measurable range is changed to narrow the height measurement region, thereby focusing only the reflection light from the leads 2*a* thereon and not focusing the reflection light from the projections 2*b* and 2*c* that become noises thereon. In order to flexibly set the height measurement region in conformity to the object, a special adjustment mechanism is needed in this modification.

According to the component recognizing method of the present invention, the height measurement region capable of detecting the height positions of the connection portions about the height measurement reference plane within the height measurable region is preset, and the height detection is executed only within the range of this height measurement region. With this arrangement, only the heights of the connection portions located inside the height measurement region can be detected, and the height of the noise object such as a projection located outside the height measurement region is not detected. Therefore, even though a projection or the like that becomes a noise exists near the connection portions such as the leads and electrodes existing on the mounting surface of the electronic component, correct recognition can be achieved without erroneously recognizing the projection or the like as a connection portion, so that the positional information of the connection portions on the mounting surface of the electronic component can be correctly obtained. Therefore, by executing the mounting of the electronic component on the basis of the positional information of the connection portions obtained correctly, the electronic component can be mounted more correctly.

According to the component recognizing apparatus of the present invention, the height measurement region capable of detecting the height positions of the connection portions about the height measurement reference plane within the height measurable region is preset by the noise removing section, and the height detection of the connection portions is executed only within the range of this height measurement region. With this arrangement, only the heights of the connection portions located inside the height measurement region can be detected, while the height of the noise object such as a projection located outside the height measurement region is not detected. Therefore, even though a noise object or the like exists near the connection portions such as the leads and electrodes existing on the mounting surface of the electronic component, correct recognition can be achieved without erroneously recognizing the noise object or the like as a connection portion, so that the positional information of the connection portions such as the leads and electrodes existing on the mounting surface of the electronic component can be correctly obtained. Therefore, by executing the mounting of the electronic component on the basis of the positional information of the connection portions obtained correctly, the electronic component can be mounted more correctly.

Figure 19:
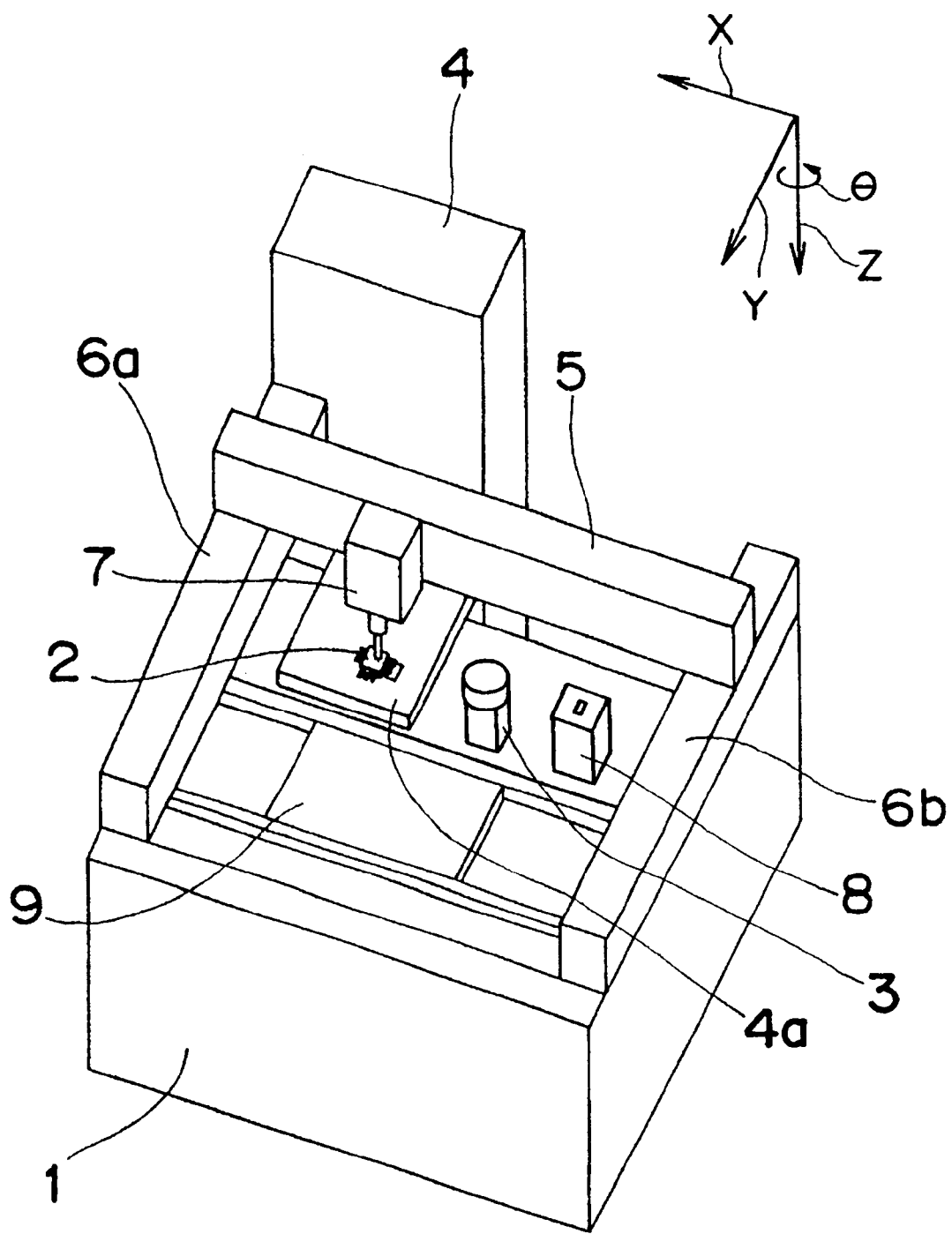
FIG. 19 is a perspective view showing the appearance of a component mounting apparatus to be used for a component recognizing method according to a third embodiment of the present invention.

FIG. 19 shows an electronic component mounting apparatus to be used for a component recognizing method and the component mounting method of a third embodiment of the present invention.

Figure 25:
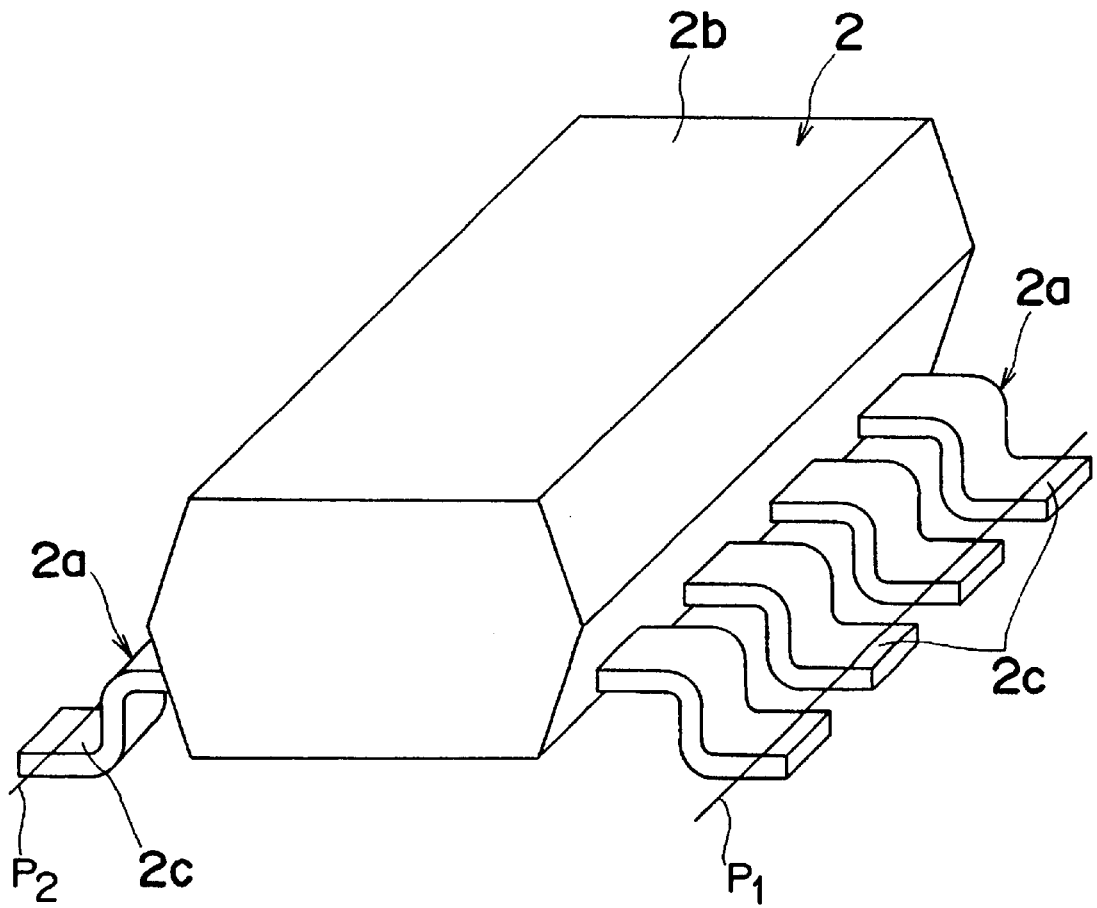
FIG. 25 is a perspective view showing an example of the electronic component.

FIG. 19 shows a mounting apparatus main body 1 of an electronic component mounting apparatus, an electronic component 2 (occasionally abbreviated to a component hereinafter) to be mounted by the present mounting apparatus as shown in FIG. 25, a tray 4*a* on which the components 2 are placed, a tray supply section 4 that serves as a component supply section for automatically supplying the component 2 placed on the tray 4*a*, a head section 7 having a nozzle that sucks the component 2 in the mounting stage, a robot 5 on the X-axis side (abbreviated to an X-axis robot hereinafter) that moves the head section 7 in the X-axis direction and constitutes part of an X-Y robot, robots 6*a* and 6*b* on the Y-axis side (abbreviated to Y-axis robots hereinafter) that move the head section 7 in the Y-axis direction together with the X-axis robot 5 and constitute part of the X-Y robot, a luminance image sensor (one example of luminance image capturing means) 3, a height image sensor (one example of height image capturing means) 8 which corresponds to the above three-dimensional (3D) sensor 8 or height detection sensor 8, and a printed board 9 on which the component 2 is to be mounted. The luminance image sensor 3 and the height image sensor 8 are provided below the transport path through which the head section 7 (nozzle 7a) passes to transport the component 2 from the tray 4a to the printed board 9.

Figure 21:
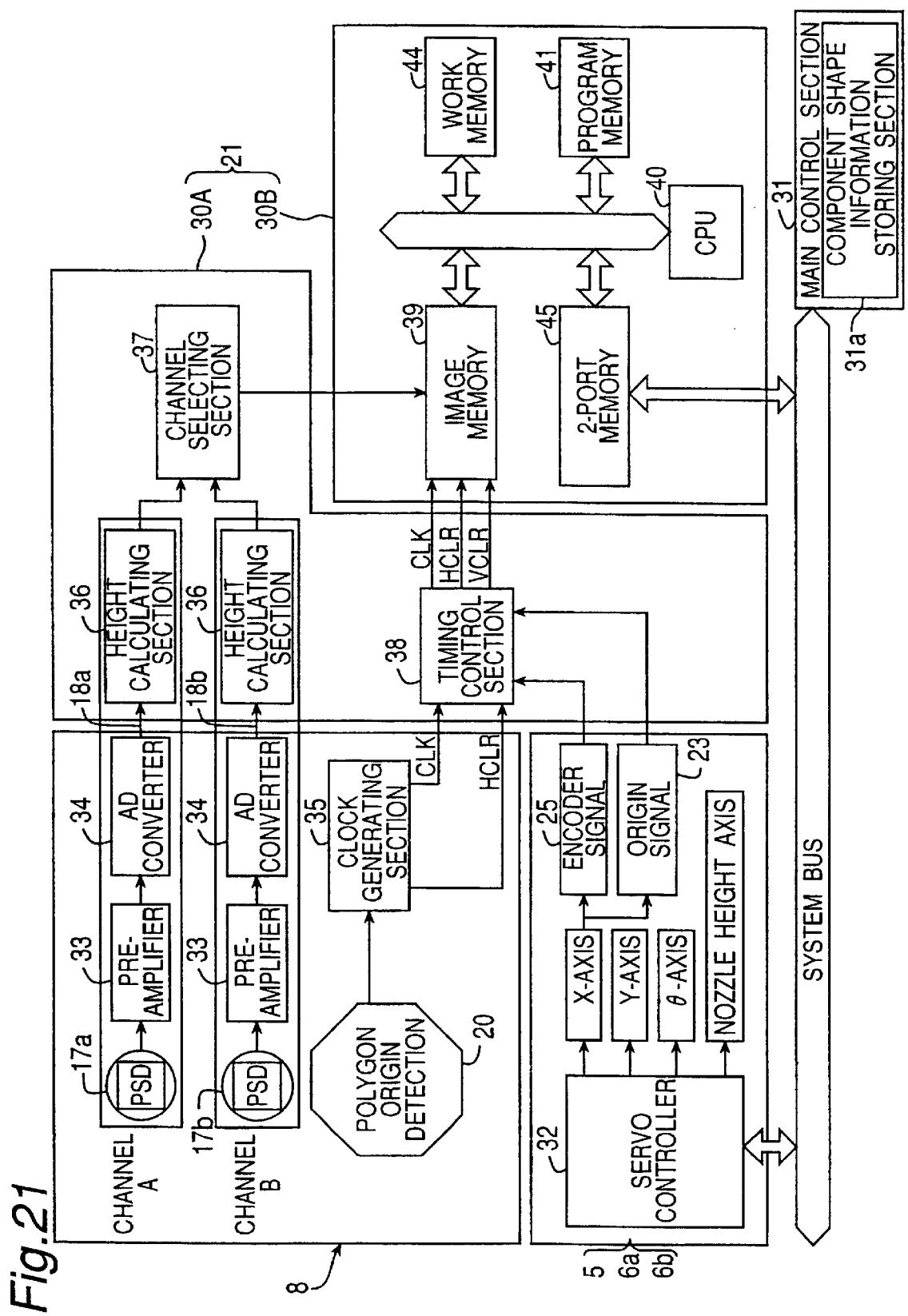
FIG. 21 is a block diagram showing the construction of a height image capturing means of the third embodiment.

FIG. 21 is a block diagram showing an image processing system for the height image sensor 8.

The image processing control section 21 is constructed of two separate blocks of a height image interface 30A and an image processing section 30B.

Figure 22:
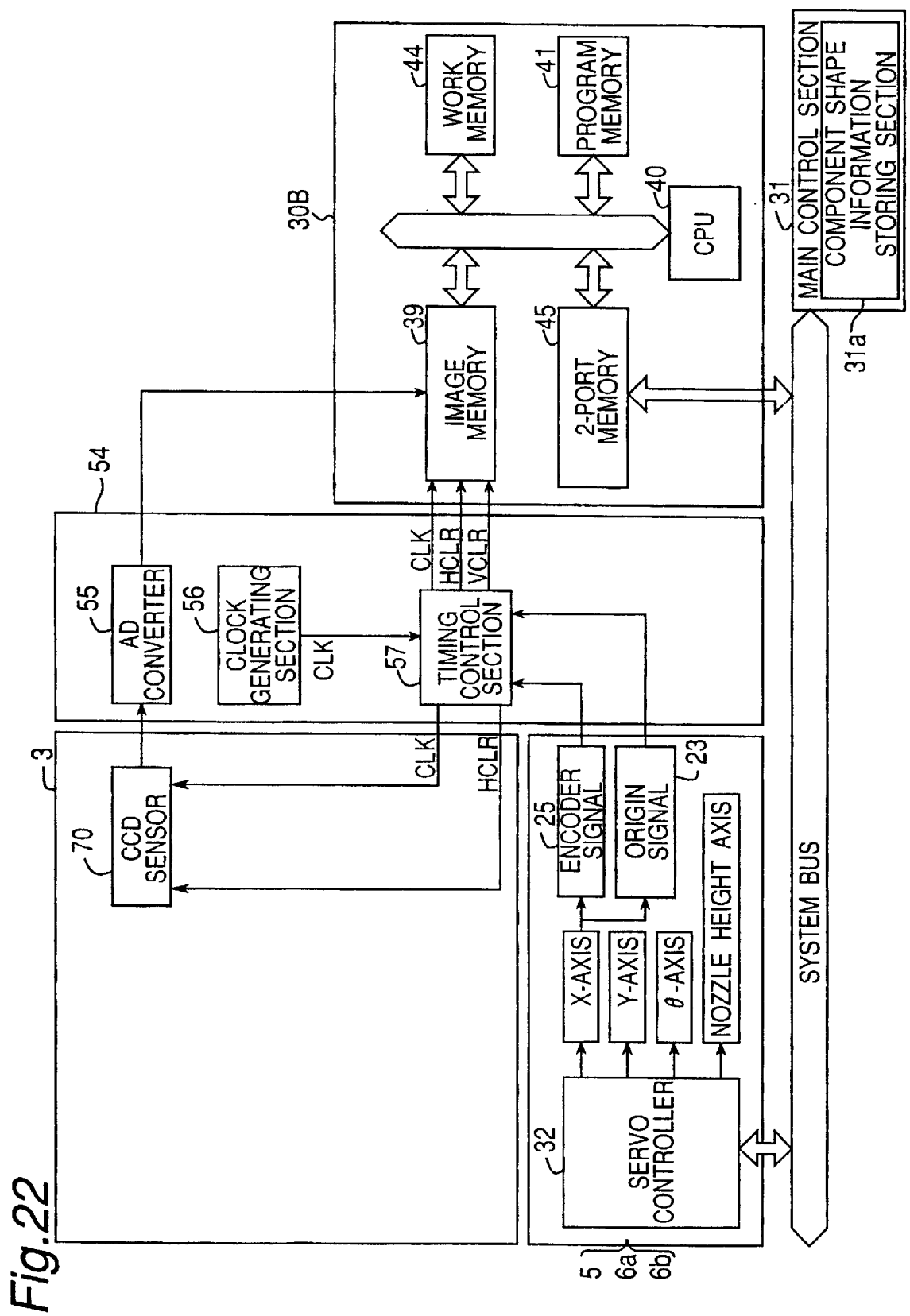
FIG. 22 is a block diagram showing the construction of a luminance image capturing means of the third embodiment.

The reason why the image processing control section 21 is separated into two blocks is that the image processing section 30B is required to be shared with the luminance image sensor 3 shown in FIG. 22, and therefore, the control section 21 is separated into two units of the section (image processing section) 30B that can be shared by the two sensors and the section (height image interface) 30A that cannot be shared.

A main control section 31 controls the whole system of the electronic component mounting apparatus shown in FIG. 19. For example, the main control section 31 controls the position of the head section 7 of the electronic component mounting apparatus via, for example, a servo controller 32 and executes the suction of the electronic component 2, transport of the electronic component 2, and mounting of the electronic component 2 on the printed board 9. The component shape information of the electronic component 2 (body height, body width, body depth, the number of leads 2a, the pitch of the leads 2a, and so on) stored in a component shape information storage section 31a of the main control section 31 is transmitted via a 2-port memory 45 to a work memory 44 of the image processing section 30B, and three-dimensional positional detection of the electronic component 2 is executed. The results are received from the image processing section 30B via the 2-port memory 45 and used for the correcting calculation of the position (X, Y, θ) in mounting the electronic component 2 on the printed board 9.

In the X-axis robot 5 and the Y-axis robots 6a and 6b, the servo controller 32 executes positional control of the X-axis, Y-axis, θ-axis, and nozzle elevation axis. In particular, an encoder signal 25 of the motor of the X-axis robot 5, which carries the information of the position of the head section 7 on the X-axis and an origin signal 23 from the X-axis, which carries the information of the fact that the head section 7 has come into a height image input start position are outputted to the height image interface 30A so as to inform the height image interface 30A of the information and used for measuring the start timing of capturing the height image.

In the height image sensor 8, the light-receiving system for measuring the laser beam reflected on the electronic component 2 that is the object includes two systems (a channel A and a channel B) taking a variation in laser beam reflection into consideration, thereby ensuring the reliability. The light-receiving systems amplify feeble signals detected by PSDs 17a and 17b by means of preamplifiers 33, convert the signals into 12-bit digital data (in order to ensure height calculation accuracy, the conversion into the 12-bit digital data is effected in this case) by means of A-D converters 34, and output the signals 18a and 18b to the height image interface 30A. The polygon mirror 12 is consistently rotating and inputs a polygon surface origin signal 20 to a clock generating section 35 by means of the mechanism shown in FIG. 3. The clock generating section 35 generates a reference clock (CLK) required for writing the height data into a memory, generates a horizontal synchronization signal (HCLR) required for taking in the height data on the basis of the polygon surface origin signal, and inputs the signals into the height image interface section 30A.

In the height image interface 30A, the 12-bit data of the two systems inputted from the height image sensor 8 are converted into 8-bit height data in a height calculating section 36. A channel selecting section 37 compares the height image data of the two systems (channel A and channel B) with each other in real time and selects the height data that seems to have the higher certainty in accordance with each timing. For example, if a division by zero occurs in the height calculating stage of the channel A, the numeric value of 255 representing the abnormality is given to the height data of the channel A. Therefore, in such a case, the value of the channel B is selected. If both the channels exhibit the abnormal values of 255, then the numeric value of 255 is outputted as the height data. If the height data of both the channels have normal values, the arithmetic mean value of the height data of both the channels is outputted. A timing control section 38 outputs to the image processing section 30B a clock (CLK), a horizontal synchronization signal (HCLR), a vertical synchronization signal (VCLR), which represent the timing for storing the height data into an image memory 39 of the image processing section 30B. The vertical synchronization signal (VCLR) is generated by receiving the origin signal 23 from the X-axis robot 5 and thereafter counting a predetermined head movement distance by the encoder signal 25.

In the image processing section 30B, the height data outputted from the channel selecting section 37 is stored into the image memory 39. The height data stored in the image memory 39 is subjected to image processing by a CPU 40 that operates according to a program, thereby executing the three-dimensional positional detection of the electronic component 2 that is the object to be recognized. The program is stored in a program memory 41. The shape information (external height, external width, external depth, the number of leads 2a, the pitch of the leads 2a, and so on) representing the geometrical features of the electronic component 2 are stored in the component shape information storage section 31a of the main control section 31. The shape information is previously transmitted from the main control section 31 to the work memory 44 via the 2-port memory 45 prior to the input of the height image. The positional detection of the electronic component 2 that is the object to be recognized is executed on the basis of the shape information.

Figure 26:
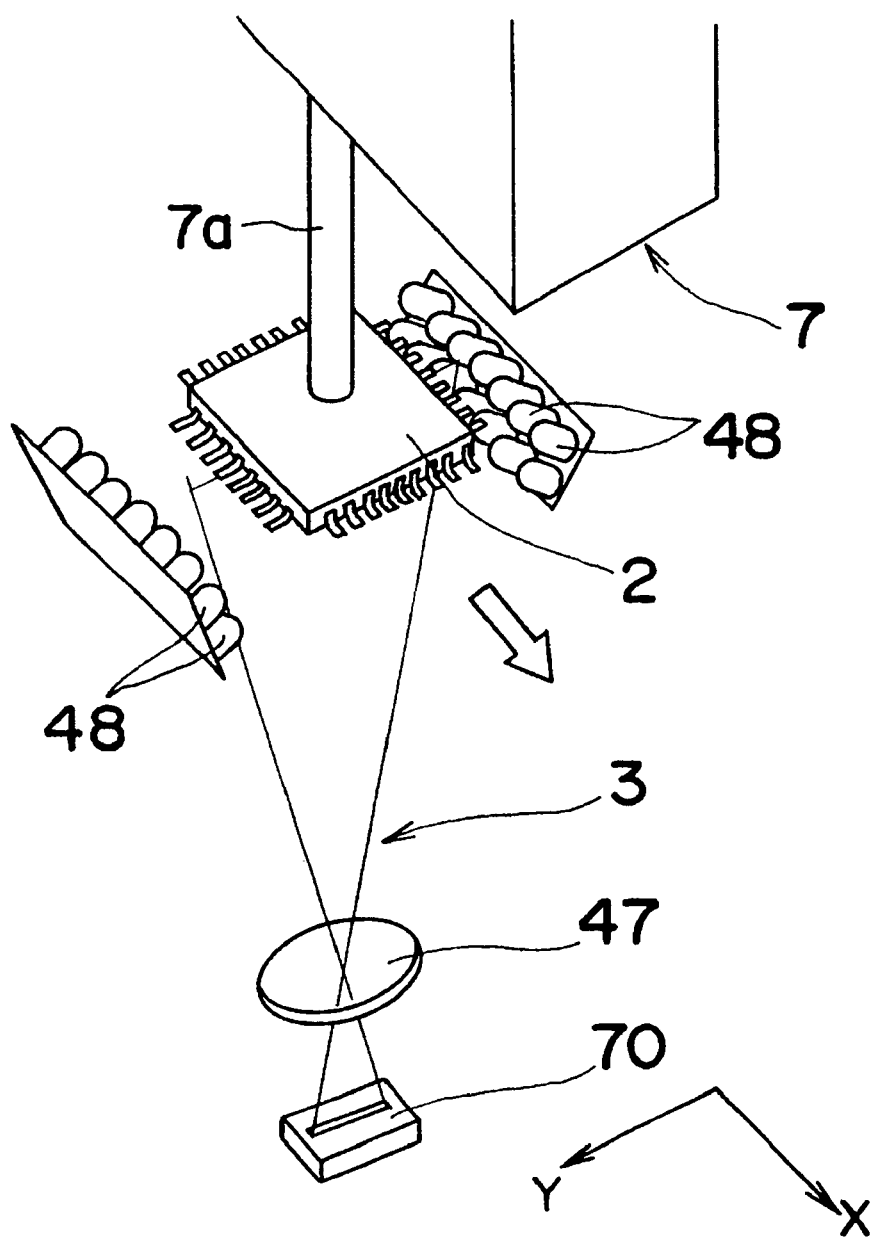
FIG. 26 is an explanatory view showing an image capturing state of the luminance image capturing means according to the third embodiment of the present invention.

FIG. 26 shows a state in which an image of the bottom surface of the component 2 is captured (image-picked) by the luminance image sensor 3, and the luminance image sensor 3 is provided by a CCD array 70 arranged along the Y-axis direction.

This luminance image sensor 3 captures an image of the entire bottom surface of the component 2 while moving the component 2 in the X-axis direction by means of the head section 7. In FIG. 26 are shown an image-forming lens 47 and an illumination system 48 arranged near both sides of the component 2.

FIG. 22 is a block diagram showing an image processing system of the luminance image sensor 3.

The main control section 31, servo controller 32, X-axis robot 5, Y-axis robots 6a and 6b, and image processing section 30B have constructions similar to those used for the aforementioned height image sensor 8, and therefore, they are denoted by the same reference numerals and no description is provided for them.

The image signal received by the CCD array 70 of the luminance image sensor 3 is outputted to a luminance image interface 54. The luminance image sensor 3 operates on the clock (CLK) transmitted from the luminance image interface 54, and the image scanning timing is synchronized with the horizontal synchronization signal (HCLR).

The image signal inputted to the luminance image interface 54 is converted into 8-bit digital luminance data by an A-D converter 55 and then, the converted data is outputted to the image processing section 30B. The clock generating section 56 generates a reference clock (CLK) required for writing the aforementioned data into a memory and outputs the clock to a timing control section 57. The timing control section 57 outputs to the image processing section 30B the clock (CLK) and the horizontal synchronization signal (HCLR), the clock being the timing signal for storing the aforementioned data into the image memory 39 of the image processing section 30B. The horizontal synchronization signal (HCLR) is generated every time the head section 7 that is sucking the electronic component 2 moves by a distance of one line of the luminance image sensor 3 according to the amount of movement in the X-axis direction of the head section 7, the amount being informed by the encoder signal 25 from the encoder 24a, thereby preventing the occurrence of an error in the captured image. The vertical synchronization signal (VCLR) transmitted from the timing control section 57 to the image memory 39 is generated by receiving the origin signal 23 from the X-axis robot 5 and thereafter counting a predetermined head movement distance by the encoder signal 25.

To the image processing section 30B is inputted luminance data from the luminance image interface 54. The luminance data is controlled by the clock (CLK), the horizontal synchronization signal (HCLR), and the vertical synchronization signal (VCLR) and stored into the image memory 39. The luminance data stored in the image memory 39 is subjected to image-processing by the CPU 40 that operates according to the program so as to undergo positional detection of the electronic component 2 that is the object to be recognized. The program is stored in the program memory 41. The shape information (external height, external width, external depth, the number of leads 2a, the diameter of the lead 2a, the pitch of the leads 2a, and so on) that represent the geometrical features of the electronic component 2 and are stored in the component shape information storage section 31a of the main control section 31 are previously transmitted to the work memory 44 via the 2-port memory 45 prior to the luminance image input. The positional detection of the electronic component 2 that is the object to be recognized is executed on the basis of the shape information.

Figure 27:
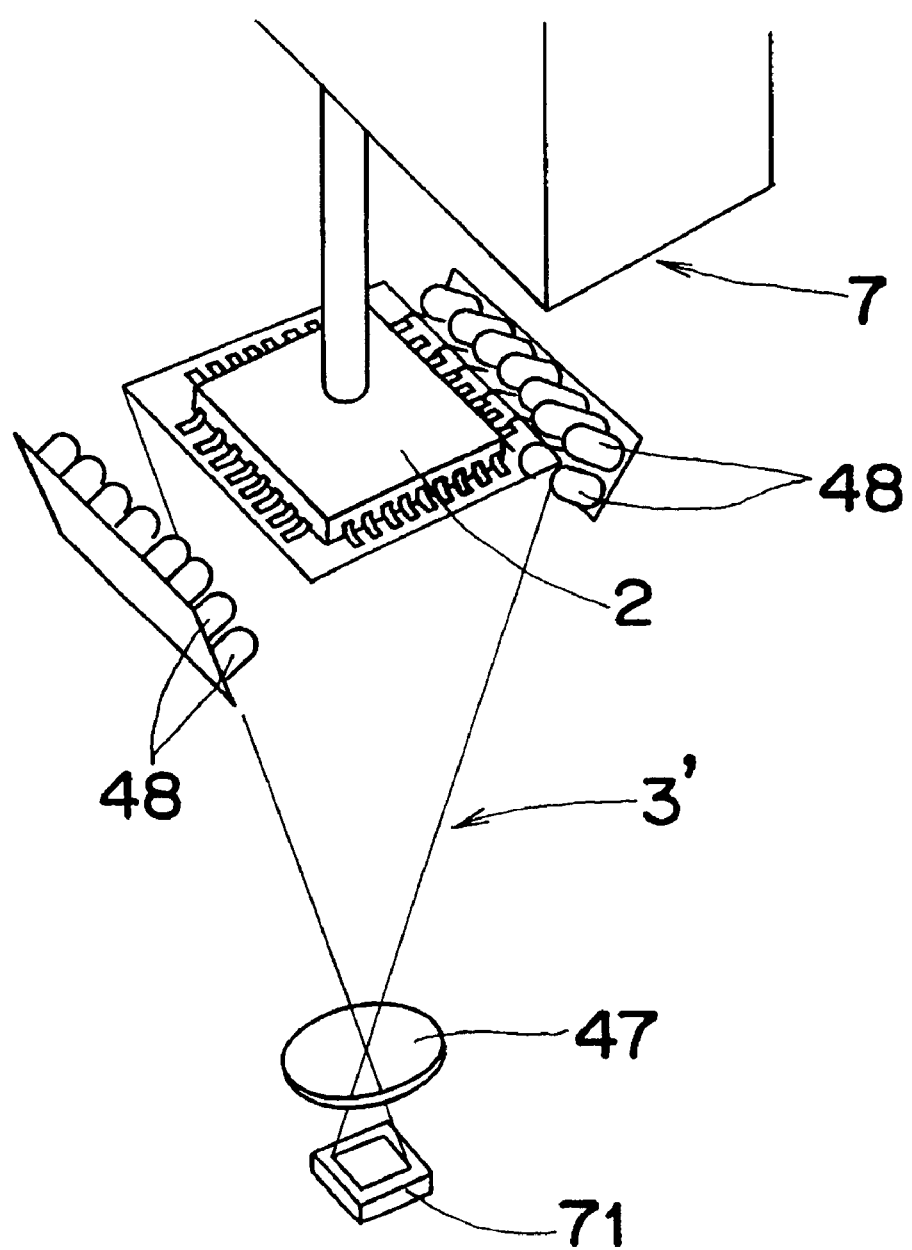
FIG. 27 is an explanatory view showing an image capturing state of another example of the luminance image capturing means.

The luminance image sensor is not limited to the aforementioned CCD array 70, and a one provided with, for example, a two-dimensional CCD 71 as shown in FIG. 27 may be used.

A luminance image sensor 3' provided with this two-dimensional CCD 71 captures the image of the entire bottom surface of the component 2, when the image of the component 2, which is illuminated by the illumination systems 48 from both sides while being stopped as sucked by the head section 7, is captured on the two-dimensional CCD 71 via the image-forming lens 47.

Figure 23A:
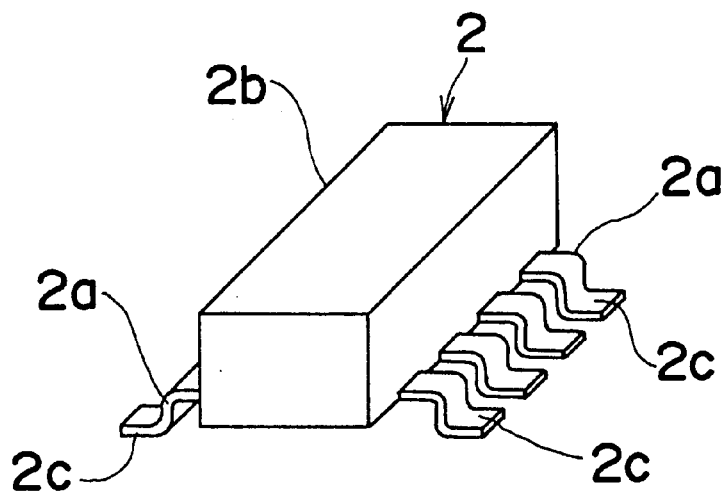
FIG. 23A is a perspective view of an electronic component of the third embodiment.
Figure 23B:
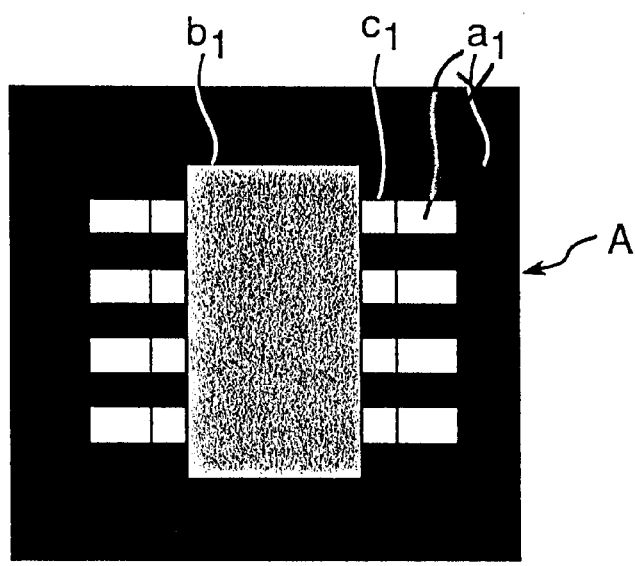
FIG. 23B is an explanatory view showing a luminance image of the electronic component.
Figure 24A:
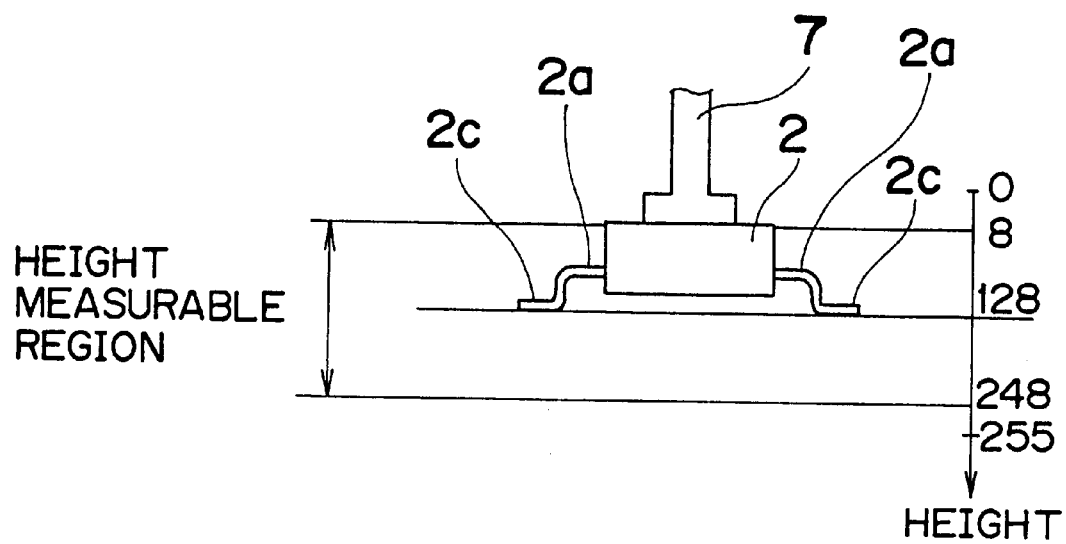
FIG. 24A is an explanatory view showing a height image coordinate system of the electronic component of the third embodiment.
Figure 24B:
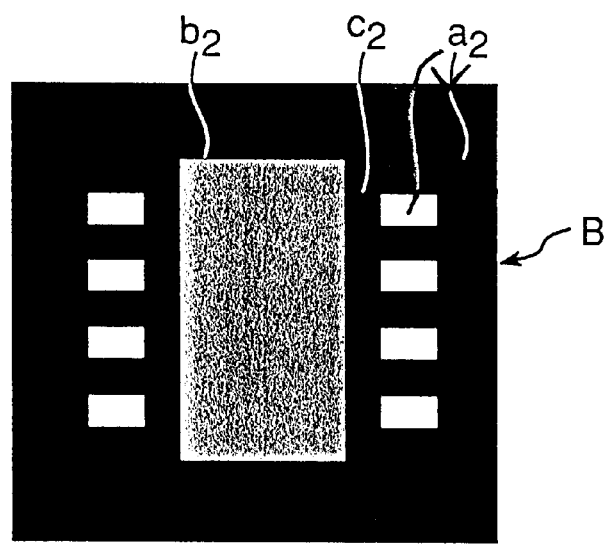
FIG. 24B is an explanatory view showing a height image of the electronic component.

FIG. 23A through FIG. 24B explain the coordinate system of the height image sensor 8, and in particular, FIG. 23B and FIG. 24B show the images captured by the sensors 3 and 8, respectively. The reason why the image captured by the luminance image sensor 3 or the height image sensor 8 can be subjected to positional detection by the identical image processing section (one example of image processing means) 30B is that the height coordinate is set with the direction from the component 2 that is the object toward the height image sensor 8 positive. The surface-mounting component surely has the mounting surface, and by setting the height coordinate axis in the direction from the component 2 that is the object toward the height image sensor 8, the mounting surface can be positioned in the highest position. The mounting surface of the surface mounting component is normally made of a metal, and if such a component is imaged by the luminance image sensor 3, then the luminance of the mounting surface becomes the highest.

With this arrangement, the images A or B captured by the luminance image sensor 3 or the height image sensor 8 can be subjected to positional detection by the identical image processing means (image processing section) 30B.

FIG. 23B shows the image A of the electronic component 2 of FIG. 23A captured by the luminance image sensor 3. In this image A, the whitest portions (having high luminance) a1 and c1 show the tips 2c and the root portions of the leads 2a of the component 2, while the gray portion (having low luminance) b1 shows the main body 2b of the component 2.

FIG. 24B shows the image B captured by the height image sensor 8, and the whitest portion (having a great height) a2 in this image B shows the tips 2c of the leads 2a of the component 2, while the gray portion (having a medium height) b2 shows the main body 2b of the component 2. The root portions of the leads 2a, which do not exist within the range of detection of the height image sensor 8, are not viewed as height image as indicated by c2 in FIG. 24B.

FIG. 24A shows the height measurement region. This is the 8-bit image region, and therefore, 256 numeric values ranging from 0 up to 255 can be handled as height image data. In the present embodiment, the height coordinate axis is set in the direction from the electronic component 2 that is the object toward the height image sensor, the reference plane of height measurement is represented by 128, and its range is set to 8 to 248, for the sake of convenience. The values of 0 and 255 are used for expressing the error that "height data is not correctly obtained" or the like.

Assuming that the resolution in the direction of height is 10 $\mu$m, then the measurable region becomes about ±1.2 mm.

Figure 20:
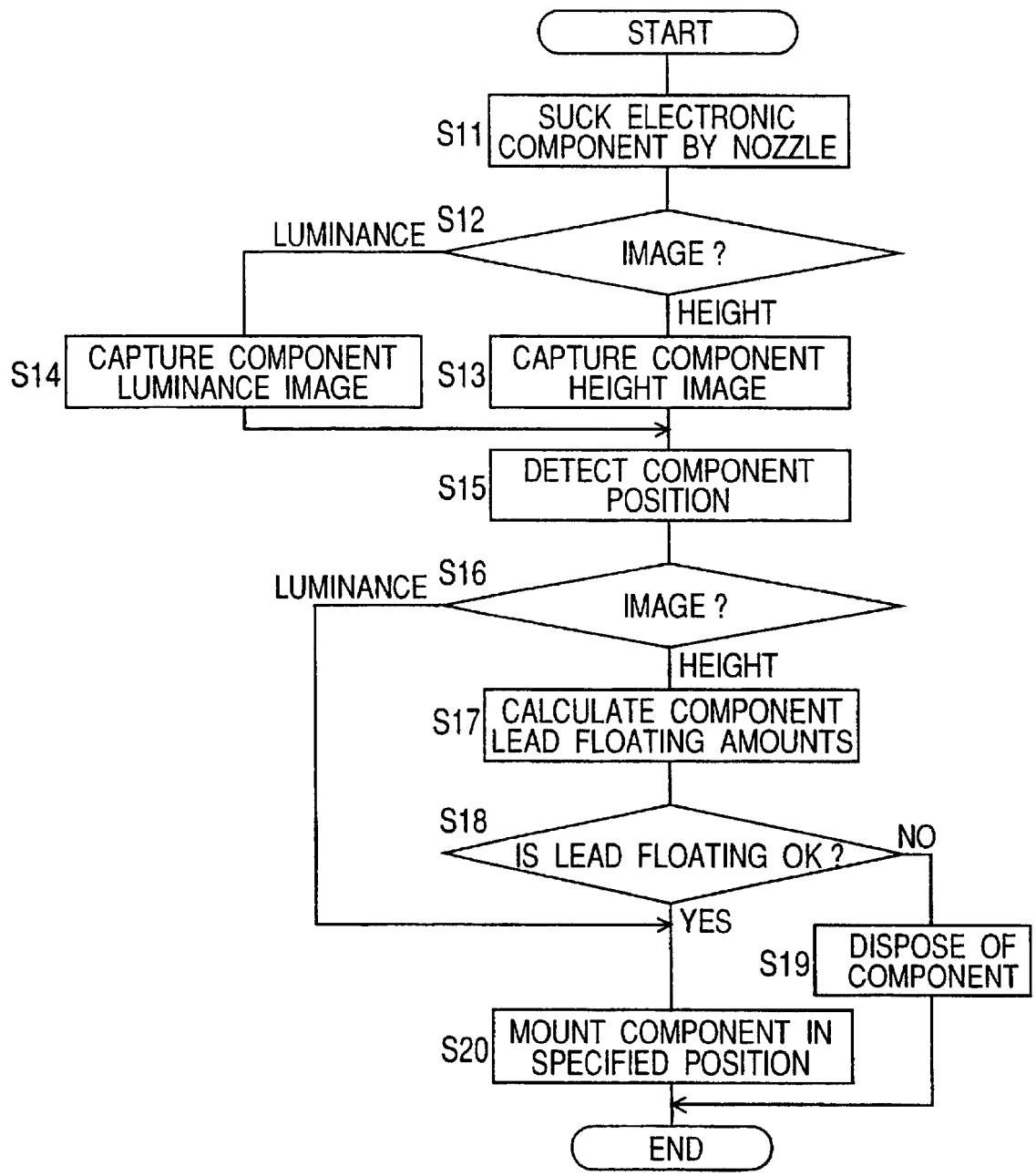
FIG. 20 is a flow chart showing an operating procedure of the component recognizing method and a component mounting method of the third embodiment.

The electronic component recognizing method and mounting method will be described next sequentially from Steps S11 to S20 according to the flowchart shown in FIG. 20.

S11: The electronic component 2 of the component supply section 4 is sucked by the head section 7.

S12: A decision is made either to execute the lead floating inspection of the electronic component 2, i.e., the image-capturing by the height image sensor 8 or to execute the other operation, i.e., the e-capturing by the luminance image sensor 3.

If the operator of the equipment presets the information for making this decision in the component shape information storage section 31a carrying the geometrical information of the component 2, then the equipment can be automatically operated. The program flow proceeds to Step S13 when executing the lead floating inspection or proceeds to Step S14 when not executing the inspection.

S13: The nozzle 7a that is sucked the electronic component 2 moves above the height image sensor 8, and the height image sensor 8 captures the height image of the electronic component 2, or the three-dimensional position data. Subsequently, the program flow proceeds to Step S15.

S14: The nozzle 7a that is attracting, by suction, the electronic component 2 moves above the luminance image sensor 3, and the luminance image sensor 3 captures the luminance image of the electronic component 2, or the two-dimensional position data. Subsequently, the program flow proceeds to Step S15.

S15: The luminance image or the height image is processed by the common image processing section (one example of image processing means) 30B, thereby detecting the two-dimensional position information of the electronic component, or X, Y, and θ of the electronic component 2.

S16: It is decided whether the image is the height image or the luminance image. The program flow proceeds to Step S17 in the case of the height image or jumps to Step S20 in the case of the luminance image.

S17: The height image is processed by the image processing section 30B, thereby calculating the positions of three leads to be brought into contact with the board when the electronic component 2 is mounted on a theoretical imaginary surface and expressing the imaginary surface by a numerical expression. Then, the distances of all the lead positions (X, Y, Z) from the imaginary surface, i.e., the lead floating amounts are calculated. Subsequently, the program flow proceeds to Step S18.

S18: It is decided whether each lead floating amount is exceeding the predetermined reference value. The program flow proceeds to Step S19 when it is decided that the lead floating amount in at least one detection point is exceeding the reference value or otherwise proceeds to Step S20.

S19: If the lead floating amount is exceeding the predetermined reference value, then the component is disposed of as an abnormal component, and the processing is completed. That is, the nozzle of the head section 7 transports the electronic component 2 to a disposal site and disposes of the electronic component 2 there, and the processing ends.

S20: When the component is determined as the one to be subjected to luminance image processing (one that requires no lead floating amount detection) in Step S16 or when the component is determined as the normal component whose lead floating amount is not exceeding the reference value in Step S18, the nozzle of the head section 7 transports the electronic component 2 onto the board 9 and mounts the electronic component 2 in the specified position on the board 9, and the processing ends.

As described above, according to the third embodiment, the electronic component 2 that only requires the two-dimensional positional detection is subjected to the two-dimensional positional detection by means of the luminance image sensor 3, and the electronic component 2 is mounted on the board 9 through the execution of the positional correction of X, Y, and 0 on the basis of the information.

On the other hand, for the electronic component 2 that requires the three-dimensional positional detection such as the electronic component 2 that requires the lead floating inspection, the three-dimensional positional detection is executed by means of the height image sensor 8 on the entire surface of the component 2 viewed from a specified direction, so that not only the positional information of X, Y, and θ but also the height information of the floating of the lead tips 2c can be obtained. The electronic component 2 having a floating lead tip 2c or the like are disposed of as the abnormal component, and only the normal component is mounted on the board 9 through the execution of the positional correction of X, Y, and θ.

The reason why the two types of image sensors 3 and 8 are selectively used in different ways as above is that a significant difference exists in the processing speed.

That is, the head movement velocity in the case of the luminance image sensor 3 is, for example, 400 mm/sec, and a time required for the image input is 150 msec in the case of an electronic component 2 of a 60-mm square. On the other hand, the head movement velocity in the case of the height image sensor 8 is, for example, 80 mm/sec, and a time required for the image input is 750 msec in the case of the electronic component 2 of a 60-mm square.

As described above, by using only the luminance image sensor 3 for the electronic component 2 that requires neither the lead floating amount detection nor the like, the image input time can be reduced, thereby allowing the productivity to be improved.

When only the height image sensor 8 is used, the image input time increases as compared with the luminance image sensor 3 (note that a reduction in time is achieved as compared with the prior art example), however, the lead floating inspection and so on can be achieved, thereby allowing component mounting to be executed with high reliability.

The luminance image sensor 3 and the height image sensor 8 can be independently selectively used in different ways according to the shape feature of the electronic component 2. For example, it is proper to use the luminance image sensor 3 for the normal lead-less electronic component to which the two-dimensional positional detection of X, Y, and θ is adequate, and it is proper to execute the three-dimensional positional detection by means of the height image sensor 8 for the electronic components with leads, the electronic components of BGA (Ball Grid Array) having a number of bump electrodes on the bottom surface, and the like.

The luminance image sensor 3 and the height image sensor 8 can be used independently selectively in different ways according to the inspection items to be executed on the electronic component 2. For example, in the case where the lead floating inspection of the electronic component 2, shape defect inspection of the bump electrodes of the electronic component of the BGA type and the like are required, it is proper to use the height image sensor 8 for the execution of the three-dimensional positional detection of the electronic component 2.

By setting the height coordinate system of the height image so that the direction from the electronic component 2 toward the height image sensor 8 becomes positive, the height image data taken in by the height image sensor 8 and the luminance image data obtained from the luminance image sensor 3 can be processed by the identical image processing section 30B. This arrangement allows the controller to be commonly used and allows the image processing to be executed by a common program.

According to the present invention, the luminance image capturing means and the height image capturing means can be selectively used in different ways in accordance with the shape features and inspection items of electronic components, thereby allowing the positional detection of the electronic component to be rationally executed. The recognition and mounting of electronic components that require the three-dimensional positional detection for the detection of the lead floating and the like can be executed by the height image capturing means with much higher speed and higher reliability than in the prior art example.

According to the present invention, the two-dimensional positional detection is executed by means of the luminance image capturing means for the electronic component to which only the two-dimensional positional detection is adequate. In the case where positional correction similar to that of the prior art example is required on the basis of the information, the electronic component can be mounted on the board through the execution of the positional correction of X, Y, and θ.

On the other hand, for the electronic component that requires three-dimensional positional detection as the electronic component that requires lead floating inspection, the three-dimensional positional detection is executed by means of the height image capturing means on the entire surface of the electronic component viewed from the specified direction, so that not only the positional information of X, Y, and θ but also the height information of the floating of the lead tips can be obtained. The electronic components having a floating lead tip and the like can be disposed of as abnormal components, and only the normal component can be mounted on the board through the execution of the positional correction of X, Y, and θ when positional correction is required.

According to the present invention, the electronic component that requires lead floating inspection and the like can be subjected to the height measurement for the lead floating inspection and the like, and the positional detection required for the correction of X, Y, and θ can be simultaneously executed, as described above. Therefore, the recognition and mounting of the electronic component that requires the three-dimensional positional detection can be executed with higher speed than in the prior art example that requires the two recognition processes by means of the CCD camera and the height sensor.

Furthermore, the three-dimensional positional detection is executed on the entire surface of the electronic component, and therefore, the lead floating inspection and the like can be executed with higher accuracy than in the prior art example in which the height detection is executed on a specified line.

If the height image data taken in by the height image capturing means and the luminance image data obtained from the luminance image capturing means are processed by the identical image processing means by setting the height coordinate system of the height image so that the direction from the electronic component toward the height image capturing means becomes positive, then the image processing control section can be commonly used and the image processing can be executed by the common program.

A fourth embodiment of the present invention will be specifically described below with reference to the drawings.

FIG. 1 shows an electronic component mounting apparatus to be used for a component recognizing method and the component inspecting method of the fourth embodiment of the present invention. Although FIG. 1 shows the first embodiment, the constructions shown in FIG. 1 are the same as this fourth embodiment and thus, FIG. 1 is used here for explaining the fourth embodiment.

Figure 40:
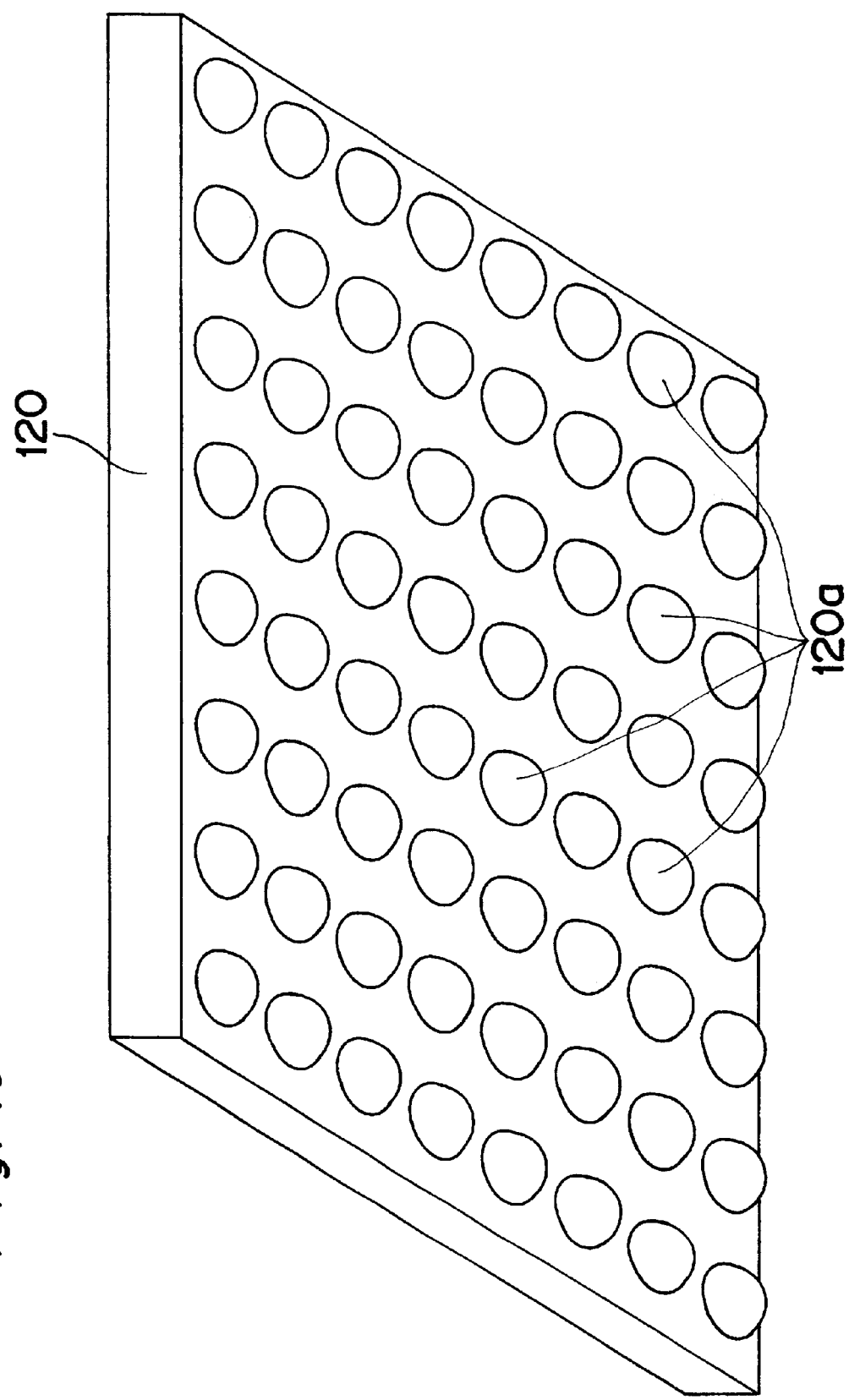
FIG. 40 is a perspective view of an electronic component having a plurality of hemispherical bump electrodes.
Figure 41:
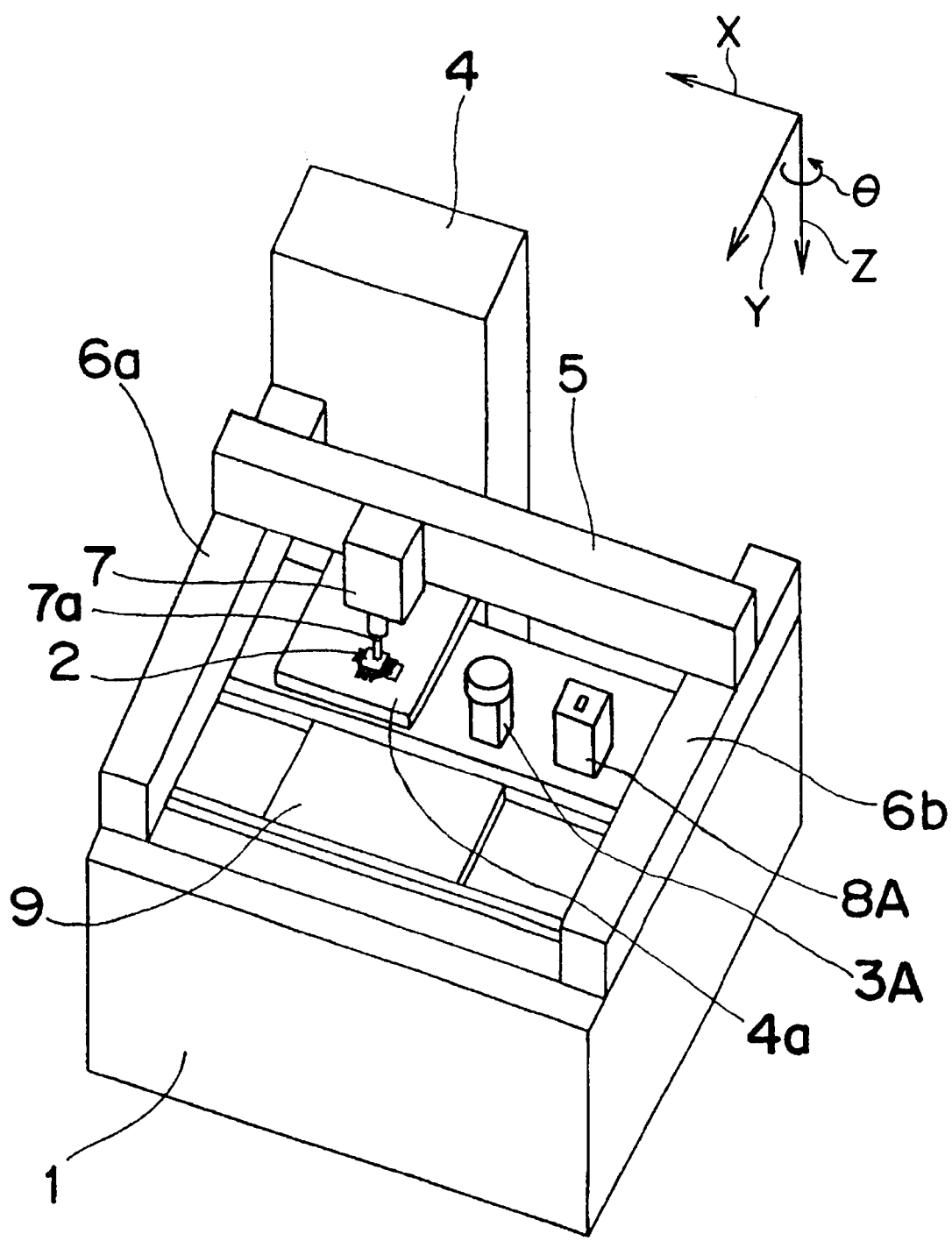
FIG. 41 is a perspective view of an electronic component mounting apparatus to be used for the prior art component recognizing method.
Figure 42:
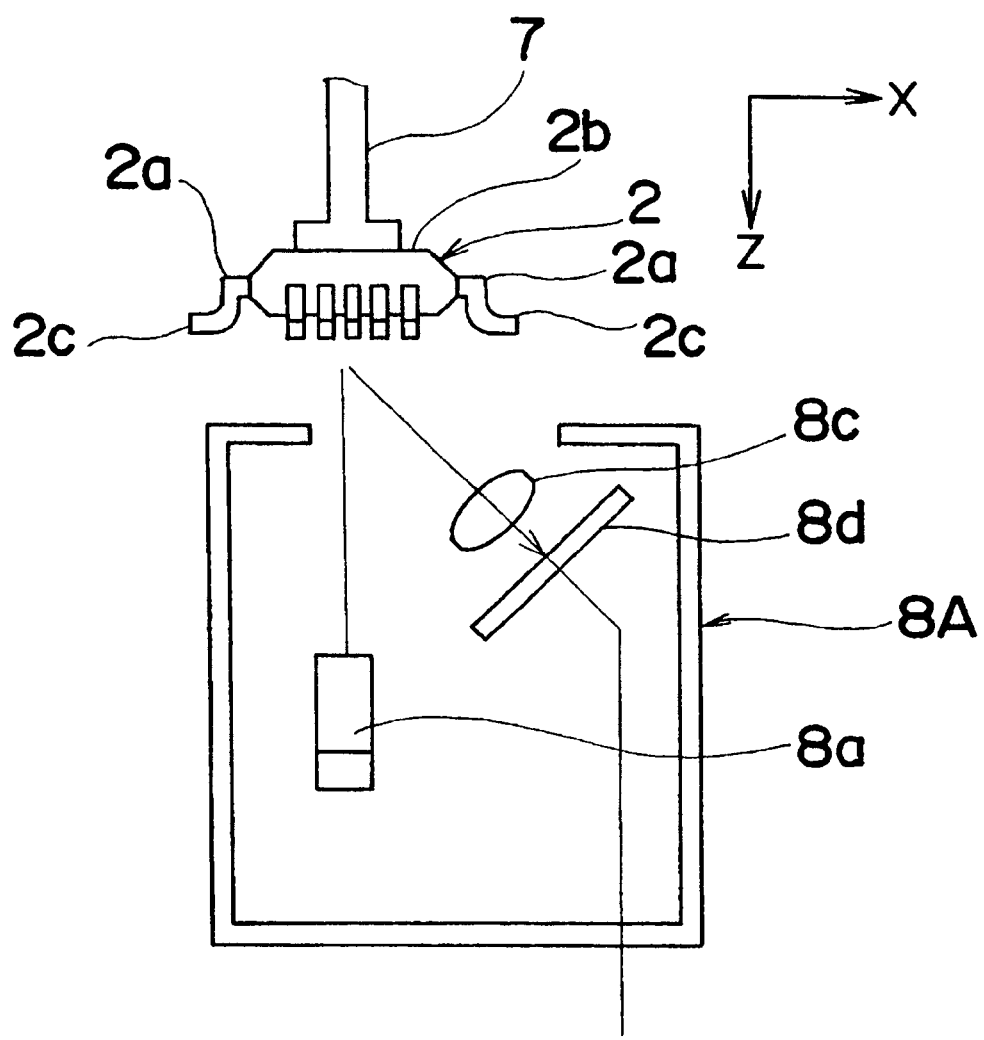
FIG. 42 is a sectional view of a height sensor mounted on the electronic component mounting apparatus to be used for the prior art component recognizing method.
Figure 43:
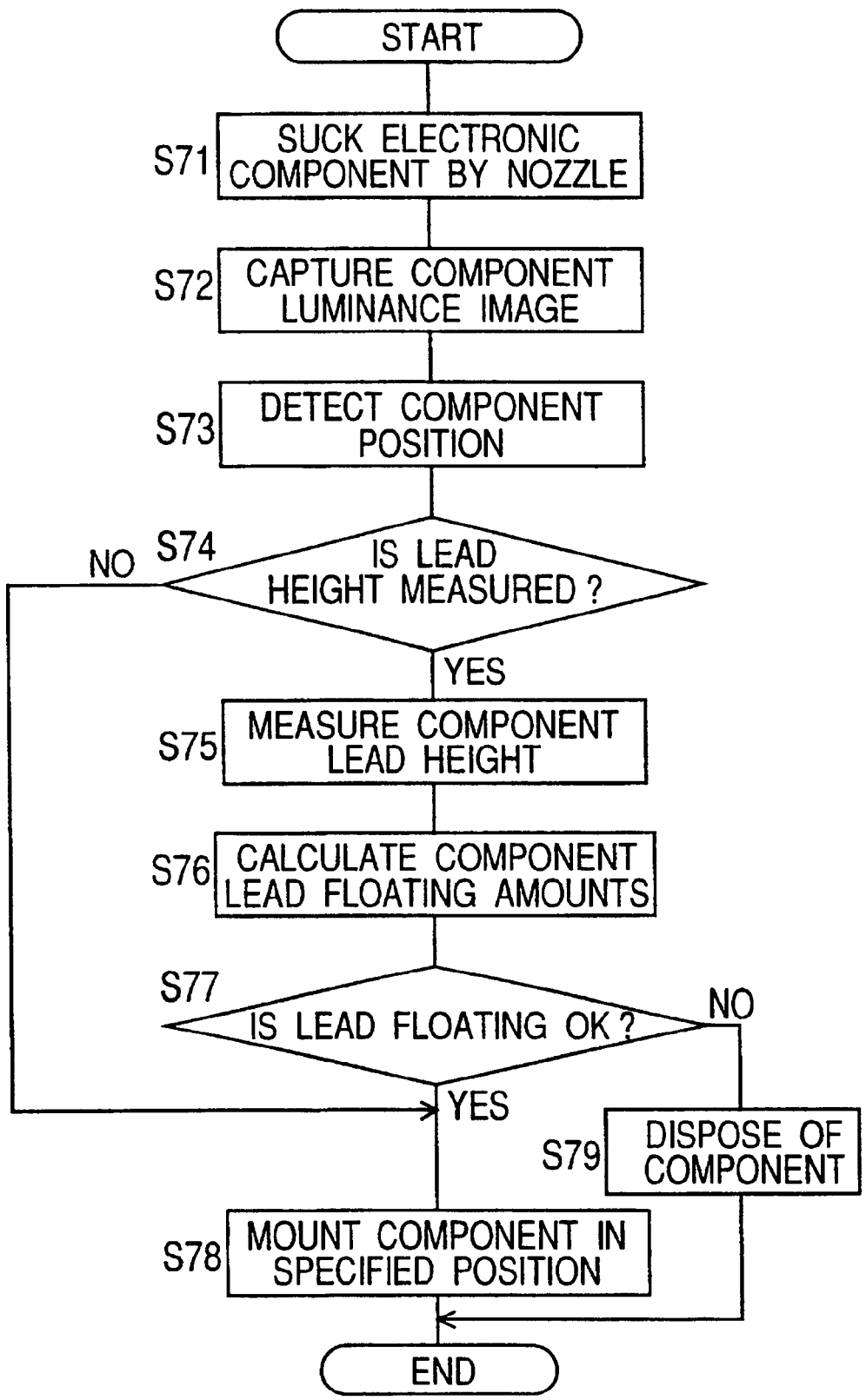
FIG. 43 is a flow chart showing an operating procedure of the prior art component recognizing method and component mounting method.
Figure 44:
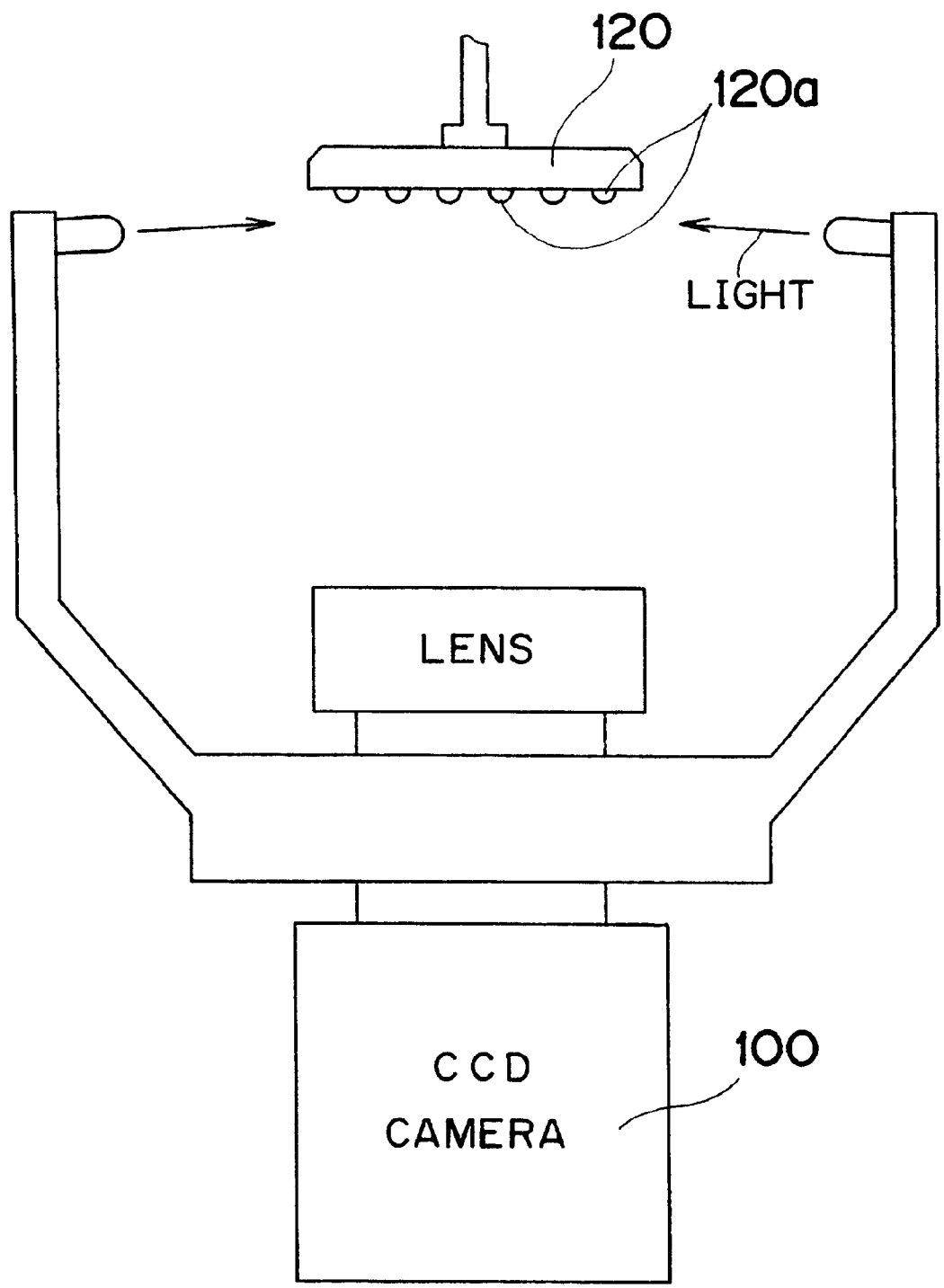
FIG. 44 is an explanatory view showing the prior art method for detecting the hemispherical bump electrode of an electronic component.
Figure 45A:
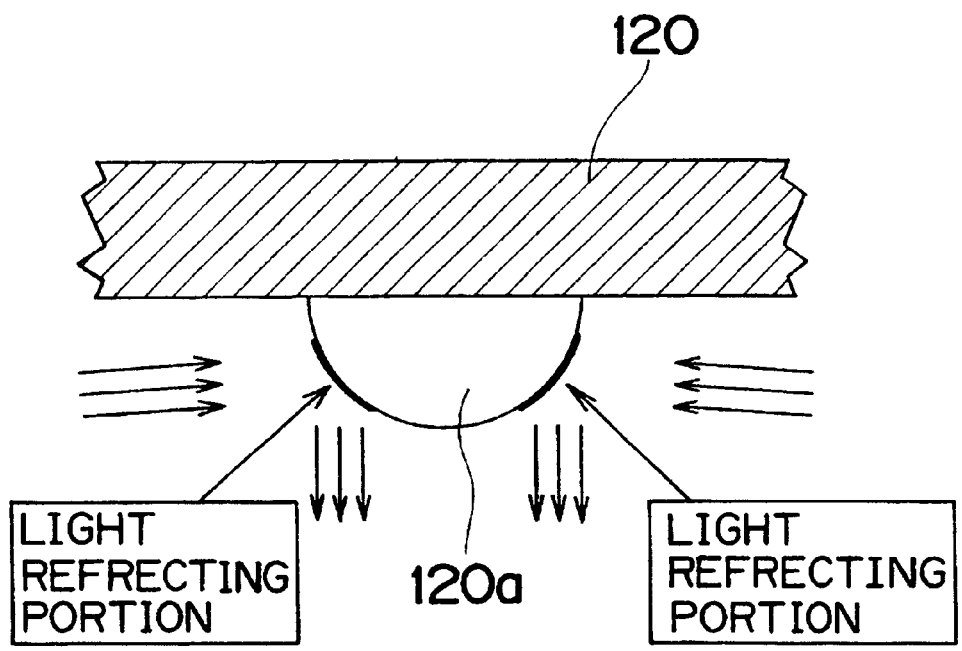
FIG. 45A is an explanatory view showing the input and output state of light to and from the hemispherical bump electrode when light is applied from a CCD camera to the hemispherical bump electrode of the electronic component according to the prior art component recognizing method.
Figure 45B:
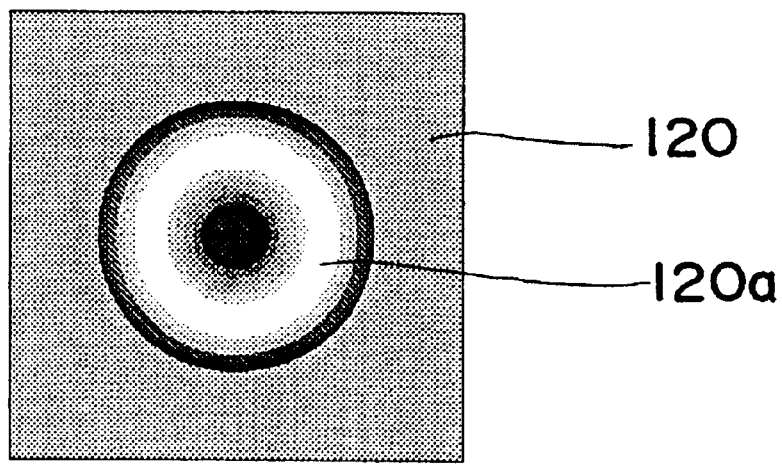
FIG. 45B is an explanatory view showing an image of the hemispherical bump electrode obtained through the detection.
Figure 46A:
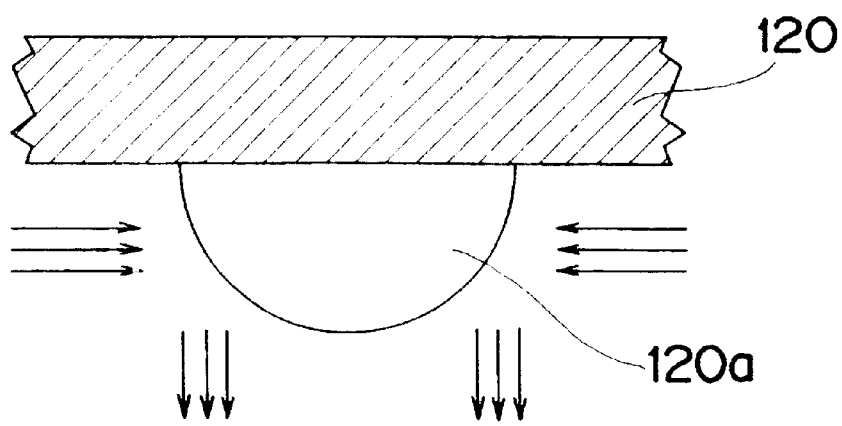
FIG. 46A is an explanatory view showing the input and output state of light to and from the hemispherical bump electrode of an electronic component when the light is applied thereto by a CCD camera according to the prior art component recognizing method.
Figure 46B:
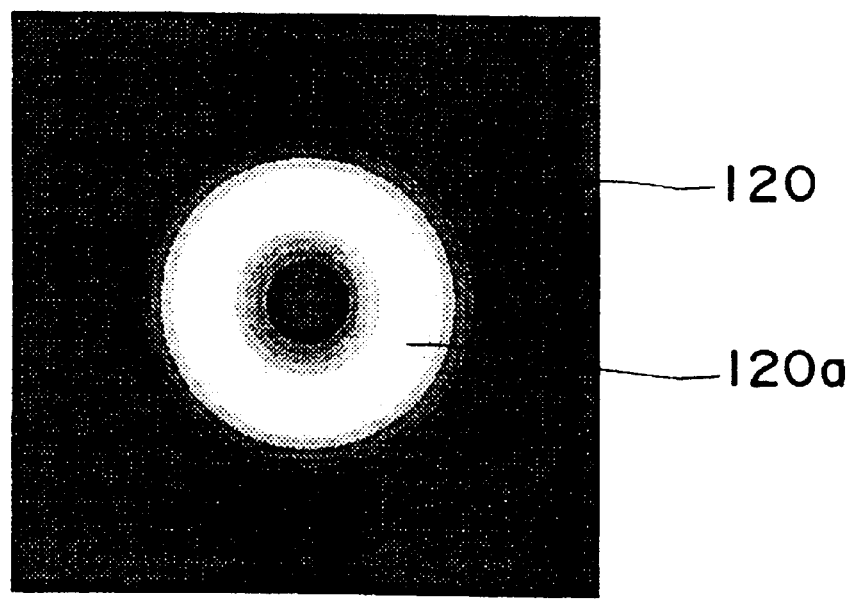
FIG. 46B is an explanatory view showing an image of the hemispherical bump electrode obtained through the detection.
Figure 47A:
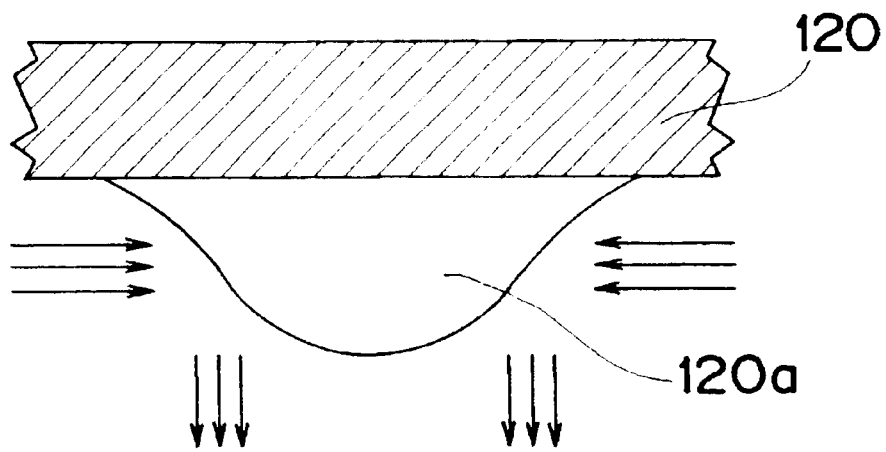
FIG. 47A is an explanatory view showing the input and output state of light to and from the approximately hemispherical bump electrode of an electronic component having an approximately flat portion in the bottom portion when the light is applied thereto by a CCD camera according to the prior art component recognizing method.
Figure 47B:
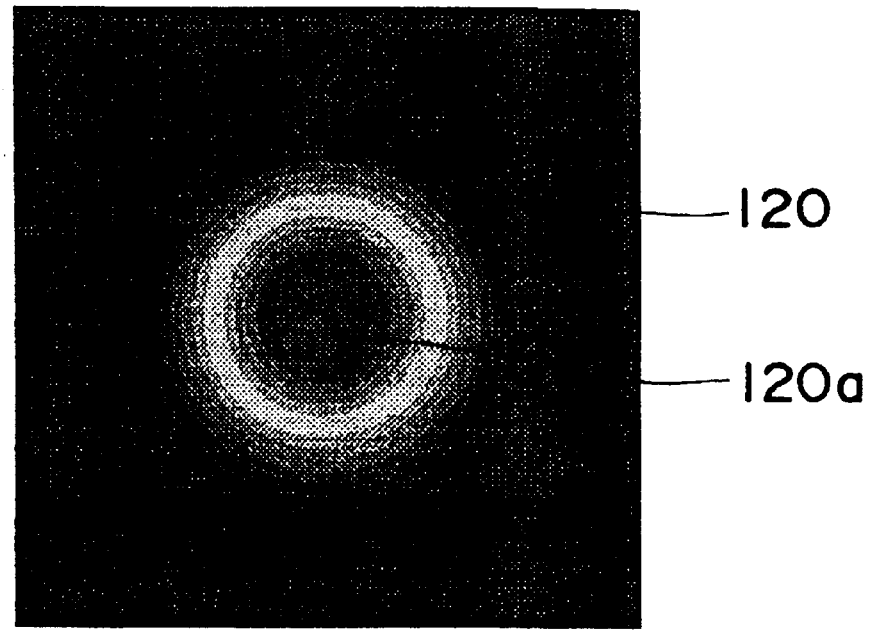
FIG. 47B is an explanatory view showing an image of the approximately hemispherical bump electrode having the approximately flat portion in the bottom portion obtained through the detection.

In FIG. 1 are shown a mounting apparatus main body 1 of the electronic component mounting apparatus, an electronic component (abbreviated to a component hereinafter) 120 to be mounted by the present apparatus, which is as shown in FIG. 40 although denoted by the reference numeral 2 in FIG. 1, the tray 3 on which the components 120 are placed, the tray supply section 4 that serves as a component supply section for automatically supplying the component 120 placed on the tray 3, the head section 7 having the nozzle that sucks the component 120 in the mounting stage, the robot 5 on the X-axis side (abbreviated to the X-axis robot hereinafter) that moves the head section 7 in the X-axis direction and constitutes part of the X-Y robot, the robots 6a and 6b on the Y-axis side (abbreviated to Y-axis robots hereinafter) that move the head section 7 in the Y-axis direction and constitute part of the X-Y robot, and the height detection sensor 8, which corresponds to the three-dimensional (3D) sensor 8 or height image sensor 8, for capturing the height image of the component 120. The reference numeral 9 denotes the printed board to be mounted with the component 120.

When the component 120 placed on the tray 3 is sucked by the head section 7 and transported in the X-axis direction while being driven by the X-axis robot 5 above the height detection sensor 8, the height image of the component 120 is captured by the height detection sensor 8. The (height) image obtained by the height detection sensor 8 is subjected to software processing to recognize and inspect the volume or shape of each of a plurality of hemispherical bump electrodes 120a of the component 120. If the inspection results are normal, then the component 120 is mounted in a specified position on the printed board 9. On the other hand, if any of the bump electrodes 120a has an error in terms of volume or shape, this component 120 is disposed of.

Figure 28:
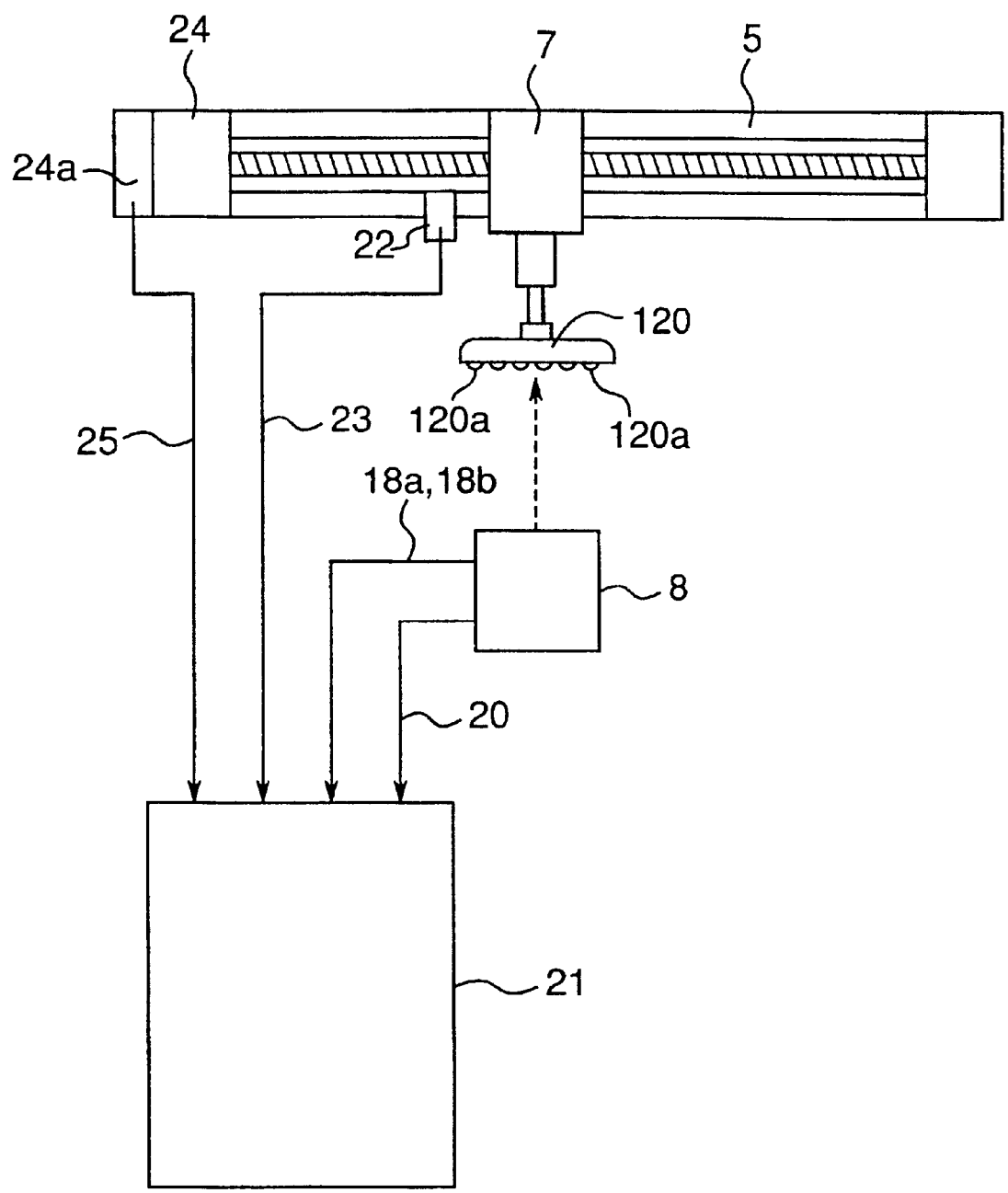
FIG. 28 is an explanatory view showing an output signal from a height detection sensor according to a component recognizing method of a fourth embodiment of the present invention.

FIG. 28 is an explanatory view of the X-axis robot of the electronic component mounting apparatus.

The head section 7 that is sucking the component 120 is moved on the X-axis by the rotation of the servomotor 24. The height data input of the component 120 is executed by the head section 7 that is sucking the component 120 and moving with constant velocity above the height detection sensor 8 from the left-hand side toward the right-hand side of the origin sensor 22. When the head section 7 passes at the side of the origin sensor 22, an origin signal 23 is outputted to inform the image processing control section 21 of the output.

It is to be noted that the reference numerals 18a and 18b denote output signals from the PSDs, the reference numeral 20 denotes the polygon surface origin signal, and the reference numeral 25 denotes the encoder signal.

The construction and operation of the height detection sensor 8 will be described in detail below by way of an example that employs the principle of operation of triangulation.

Figure 29:
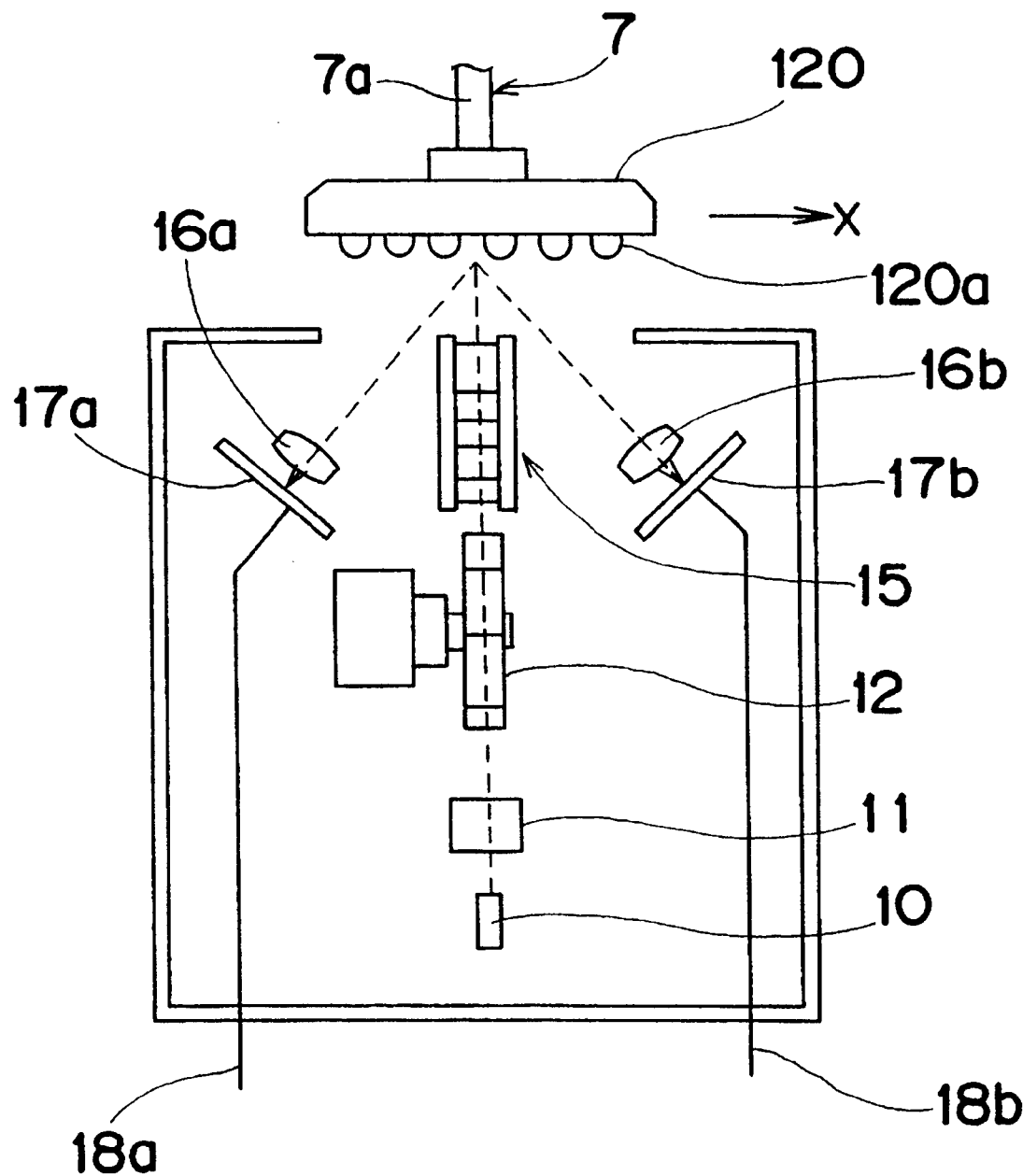
FIG. 29 is a sectional view of a height detection sensor of a component recognizing method of the fourth embodiment.
Figure 30A:
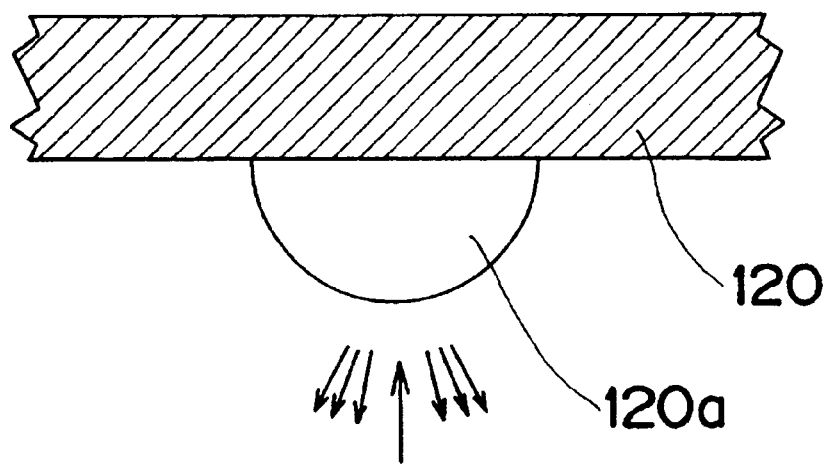
FIGS. 30A and 30B show a state in which the hemispherical bump electrode of an electronic component is detected by a height sensor, where
Figure 30B:
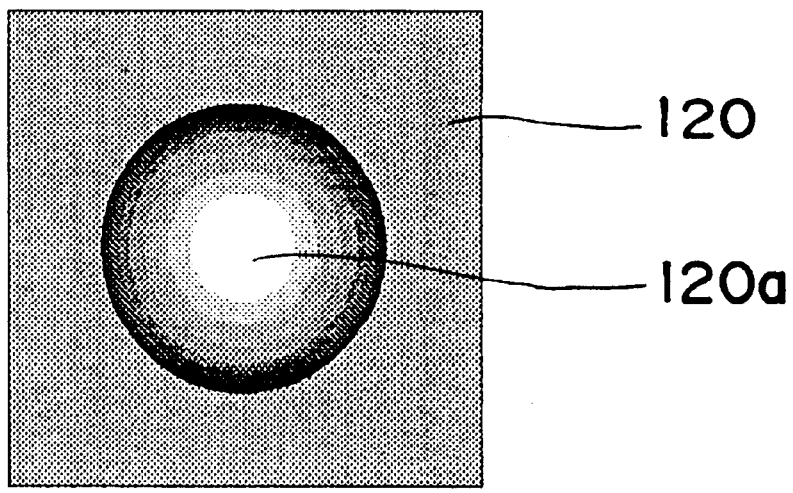
Figure 31:
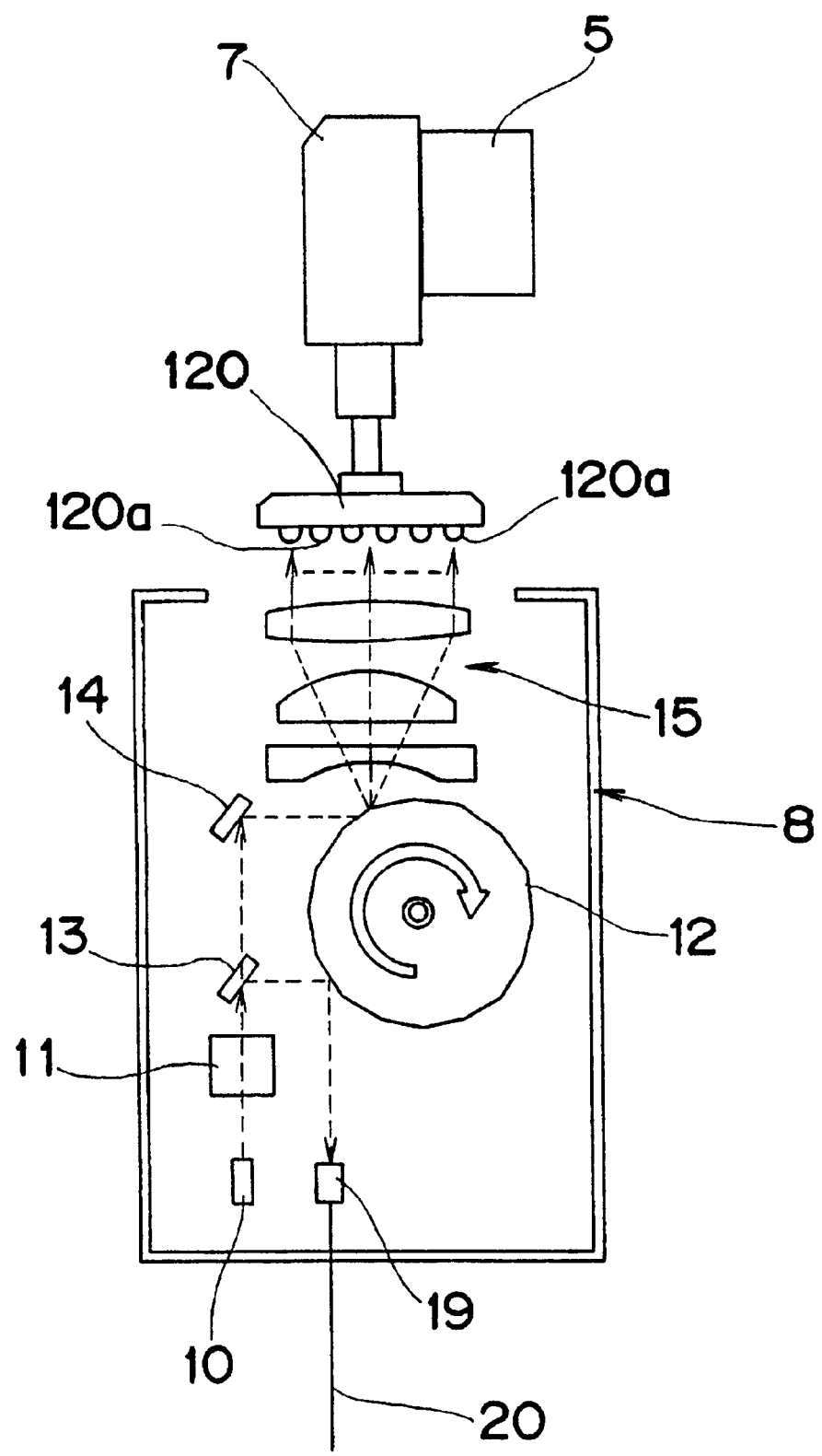
FIG. 31 is a sectional view of the height detection sensor according to the component recognizing method of the fourth embodiment.

FIG. 29 is a sectional view of the height detection sensor 8 perpendicular to the Y-axis, while FIG. 31 is a sectional view of the height detection sensor 8 perpendicular to the X-axis. In FIG. 29 and FIG. 31 are shown a semiconductor laser 10 for emitting a laser beam, a light collecting and shaping lens 11 for collecting and shaping this laser beam, a polygon mirror 12 for scanning the laser beam impinging on this mirror surface by mechanical rotation, a half mirror 13 for partially transmitting and partially reflecting the laser beam, and a mirror 14 for reflecting light.

There are also shown an Fθ lens 15 that changes the optical path so that the laser beam mechanically swung by the polygon mirror 12 is applied perpendicularly to the component 120 that is the subject, focusing lenses 16a and 16b that focus the reflection (scattered light) of the laser beam impinging on the hemispherical bump electrode 120a of the component 120, and semiconductor position sensitive devices (abbreviated to PSDs hereinafter) 17a and 17b that serve as position detecting devices on each of which the laser beam that has impinged and reflected on the component 120 is focused via the focusing lenses 16a and 16b and have a function for generating an electric signal correlated with the position of the focused light. The reference numerals 18a and 18b denote the output signals of the PSDs 17a and 17b.

In this case, the laser beam emitted from the semiconductor laser 10 has its beam shape collected and shaped by the light collecting and shaping lens 11. Thereafter, the laser beam passes through the half mirror 13, reflects on the mirror 14 and impinges on the polygon mirror 12. The polygon mirror 12 is rotating with constant velocity, and consequently the laser beam impinging on the mirror surface is swung. Further, the laser beam whose optical path is changed by the Fθ lens 15 is applied perpendicularly to the hemispherical bump electrode 120a of the component 120, and this reflection light is focused on the PSDs 17a and 17b via the focusing lenses 16a and 16b. The PSDs 17a and 17b generate the output signals 18a and 18b capable of measuring the height of the laser reflecting surface of the hemispherical bump electrode 120a of the component 120.

In this case, the laser beam is reflected on the polygon mirror 12 and thereafter applied to the hemispherical bump electrode 120a of the component 120 that is the object. The laser beam is applied consistently perpendicularly to the hemispherical bump electrode 120a of the component 120 that is the object by the Fθ lens 15 constructed of three elements existing between the polygon mirror 12 and the hemispherical bump electrode 120a of the component 120.

When measuring the height of the hemispherical object such as the hemispherical bump electrode 120a of the component 120, the peripheral surface of the hemispherical object corresponds to a sheer wall for the height detection sensor 8. If the laser beam is applied to and around this portion, then no reflection light can be obtained from the hemispherical object, and no reflection light returns to the PSDs 17a and 17b. Therefore, it is preparatorily checked through an experiment how much degrees of surface angle the measurability holds while keeping an accuracy. The angle is θ shown in FIG. 38B, as described later.

Figure 38A:
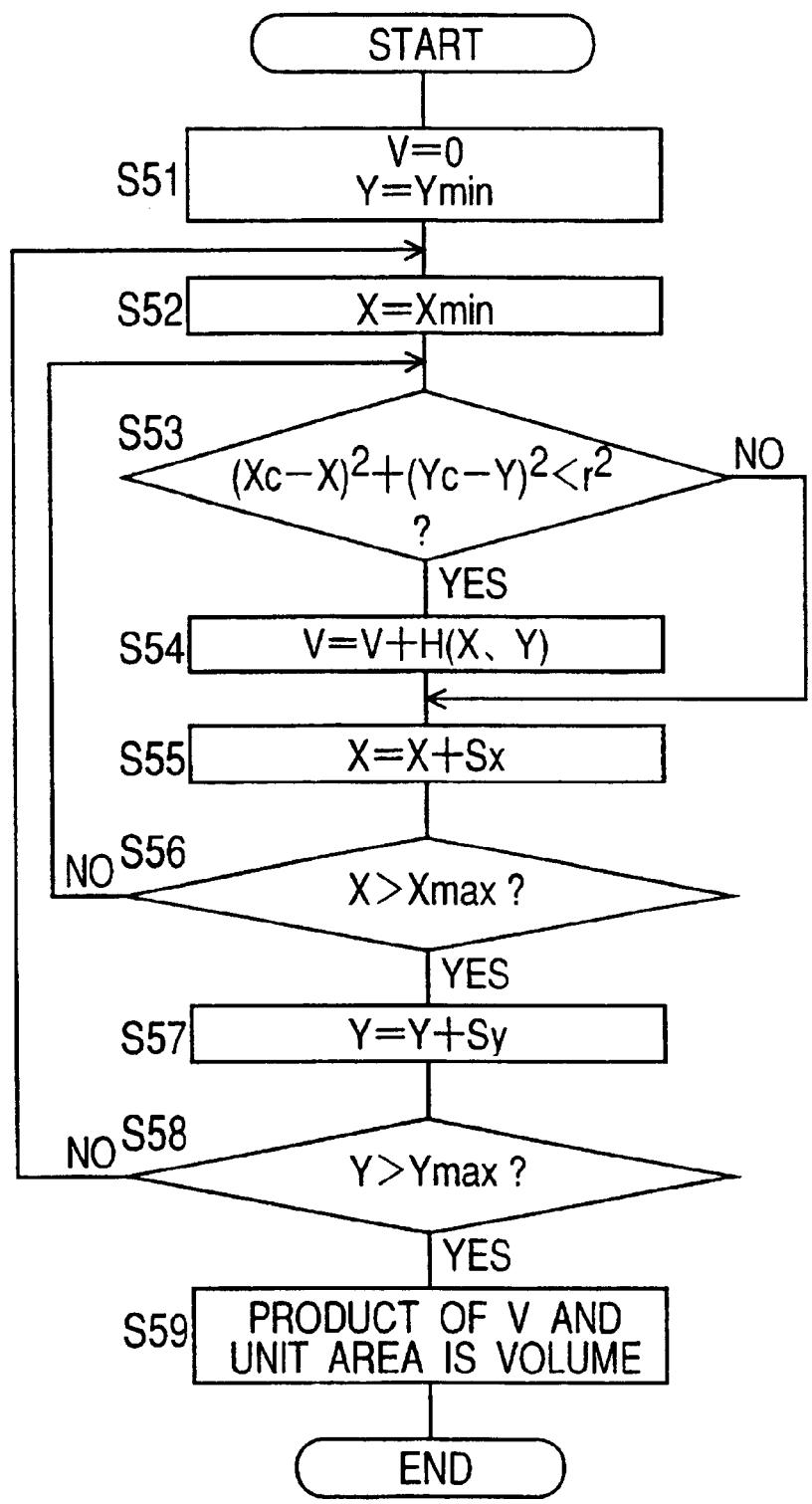
FIGS. 38A and 38B show a volume detecting procedure of the hemispherical bump electrode of the electronic component, where
Figure 38B:
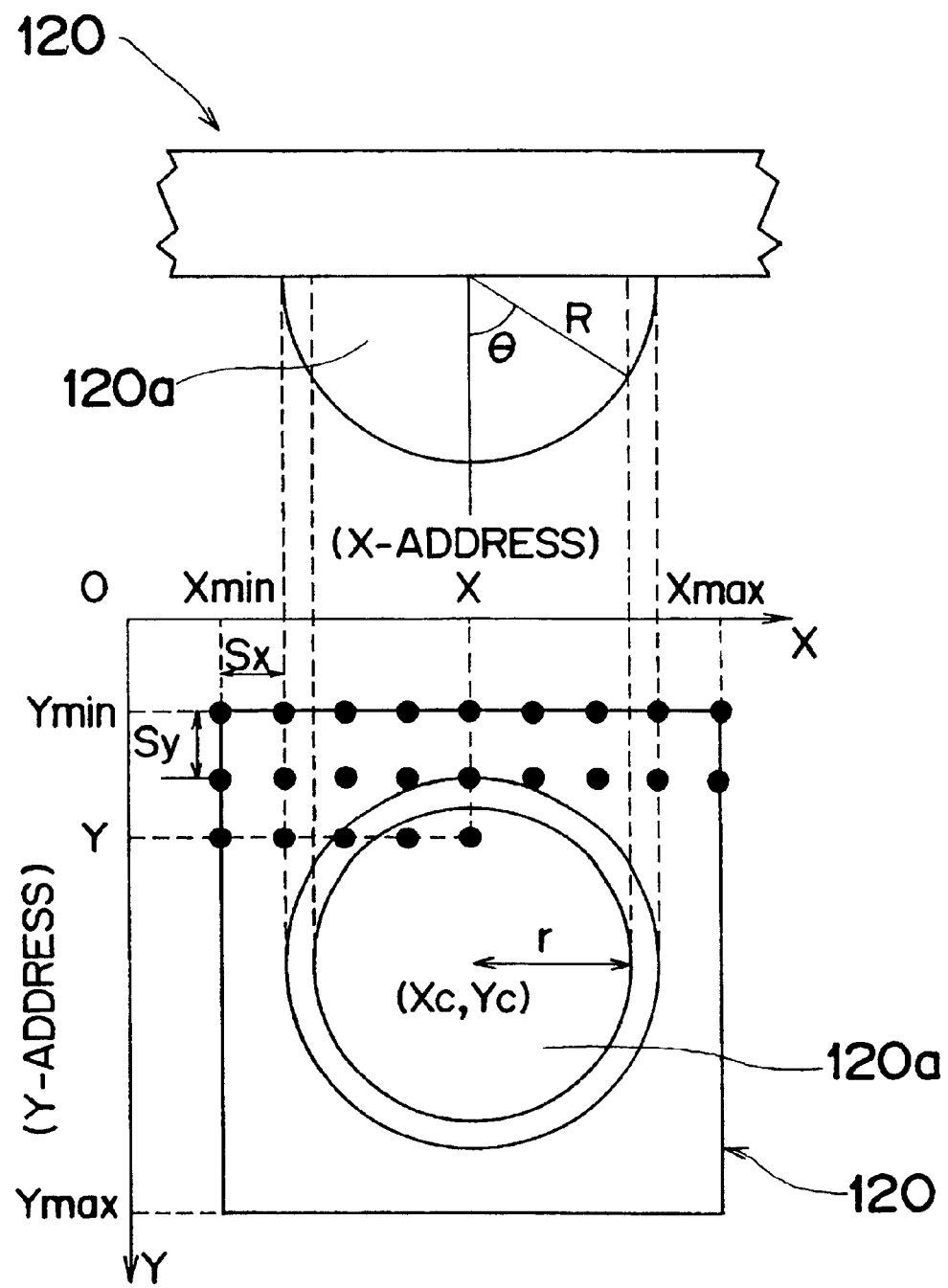

Therefore, as shown in FIG. 38B described later, when measuring the volume of the hemispherical bump electrode 120a of the component 120 by the height detection sensor 8, the accuracy is increased by preparatorily calculating a radius r capable of obtaining valid data on the basis of θ and subjecting only the measurement height H (X, Y) to volumetric calculation only when the sampling point X, Y exists within the region of the radius r from the center of the hemispherical bump electrode 120a while internally sampling the small region.

In FIG. 31 are shown a photosensor 19 for sensing the input of light thereto, and a signal 20 for informing the outside of the input of light to the photosensor 19. This signal 20 changes when each mirror surface of the polygon mirror 12 comes into a specified angle, which is the so called origin signal (surface origin) of each mirror surface of the polygon mirror 12. Further, in the case of a polygon mirror 12 having 18 sides, a signal is to be outputted 18 times per rotation every time the mirror rotates at regular intervals of angle (at angles of 20 degrees in the case of 18 sides). This is called the polygon surface origin signal 20 of the polygon mirror 12.

The height detection sensor 8 of the fourth embodiment has two systems of PSD circuits. This arrangement is provided principally for compensating for no return of the reflection light to the PSD in terms of angle, which possibly occurs in the case where the laser beam is applied to the component when one system is employed.

It is sometimes more effective to provide three or more systems, technically having the same meaning, and accordingly, description will be provided on the basis of the two systems.

Figure 32:
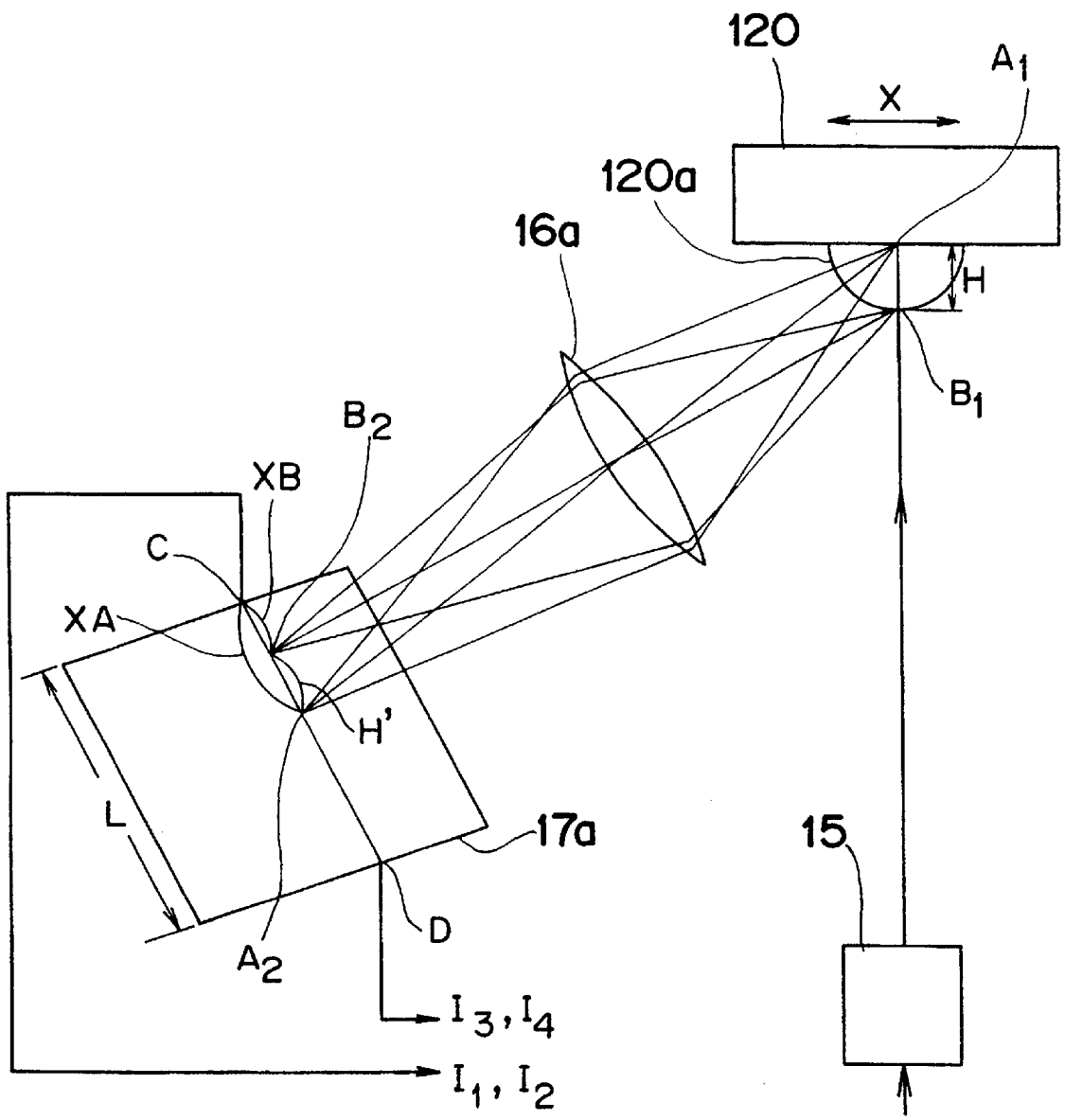
FIG. 32 is an explanatory view showing an example of a height measuring method of a hemispherical bump electrode according to the component recognizing method of the fourth embodiment.

Reference will herein be made to one example of the height measuring method of the hemispherical bump electrode 120a of the component 120 that is the object to be measured by the aforementioned semiconductor position sensitive devices (PSDs) 17a and 17b, as represented by the semiconductor position sensitive device 17a, with reference to FIG. 32.

In FIG. 32, the laser beam that is scanned from the Fθ lens 15 in the direction (Y-axis direction) perpendicular to the sheet plane where FIG. 32 is drawn and applied to the hemispherical bump electrode 120a of the component 120 is irregularly reflected on the hemispherical bump electrode 120a. In this case, it is assumed that the projected points are a point $A_1$ at a height O on the bottom surface of the hemispherical bump electrode 120a and a point $B_1$ at a height H from the bottom surface, or the lowermost portion of the hemispherical bump electrode 120a.

The irregularly reflected laser beams are collected by the focusing lens 16a and each focused on a point $A_2$ and a point $B_2$ on the semiconductor position sensitive device (PSD) 17a. Consequently, electromotive forces are generated at the point $A_1$ and the point $B_2$, so that currents $I_1$ and $I_2$ are taken out of a point C and currents $I_3$ and $I_4$ are taken out of a point D.

Figure 37:
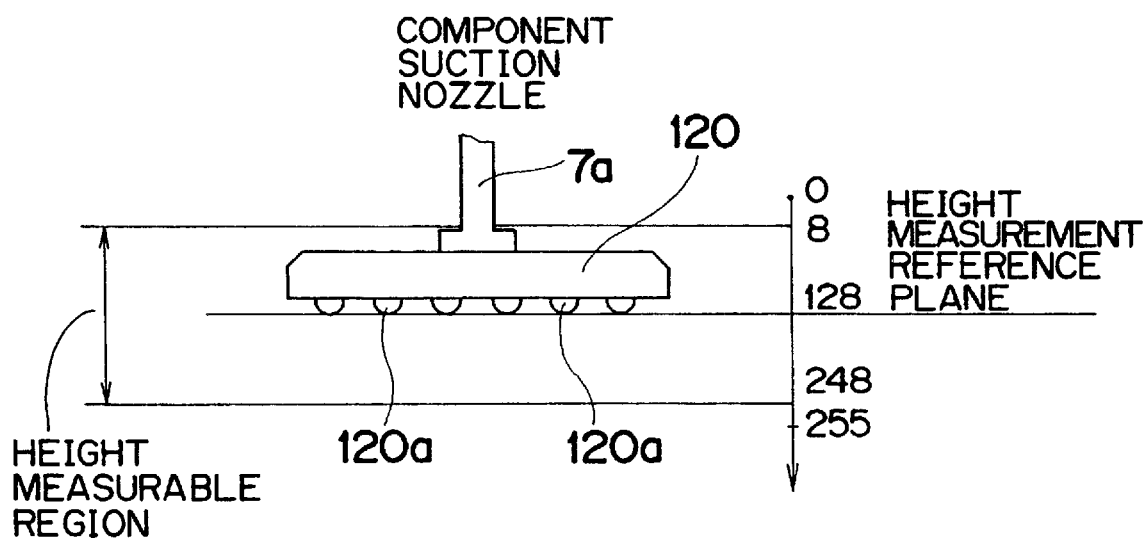
FIG. 37 is an explanatory view showing a height measurement region of the electronic component.

The currents $I_1$ and $I_3$ depend on resistance components proportional to a distance $X_A$ between the point $A_2$ and the point C and a distance between the point $A_2$ and the point D, while the currents $I_2$ and $I_4$ depend on resistance components proportional to a distance $X_B$ between the point $B_2$ and the point C and a distance between the point $B_2$ and the point D. Therefore, assuming that the length of the semiconductor position sensitive device 17a is L, then $X_A$ and $X_B$ in FIG. 37 are determined according to the following expressions.

$$X_A = LI_3/(I_1+I_3)$$

$$X_B = LI_4/(I_2+I_4)$$

Therefore, a distance H' between the point $A_2$ and the point $B_2$ on the semiconductor position sensitive device 17a of FIG. 32 is determined by the following expression.

$$H' = X_A - X_B$$

Based on the thus-obtained height H' on the PSD, the height H is determined.

A mechanism for capturing a height image will be described next with reference to FIG. 28.

In FIG. 28 are shown a main control section 21 of the present electronic component mounting apparatus, a reference position sensor 22 for informing the main control section 21 of the reference position for capturing the height image on the X-axis robot 5, a reference position signal 23 for informing the main control section 21 of the passing of the head section 7 at the side of this reference position sensor 22, an encoder 24a of a motor 24 for moving the X-axis robot 5, and an encoder signal 25 outputted from the encoder 24a.

When the component 120 picked up from the tray 3 is transported on the X-axis by the X-axis robot 5, the encoder 24a is always giving the encoder signal (signal of AB-phase, Z-phase or equivalent to this) 25 to the main control section 21. Due to the fact that the reference position signal 23 is given to the main control section 21 when the component 120 passes at the side of the reference position sensor 22, the relative position of the component 120 relative to the reference position on the X-axis can be calculated by the main control section 21 with both the signals 23, 25.

On the other hand, the amount of rotation of the polygon mirror 12 located inside the height detection sensor 8 is consistently given as the polygon surface origin signal to the main control section 21 while the mirror is rotating, and the amount of rotation of the polygon mirror 12 after its passing through the reference position can be calculated from this signal and the reference position signal 23.

In this case, the amount of rotation of the polygon mirror 12 increases in proportion to its velocity, and the same thing can be said for the amount of movement of the X-axis robot 5. On the other hand, in the height detection sensor 8 of the fourth embodiment, it is presupposed that the polygon mirror 12 rotates and the X-axis robot 5 linearly moves when capturing the height image, each with constant velocity. If these conditions are disordered, then the resolution (pixel size) per pixel in the horizontal and vertical directions of the height image to be captured is to vary according to the fluctuation in velocity. This is an error factor in terms of measurement accuracy. Therefore, in the electronic component mounting apparatus of the fourth embodiment, the height image is captured into an image memory 34 (see FIG. 33) located inside the main control section 21 by the height detection sensor 8 having the aforementioned construction. Further, in order to watch and control the consistency of the operation of the polygon mirror 12 that is rotating basically with constant velocity with the operation of the head section 7 driven by a motor such as a servomotor, the polygon surface origin signal 20 of the polygon mirror 12 and the encoder signal 25 of the motor are used.

Figure 33:
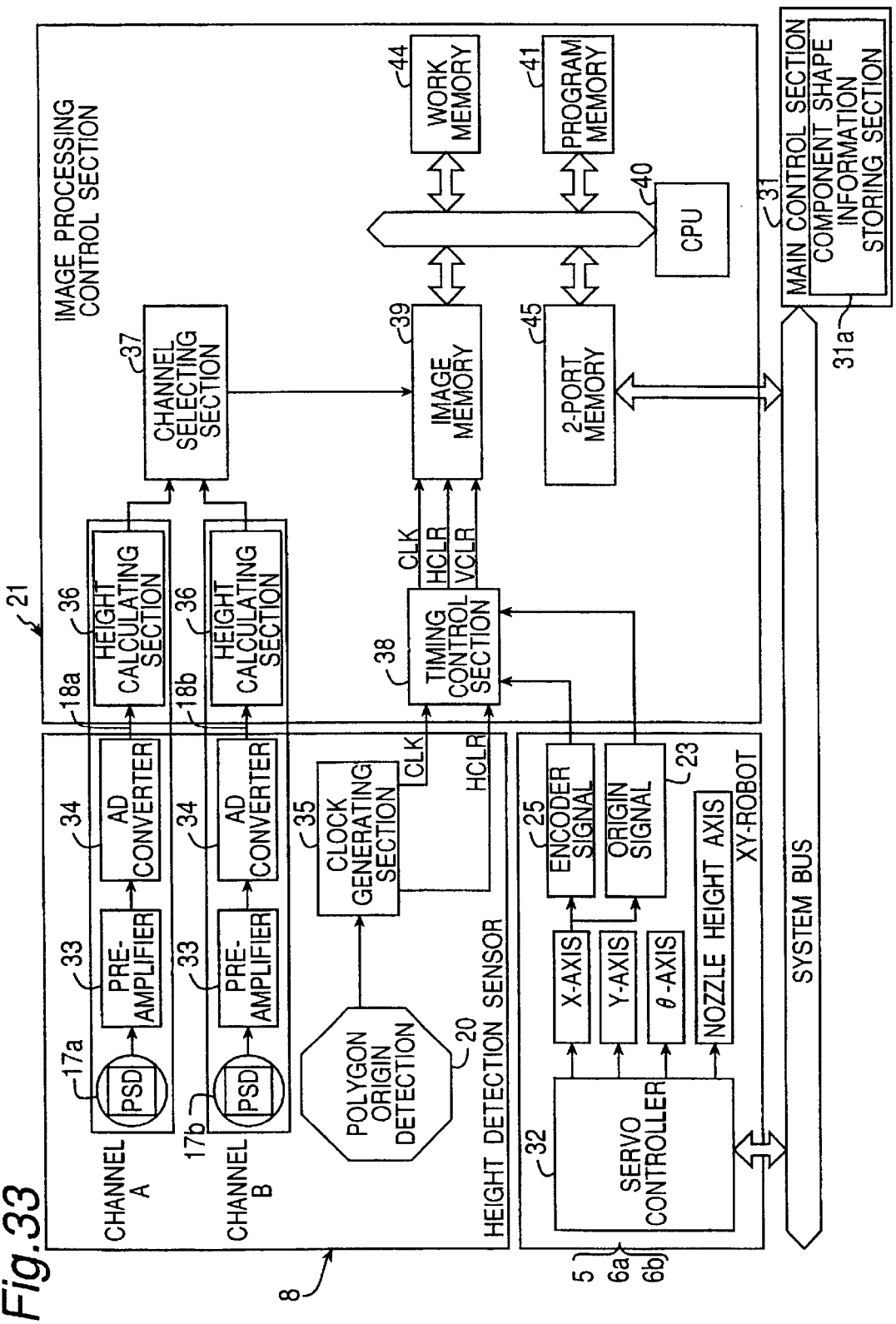
FIG. 33 is a block diagram showing the internal construction of a main control section of an electronic component mounting apparatus to be used for the component recognizing method of the fourth embodiment.

A block diagram of FIG. 33 showing the internal structure of the main control section 31 will be described next.

The main control section 31 controls the whole system of the electronic component mounting apparatus shown in FIG. 1. For example, the main control section controls the position of the head section 7 of the electronic component mounting apparatus via, for example, a servo controller 32 and executes the suction of the electronic component 120, transport of the electronic component 120, and mounting of the electronic component 120 onto the printed board 9.

The shape information (body height, body width, body depth, the number of hemispherical bump electrodes 120a, the diameter of the hemispherical bump electrode 120a, the pitch of the hemispherical bump electrodes 120a, and so on) of the electronic component 120 to be mounted stored in a component shape information storage section 31a of the main control section 31 is transmitted via a 2-port memory 45 and stored into a work memory 44 of the image processing control section 21, and height image input of the electronic component 120 and positional detection of the electronic component 120 are executed. The results are received from the image processing control section 21 via the 2-port memory 45 and used for correcting calculation of the position (X, Y, θ) in mounting the electronic component 120 on the printed board 9.

In the X-axis robot 5 and the Y-axis robots 6a and 6b, a servo controller 32 executes positional control of the X-axis, Y-axis, θ-axis, and nozzle elevation axis. In particular, the motor encoder signal 25 of the X-axis, which carries the information of the position of the head section 7 on the X-axis and the origin signal 23 from the X-axis, which carries the information of the fact that the head section 7 has come into a height measurement start position, are inputted to the image processing control section 21 so as to inform the control section of the above information and used for measuring the start timing of taking in the height data into the image memory 39.

In the height detection sensor 8, the light-receiving system for measuring the laser beam reflected on the component 120 includes two systems (a channel A and a channel B) taking a variation in reflection of the laser beam into consideration, thereby ensuring reliability. The light-receiving systems amplify feeble signals detected by the PSDs 17a and 17b by means of preamplifiers 33, convert the signals into 12-bit digital data (in order to ensure height calculation accuracy, the conversion into the 12-bit digital data is effected in this case) by means of A-D converters 34, and input the converted data into the image processing control section 21. The polygon mirror 12 is consistently rotating and inputting a polygon surface origin signal 20 to a clock generating section 35 by means of the mechanism shown in FIG. 31. The clock generating section 35 generates a reference clock (CLK) required for writing the height data into the memory, generates a horizontal synchronization signal (HCLR) required for taking in the height data on the basis of the polygon surface origin signal 20, and inputs the signals into the image processing control section 21.

The image processing control section 21 converts the digitized PSD signal from the height detection sensor 8 into 8-bit height data in a height calculating section 36. A channel selecting section 37 compares the height data of the two systems (channel A and channel B) with each other in real time, and selects the height data that seems to have the higher certainty in accordance with each timing. For example, if a division by zero occurs in the height calculating stage of the channel A, the numeric value of 255 representing the abnormality is given to the height data of the channel A. Therefore, in such a case, the value of the channel B is selected. If both the channels exhibit the abnormal values of 255, then the numeric value of 255 is outputted as the height data. If the height data of both the channels have normal values, the arithmetic mean value of the height data of both the channels is outputted. The height data outputted from the channel selecting section 37 is stored into the image memory 39. The storing of the height data into the image memory 39 is controlled by the timing control section 38. The timing control section receives an origin signal from the X-axis robot 5, thereafter counts the encoder signal 25 as a predetermined head section movement distance to generate a vertical synchronization signal (VCLR), and inputs the signal as a height data taking-in start signal into the image memory 39. The height data stored in the image memory 39 is subjected to image processing by a CPU 40 that operates according to a program and subjected to positional detection and so on of the electronic component 120 that is the object to be recognized. The program is stored in the program memory 41. The shape information (external height, external width, external depth, the number of hemispherical bump electrodes, the diameter of the hemispherical bump electrode, the pitch of the hemispherical bump electrodes, and so on) that is storing the geometrical features of the electronic component 120 are transmitted from the main control section 31 via the 2-port memory 45 prior to the height image input. The positional detection of the object to be recognized is executed on the basis of the shape information. It is to be noted that the work memory 44 is used as a place for storing the shape information and the intermediate result of the object to be recognized in executing the positional detection of the object to be recognized.

Figure 34:
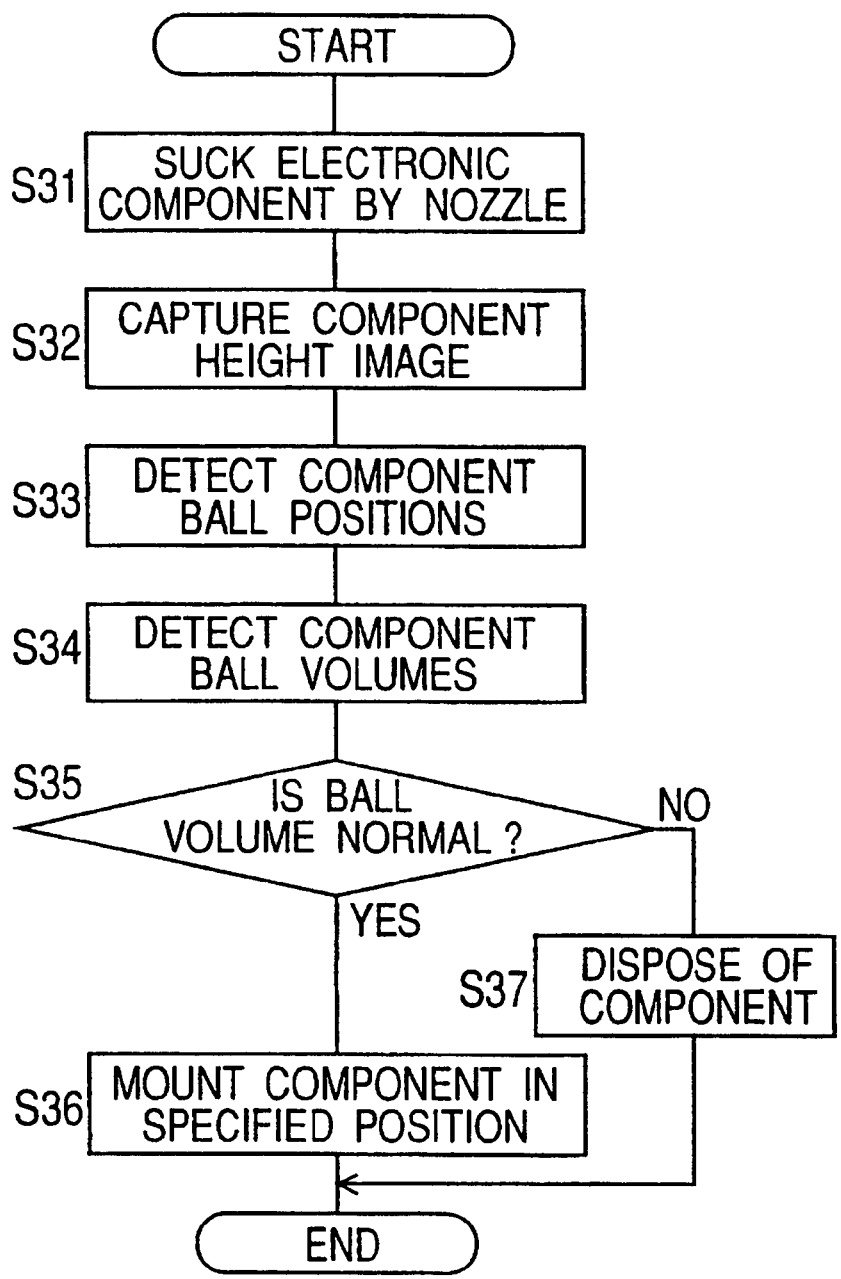
FIG. 34 is a flow chart showing a component mounting procedure.

FIG. 34 shows a component mounting procedure by means of the height detection sensor 8.

Next, reference will be made to the steps (S31 through S37) shown in FIG. 34.

Step S31: The component 120 is sucked by the nozzle 7a (head section 7).

Step S32: The height data of the component 120 is taken in.

Step S33: The positions of the hemispherical bump electrodes 120a of the component 120 are detected. (For the detail, see FIG. 35.)

Step S34: The volumes of the hemispherical bump electrodes 120a of the component 120 are detected. (For the detail, see FIGS. 38A and 38B.)

Step S35: It is decided whether each volume of the hemispherical bump electrodes 120a is normal.

Step S36: When all the electrodes are all normal, the component 120 is mounted in the specified position of the printed board 9.

Step S37: When the volume of at least one of the hemispherical bump electrodes 120a is abnormal, the component 120 is not mounted and is disposed of.

Figure 35:
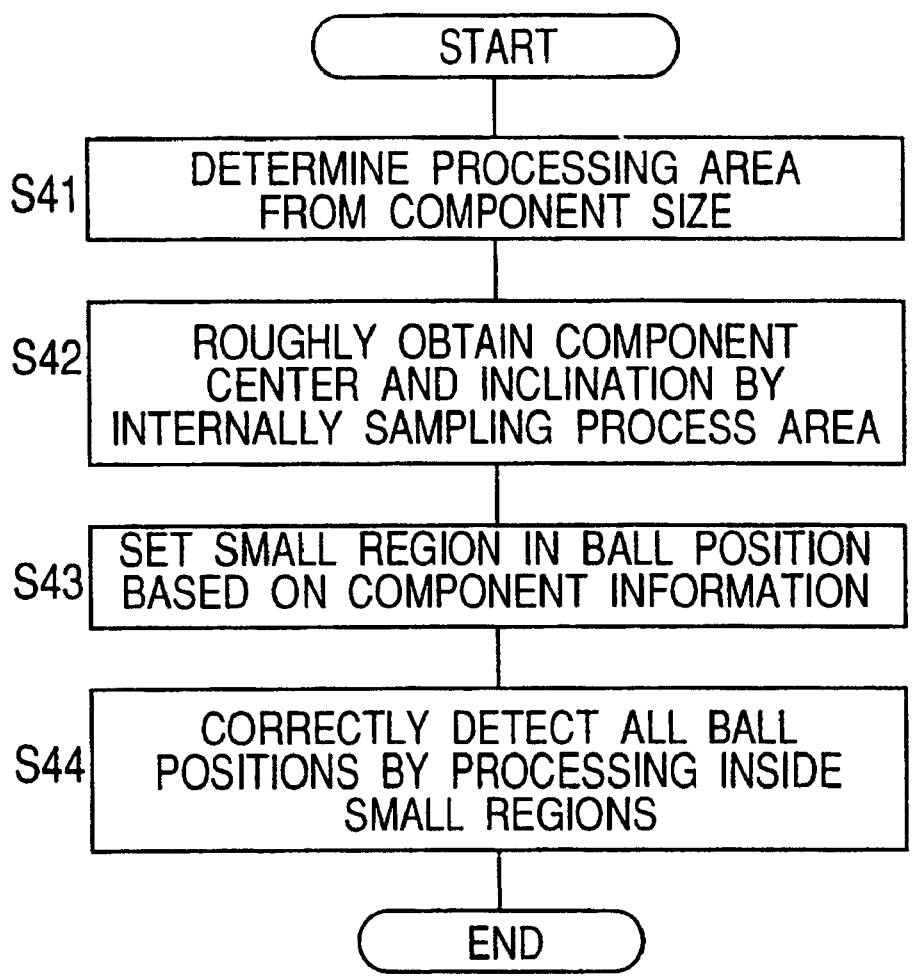
FIG. 35 is a flow chart showing a position detecting procedure of the hemispherical bump electrode of the component from a height image.

FIG. 35 shows a position detecting procedure of the hemispherical bump electrode 120a of the component 120 according to the height data.

Next, reference will be made to the steps (S41 through S44) shown in FIG. 35.

Step S41: The processing area is determined according to the size of the component 120.

The size in the X- and Y-directions of the processing area is set, for example, two times as large as the size of the component 120 on the screen.

Step S42: The processing area is internally sampled to obtain the center of the component 120, and a product of inertia and a second moment of inertia around the center of the component 120 are obtained for the obtainment of the inclination. That is, the pattern of the component 120 is approximated to an ellipse, and the major axis thereof is determined as the inclination of the component 120.

Step S43: The position of the hemispherical bump electrode 120a is estimated on the basis of the position and posture of the component 120, and a small region is set.

For the shape information of the component 120, there are preparatorily stored the body size of the component 120, the number of hemispherical bump electrodes 120a, the sizes of the hemispherical bump electrodes 120a, the diameters of the hemispherical bump electrodes 120a, and information required for calculating the position where each individual hemispherical bump electrode 120a exists.

Step S44: The positions of all the hemispherical bump electrodes 120a are correctly detected.

In connection with the above-mentioned center detection and inclination detection of the component 120, FIGS. 36A, 36B, and 36C will be described.

Figure 36A:
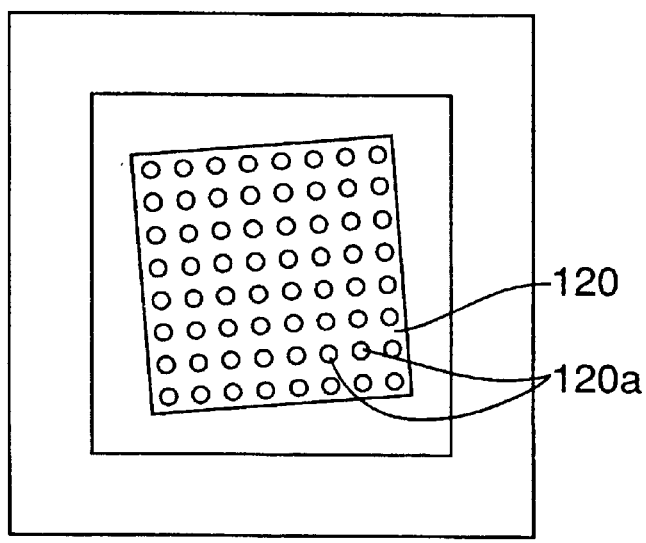
FIGS. 36A, 36B, and 36C are explanatory views showing the position detecting procedure of the hemispherical bump electrodes of the electronic component.

In FIG. 36A, the processing area determined by the size of the component 120 is expressed by a window.

Figure 36B:
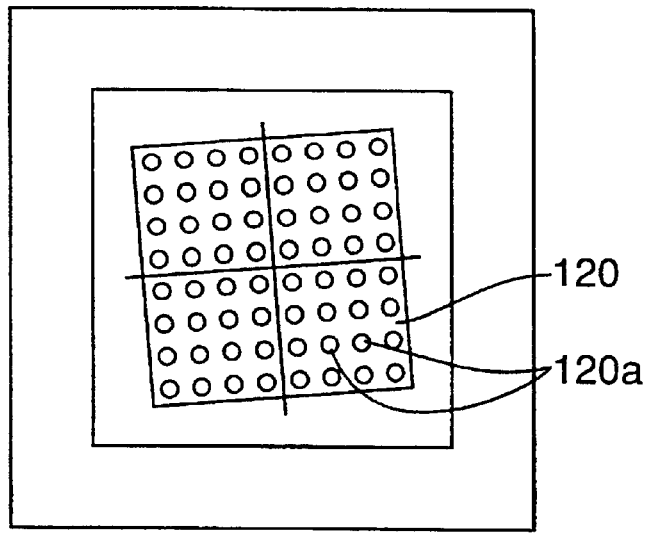

In FIG. 36B, the processing area is internally uniformly sampled in the X-direction and the Y-direction at predetermined steps, thereby obtaining the center and inclination of the component 120 as shown in FIG. 36B by a cross.

Figure 36C:
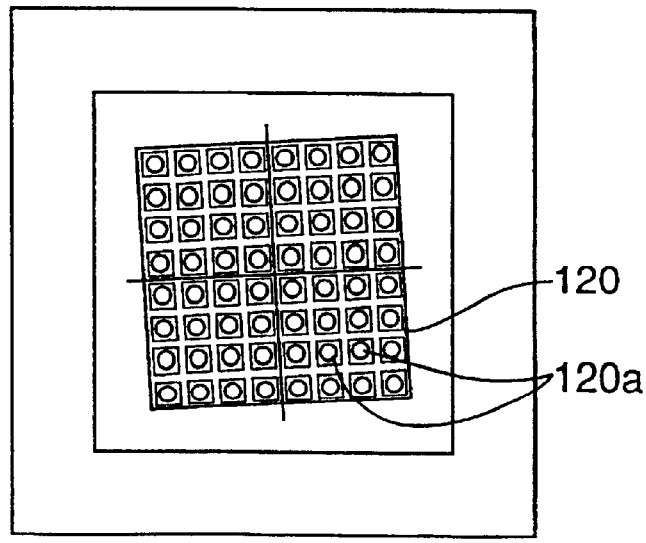

In FIG. 36C, the position in which each individual hemispherical bump electrode 120a exists is estimated by using the center and inclination of the component 120 and the component shape information transmitted from the main control section 31, and a small region including only one hemispherical bump electrode 120a is set. This small region is sampled to detect the center position of the hemispherical bump electrode 120a.

FIG. 37 shows a height measurement region. This is an 8-bit image region, and therefore, 256 numeric values ranging from 0 up to 255 can be handled as height data. According to the present embodiment, the height coordinate axis is set in the direction from the object to the height detection sensor and the reference plane of the height measurement is expressed by the numeric value of 128, for the sake of convenience. The values of 0 and 255 are used as the height data for expressing the error that "height data is not correctly obtained" or the like. Assuming that the resolution in the direction of height is 10 μm, the measurable region becomes about ±1.2 mm.

A volume detecting procedure of the hemispherical bump electrode 120a will be described next with reference to FIGS. 38A and 38B.

In FIGS. 38A and 38B, there are

V: sum of heights of hemispherical bump electrodes 120a,

R: radius of hemispherical bump electrode 120a,

θ: critical angle at which laser beam reflected on hemispherical bump electrode 120a can be received by PSD, r: radius of circular region made when PSD light-receiving critical angle is projected on X-Y plane, H (X, Y): height data at point (X, Y), (X, Y): sampling point in small region, and (Xc, Yc): center coordinates of hemispherical bump electrode 120a obtained through processing of FIG. 36C.

The procedure is comprised of Steps S51 through S59 shown in FIG. 38A.

Step S51: Y-address is initialized to Ymin as shown in FIG. 38B, and there is set V=0.

Step S52: X-address is initialized to Xmin as shown in FIG. 38B.

Step S53: A decision is made on $(Xc-X)^2+(YC-Y)^2<r^2$. If this expression is satisfied, then the program flow proceeds to Step S54. If this expression is not satisfied, the sampling point (X, Y) is to be located outside the region of the bump electrode 120a. Therefore, the height data H (X, Y) at such a sampling point is not added to V, and the program flow proceeds to Step S55.

Step S54: The sampling point (X, Y) exists inside the region of the radius r about (Xc, Yc), and therefore, the height data H (X, Y) owned by this sampling point (X, Y) is highly accurate. Therefore, the height data H (X, Y) is added to V, thereby updating V.

Step S55: A predetermined increment Sx is added to the X-address, thereby updating the X-address. That is, the sampling point is shifted by one address Sx in the X-axis direction.

Step S56: The processes of Steps S53 through S55 will be repeated while increasing the increment Sx until the X-address exceeds the maximum value Xmax.

Step S57: If the X-address exceeds Xmax, then a predetermined increment Sy is added to the Y-address, thereby updating the Y-address. That is, the sampling point is shifted by one address Sy in the Y-axis direction.

Step S58: The processes of Steps S52 through S57 will be repeated while increasing the increment Sy until the Y-address exceeds the maximum value Ymax. If the Y-address exceeds Ymax, then the program flow proceeds to Step S59.

Step S59: By multiplying V that is the sum of the height data of all the sampling points by an unit area per sampling point, the volume of the bump electrode 120a is obtained.

A shape evaluating (shape recognizing) procedure of the hemispherical bump electrode 120a will be described with reference to FIGS. 39A and 39B.

Figure 39A:
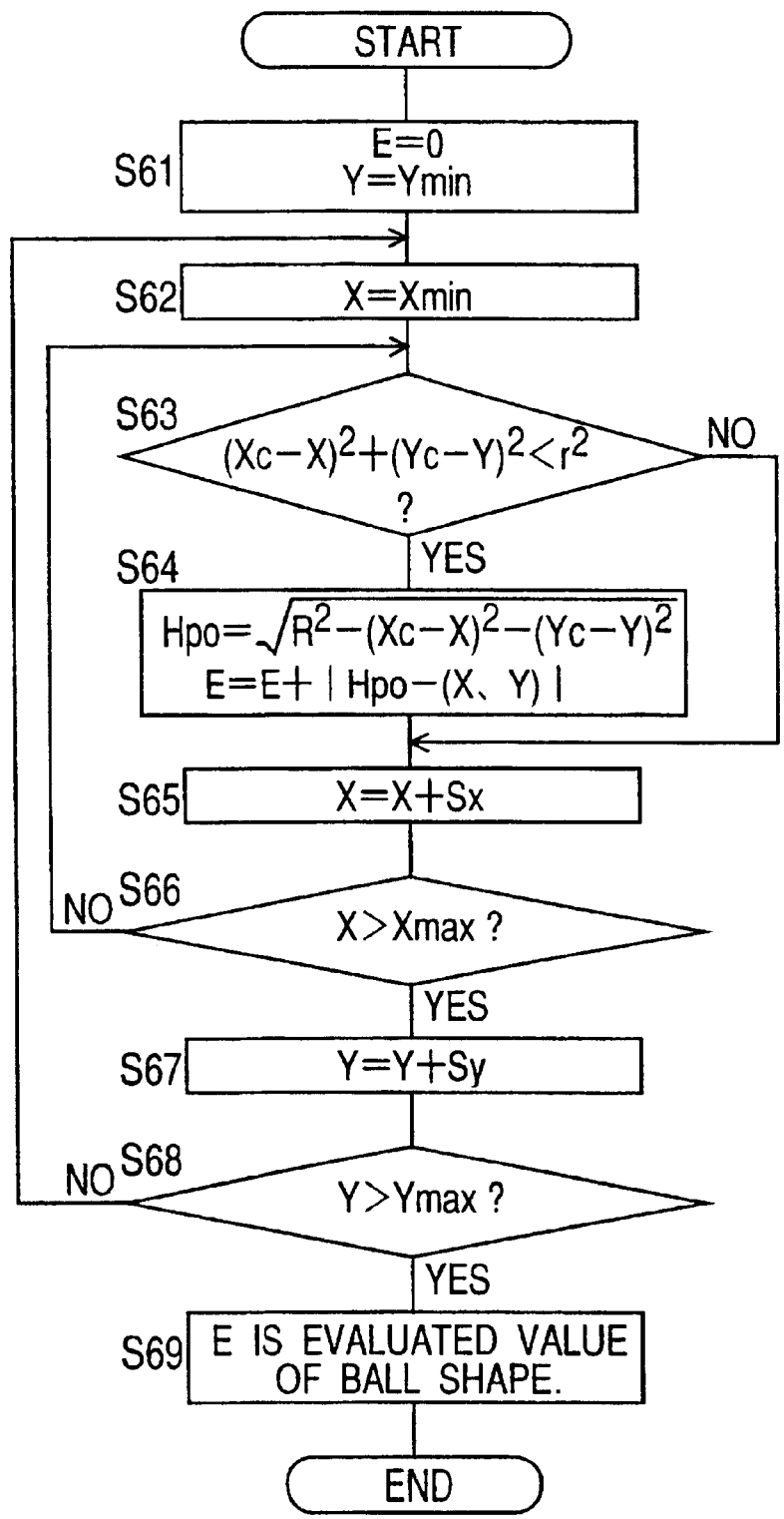
FIGS. 39A and 39B show a shape evaluating procedure of the hemispherical bump electrode of the electronic component, where
Figure 39B:
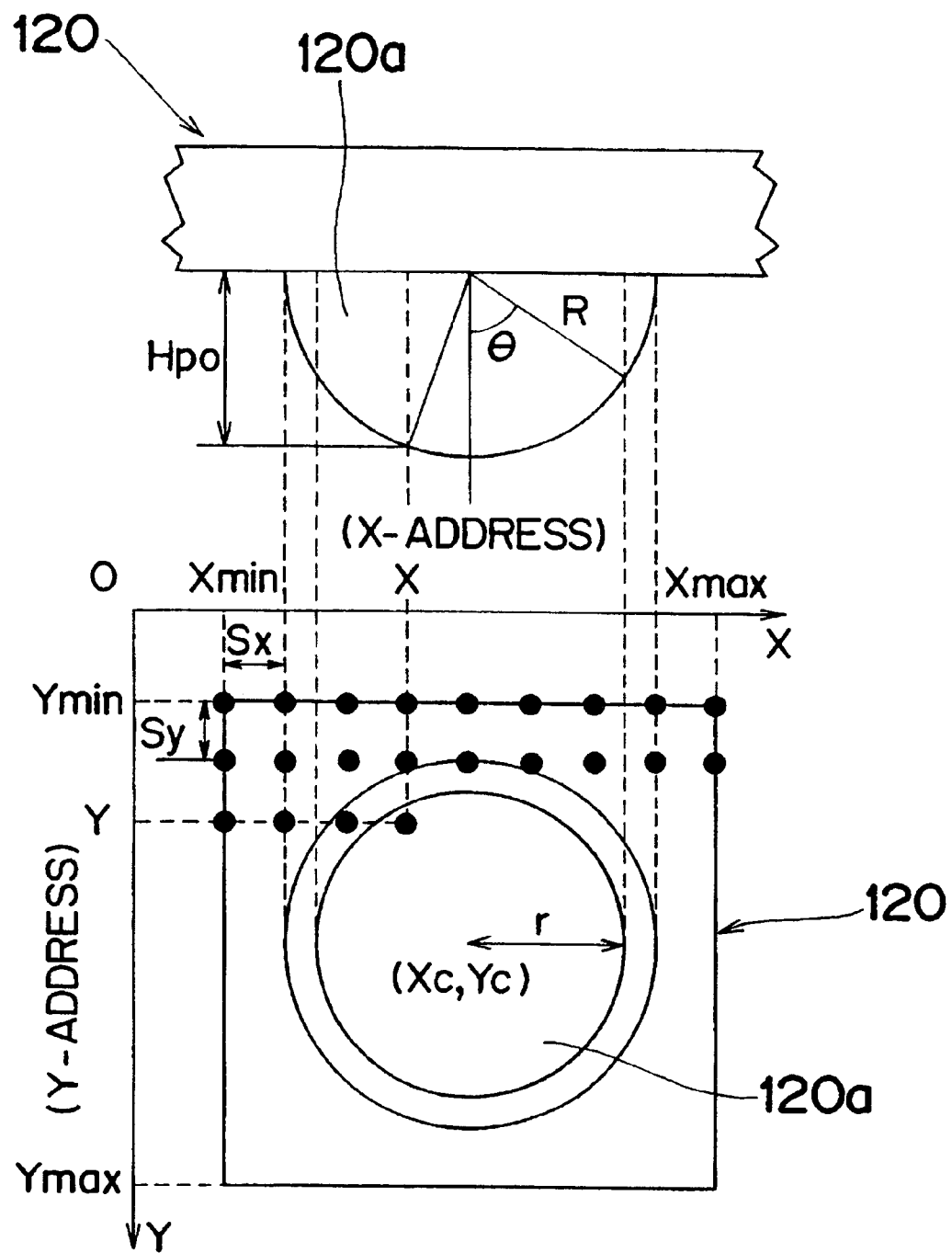

In FIGS. 39A and 39B, there are

E: shape evaluation value of hemispherical bump electrode 120a

R: radius of hemispherical bump electrode 120a

θ: critical angle at which laser beam reflected on hemispherical bump electrode 120a can be received by PSD, r: radius of circular region made when PSD light-receiving critical angle is projected on X-Y plane, Hpo: theoretical value of height at point (X, Y), H (X, Y): measured height data at point (X, Y), (X, Y): sampling point in small region, and (Xc, Yc): center coordinates of hemispherical bump electrode 120a obtained through processing of FIG. 36C.

The above Hpo is the theoretical value when the bump electrode 120a is assumed to be a hemisphere. The shape comes closer to the hemisphere as the difference between this theoretical value and the measured value approaches zero.

The procedure is comprised of steps (Steps S61 through S69) shown in FIG. 39A.

Step S61: Y-address is initialized to Ymin as shown in FIG. 39B, and there is set E=0.

Step S62: X-address is initialized to Xmin as shown in FIG. 39B.

Step S63: A decision is made on $(Xc-X)^2+(Yc-y)^2<r^2$. If this expression is satisfied, then the program flow proceeds to Step S64. If this expression is not satisfied, the sampling point (X, Y) is to be located outside the region of the bump electrode 120a. Therefore, the height data H (X, Y) at such a sampling point is ignored and omitted from the object of the shape evaluation, and the program flow proceeds to Step S65.

Step S64: The sampling point (X, Y) exists inside the region of the radius r about (Xc, Yc), and therefore, the height data H (X, Y) owned by this sampling point (X, Y) is highly accurate. The height theoretical value Hpo is obtained on the basis of the height data H (X, Y) as shown in Step S64, and the absolute value of the difference between Hpo and H (X, Y) is obtained. This value is added to E, thereby updating E.

Step S65: A predetermined increment Sx is added to the X-address, thereby updating the X-address. That is, the sampling point is shifted by one address Sx in the X-axis direction.

Step S66: The processes of Steps S63 through S65 will be repeated while increasing the increment Sx until the X-address exceeds the maximum value Xmax.

Step S67: If the X-address exceeds Xmax, then a predetermined increment Sy is added to the Y-address, thereby updating the Y-address. That is, the sampling point is shifted by one address Sy in the Y-axis direction.

Step S68: The processes of Steps S62 through S67 will be repeated while increasing the increment Sy until the Y-address exceeds the maximum value Ymax. If the Y-address exceeds Ymax, then the program flow proceeds to Step S69.

Step S69: The value E that is the sum of the absolute values of the differences between Hpo and H (X, Y) of all the sampling points becomes the evaluation value of the shape of the bump electrode 120a.

It is preferable to execute the volume detection and the shape evaluation of the bump electrodes 120a of the electronic component 120 in an interval from the sucking the electronic component 120 by the nozzle 7a (head section 7) from the component supply section 4 of the electronic component mounting apparatus to the mounting of the electronic component 120 on the printed board 9.

With this arrangement, the defect such as the dropout of the bump electrodes 120a of the electronic component 120 occurring when transporting the electronic component 120 in the interval from the electronic component manufacturing process to the electronic component assembling process can be found immediately before the mounting of the electronic component 120 on the printed board 9. Therefore, the defective component can be disposed of and only the normal electronic component 120 can be mounted on the printed board 9, so that the reliability of the electronic component assembly can be improved.

Furthermore, the height detection sensor 8 can capture the two-dimensional height image data of the object by moving the object (for example, electronic component) in the direction perpendicular to the scanning direction of the laser beam or moving the height detection sensor in the direction perpendicular to the scanning direction of the laser beam while linearly scanning the laser beam on a one-dimensional straight line by the polygon mirror 12. On the other words, the height image of the bottom portion of the electronic component having a plurality of bump electrodes in the bottom portion of the component can be captured as two-dimensional height image data by means of a height detection sensor while obtaining the height image data of the bump electrodes on surfaces parallel to a reference surface (for example, the bottom surface of the component) and imaginarily located in a direction perpendicular to the reference surface.

As described above, according to the present invention, the plurality of bump electrodes arranged on the bottom portion of the electronic component can be totally measured, and the volume and/or shape of each individual bump electrode can be correctly detected, so that the electronic component can be determined to be good or no good.

Immediately before the mounting of the electronic component on the printed board, the volume detection and/or shape recognition of the bump electrodes, that is, the connection portions can be achieved. With this arrangement, the defect such as the dropout of the bump electrodes of the electronic component occurring when transporting the electronic component from the electronic component manufacturing process to the electronic component assembling process can be found immediately before the mounting of the electronic component on the printed board. Therefore, the defective component can be disposed of and only the normal electronic component can be mounted on the printed board, so that the reliability of the electronic component assembly can be improved.

According to the component recognizing method of, the plurality of bump electrodes arranged on the bottom portion of the electronic component can be totally measured, and the volume of each individual bump electrode can be correctly detected, so that the amount of solder constituting the bump electrode can be quantitatively evaluated.

Then, by adopting the component inspecting method for determining the electronic component to be abnormal when the volume of any of its bump electrodes detected by the component recognizing method does not fall within the predetermined range of reference, the electronic component can be correctly determined to be good or no good.

Immediately before the mounting of the electronic component on the printed board, the volume detection of the bump electrode, that is, the connection portion can be achieved. With this arrangement, the defect such as the dropout of the bump electrodes of the electronic component occurring when transporting the electronic component in the interval from the electronic component manufacturing process to the electronic component assembling process can be found in the assembling process for mounting the electronic component on the printed board. Therefore, the defective component can be disposed of and only the normal electronic component can be mounted on the printed board, so that the reliability of the electronic component assembling can be improved.

According to the component recognizing method, the plurality of bump electrodes arranged on the bottom portion of the electronic component can be totally measured, and the shape of each individual bump electrode can be correctly detected, so that the shape of solder constituting the bump electrode can be quantitatively evaluated.

Then, by adopting the component inspecting method for determining the electronic component to be abnormal when the shape of any of its bump electrodes detected by the component recognizing method falls outside the predetermined range of reference, the electronic component can be correctly determined to be good or no good.

Immediately before the mounting of the electronic component on the printed board, the shape evaluation of the bump electrode, that is, the connection portion can be achieved. With this arrangement, the defect such as the dropout of the bump electrodes of the electronic component occurring when transporting the electronic component in the interval from the electronic component manufacturing process to the electronic component assembling process can be found in the assembling process for mounting the electronic component on the printed board. Therefore, the defective component can be disposed of and only the normal electronic component can be mounted on the printed board, so that the reliability of the electronic component assembling can be improved.

Each of the above-described embodiments can be combined with any one of the other embodiments in accordance with the purposes or uses.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component recognizing method for applying light to leads on a mounting surface of an electronic component and for detecting a position of the leads by a height detecting section comprising a 3D sensor on the basis of light reflected from the leads, said method comprising:

limiting a region to be measured by the height detecting section so that object light that is reflected from objects behind or near the leads is excluded from the region; and processing light reflected from the region thereby removing the object light.

2. The component recognizing method as claimed in claim 1, wherein said limiting a region comprises limiting a region to be measured by a 3D semiconductor position sensitive device of the 3D sensor.

3. The component recognizing method as claimed in claim 1, wherein said limiting a region comprises presetting the region, detecting height positions of leads about a height measurement reference plane within the region and detecting the leads only within the region.

4. The component recognizing method as claimed in claim 1, wherein said limiting a region comprises:

presetting the region;

detecting height positions of leads about a height measurement reference plane within the region as a height translation table;

invalidating height data of leads located outside the region according to the height translation table; and detecting heights of leads located within the region based on height data from the height translation table.

5. The component recognizing method as claimed in claim 1, further comprising:

determining a processing area according to a size of the electronic component based on an image of the electronic component detected only within a height measurement region;

detecting an approximate center and inclination of the electronic component by sampling inside a window of the determined processing area in the image of the electronic component to obtain an approximate position of the electronic component;

detecting positions of leads in the image of the electronic component based on the size of the electronic component and the approximate position of the electronic component; and detecting a correct position of the electronic component in the image of the electronic component from the positions of the leads.

6. The component recognizing method as claimed in claim 1, further comprising mounting the electronic component onto a board based on position information of the leads.

7. The component recognizing method as claimed in claim 6, wherein said mounting comprises:

holding the electronic component with a component holding member of a head section;

deciding whether adjustment of the region is required, and subsequently adjusting the region when an adjustment of the region is required;

adjusting a height of the component holding member based on the region;

capturing height data of the component;

detecting a position of the electronic component via the height detecting section; and mounting the electronic component at a position of the board via the component holding member by driving the head section based on the position of the leads.

8. The component recognizing method as claimed in claim 1, wherein detecting a position comprises independently and selectively detecting a two-dimensional position via a luminance image capturing means or detecting a three-dimensional position via a height image capturing means, wherein said detecting a two-dimensional position comprises obtaining luminance image data of a surface of the electronic component via the luminance image capturing means, and wherein said detecting a three-dimensional position comprises obtaining height image data of a surface of the electronic component, wherein a height image of a bottom portion of the electronic component having a plurality of bump electrodes is captured as two-dimensional height image data via the height detection section, wherein individual bump electrodes are extracted from the height image data, and wherein volumes or shapes of the extracted individual bump electrodes are detected.

9. The component recognizing method as claimed in claim 1, wherein said processing comprises processing with software.

10. A component recognizing apparatus for recognizing leads on a mounting surface of an electronic component, said apparatus comprising:

an illumination unit operable to apply light to the leads;

a height detecting section operable to detect positions of the leads on the basis of light that is applied from said illumination unit and reflected from the leads, said height detecting section comprising a 3D sensor;

a noise removing section operable to limit a region to be measured by said height detection section so that light reflected from objects behind or near the leads is excluded from the region; and a processing section operable to process light reflected from the region.

11. The component recognizing apparatus as claimed in claim 10, wherein the 3D sensor comprises a semiconductor position sensitive device.

12. The component recognizing apparatus as claimed in claim 10, wherein said noise removing section is operable to preset the region to detect height positions of leads about a height measurement reference plane within the region and to detect leads only within the region.

13. The component recognizing apparatus as claimed in claim 10, wherein said noise removing section is operable to preset the region, to detect height positions of leads about a height measurement reference plane within the region as a height translation table, to invalidate height data of leads located outside the region according to the height translation table, and to detect heights of leads located within the region based on height data from the height translation table.

14. The component recognizing apparatus as claimed in claim 10, further comprising:
   a processing area determining section operable to determine a processing area according to a size of the electronic component based on an image of the electronic component detected only within the region;
   an approximate center and inclination detector operable to detect an approximate center and inclination of the electronic component by sampling inside a window of the determined processing area in the image of the electronic component to obtain an approximate position of the electronic component;
   a lead position detector operable to detect positions of leads in the image of the electronic component based on the size of the electronic component and the approximate position of the electronic component; and
   a lead center and inclination detector operable to detect a correct position of the electronic component in the image of the electronic component from the positions of the leads.

15. The component recognizing apparatus as claimed in claim 10, further comprising a system operable to mount the electronic component to a board based on position information of the leads.

16. The component recognizing apparatus as claimed in claim 15, wherein said mounting system comprises:
   a head section comprising a holding member operable to hold the electronic component;
   a control section operable to drive said head section to mount the electronic component at a position of the board based on the height position information recognized by the height detecting section.

17. The component recognizing apparatus as claimed in claim 10, wherein said processing section comprises a software processing section.

18. An electronic component position detection method comprising:
   capturing luminance image data of a surface of an electronic component;
   capturing height image data, via a 3D sensor, of the surface of the electronic component; and
   processing the luminance image data to detect a two-dimensional position of the electronic component or processing the height image data to detect a three-dimensional position of the electronic component.

19. The electronic component position detection method as claimed in claim 18, wherein said capturing luminance image data and said capturing height image data are independently and selectively performed based on a shape of the electronic component.

20. The electronic component position detection method as claimed in claim 18, wherein said capturing luminance image data and said capturing height image data are independently and selectively performed based on a type of inspection to be performed on the electronic component.

21. The electronic component position detection method as claimed in claim 18, wherein the luminance image data and the height image data are processed via a single image processing means by setting a height coordinate system of the height image data so that a direction from the electronic component to the 3D sensor is positive.

22. The electronic component position detection method as claimed in claim 18, wherein the electronic component comprises a body and a plurality of leads projecting from sides of the body, and
   wherein tips of the leads are to be mounted on a board.

23. The electronic component position detection method as claimed in claim 18, wherein when said processing comprises processing the luminance image data, said processing comprises processing the luminance image data with software, and
   wherein when said processing comprises processing the height image data, said processing comprises processing the height image data with software.

24. A component mounting method for transporting an electronic component from a component supply section to a board and mounting the electronic component onto the board, said method comprising:
   capturing luminance image data of a surface of an electronic component;
   capturing height image data, via a 3D sensor, of the surface of the electronic component;
   selecting one of the luminance image data or the height image data;
   processing the luminance image data to detect a two-dimensional position of the electronic component when the luminance image data is selected or processing the height image data to detect a three-dimensional position of the electronic component when the height image data is selected;
   transporting the electronic component from the component supply section to the board; and
   mounting the electronic component onto the board based on the processed image data.

25. The component mounting method as claimed in claim 24, wherein said selecting is based on a shape of the electronic component.

26. The component mounting method as claimed in claim 24, said selecting is based on a type of inspection to be performed on the electronic component.

27. The component mounting method as claimed in claim 24, wherein said processing comprises processing with software.

28. A component recognizing method comprising;
   capturing, as two-dimensional height image data via a height detection sensor comprising a 3D sensor, a height image of a bottom portion of an electronic component having a plurality of hemispherical bump electrodes disposed thereon;
   obtaining and processing height image data of the bump electrodes relative to a reference surface and located in a direction perpendicular to the reference surface, thereby extracting individual bump electrodes from the height image data; and
   detecting a volume of an extracted individual bump electrode by summing height image data of an extracted individual bump electrode.

29. The component recognizing method as claimed in claim 28, wherein said detecting a volume is executed within an interval from when the electronic component is sucked from a component supply section by a nozzle of an electronic component mounting apparatus to when the electronic component is mounted onto a board.

30. The component recognizing method as claimed in claim 28, wherein said capturing comprises moving the electronic component in a direction perpendicular to a scanning direction of a laser beam or moving the height detection sensor in the direction perpendicular to the scanning direction of the laser beam while linearly scanning the laser beam on a straight line.

31. The component recognizing method as claimed in claim 30, further comprising determining that the electronic component is abnormal when the volume of an extracted individual bump electrode is not within a predetermined range.

32. The component recognizing method as claimed in claim 31, further comprising mounting the electronic component onto aboard when the electronic component is not determined to be abnormal.

33. The component recognizing method as claimed in claim 31, wherein said processing comprises processing with software.

34. A component recognizing method comprising:

capturing, as two-dimensional height image data via a height detection sensor comprising a 3D sensor, a height image of a bottom portion of an electronic component having a plurality of hemispherical bump electrodes disposed thereon;

obtaining and processing height image data of the bump electrodes relative to a reference surface and located in a direction perpendicular to the reference surface, thereby extracting individual bump electrodes from the height image data; and detecting a shape of an extracted individual bump electrode by extracting outer shape data from the height image data of the extracted individual bump electrode.

35. The component recognizing method as claimed in claim 34, wherein said detecting a shape is executed within an interval from when the electronic component is sucked from a component supply section by a nozzle of an electronic component mounting apparatus to when the electronic component is mounted onto a board.

36. The component recognizing method as claimed in claim 34, wherein said capturing comprises moving the electronic component in a direction perpendicular to a scanning direction of a laser beam or moving the height detection sensor in the direction perpendicular to the scanning direction of the laser beam while linearly scanning the laser beam on a straight line.

37. The component recognizing method as claimed in claim 34, further comprising determining that the electronic component is abnormal when the shape of an extracted individual bump electrode is not within a predetermined range.

38. The component recognizing method as claimed in claim 37, further comprising mounting the electronic component onto a board when the electronic component is not determined to be abnormal.

39. The component recognizing method as claimed in claim 37, wherein said processing comprises processing with software.

* * * * *